(12) United States Patent
Nagahara et al.

(10) Patent No.: US 6,919,668 B2
(45) Date of Patent: Jul. 19, 2005

(54) COMPOSITE PIEZOELECTRIC ELEMENT

(75) Inventors: Hidetomo Nagahara, Kyoto (JP); Seigo Shiraishi, Neyagawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 34 days.

(21) Appl. No.: 10/314,037

(22) Filed: Dec. 6, 2002

(65) Prior Publication Data

US 2003/0127949 A1 Jul. 10, 2003

(30) Foreign Application Priority Data

| Dec. 6, 2001 | (JP) | ......................................... 2001-372963 |
| Dec. 17, 2001 | (JP) | ......................................... 2001-383564 |

(51) Int. Cl.[7] .............................................. H01L 41/08
(52) U.S. Cl. ........................................ 310/358; 310/337
(58) Field of Search ............................. 310/357–359, 310/337, 334, 335, 369

(56) References Cited

U.S. PATENT DOCUMENTS

| 4,572,981 | A | * | 2/1986 | Zola .......................... 310/357 |
| 4,613,784 | A | * | 9/1986 | Haun et al. .................. 310/358 |
| 4,728,845 | A | * | 3/1988 | Haun et al. .................. 310/358 |
| 5,065,068 | A | * | 11/1991 | Oakley ........................ 310/357 |
| 5,142,187 | A | * | 8/1992 | Saito et al. .................. 310/358 |
| 5,477,098 | A | | 12/1995 | Eguchi et al. |
| 5,625,149 | A | * | 4/1997 | Gururaja et al. ............... 73/632 |
| 5,717,274 | A | | 2/1998 | Eguchi et al. |
| 5,844,349 | A | * | 12/1998 | Oakley et al. ............... 310/358 |
| 6,441,538 | B1 | * | 8/2002 | Spigelmyer .................. 310/334 |
| 6,467,140 | B2 | * | 10/2002 | Gururaja ..................... 29/25.35 |
| 6,634,071 | B2 | * | 10/2003 | Benjamin .................... 29/25.35 |

FOREIGN PATENT DOCUMENTS

| JP | 58-021883 | 2/1983 |
| JP | 60-085699 | 5/1985 |
| JP | 63-059200 | 3/1988 |
| JP | 02-051289 | 2/1990 |
| JP | 05-347797 | 12/1993 |
| JP | 08-088896 | 4/1996 |
| JP | 08-088897 | 4/1996 |
| JP | 08-088898 | 4/1996 |
| JP | 08-256398 | 10/1996 |
| JP | 08-265098 | 10/1996 |
| JP | 10-056690 | 2/1998 |
| JP | 10-285695 | 10/1998 |
| JP | 2000-028595 | 1/2000 |
| JP | 2000-324599 | 11/2000 |
| JP | 2001-025094 | 1/2001 |

OTHER PUBLICATIONS

Hirata, et al., "Piezocomposite of Fine PZT Rods Realized with Synchrotron Radiation Lithography," IEEE Ultrasonics Symposium, pp. 877–881 (1997).

Wang, et al., "Novel Processing of High Aspect Ratio 1–3 Structures of High Density PZT," IEEE, pp. 223–228 (1998).

* cited by examiner

Primary Examiner—Mark Budd
(74) Attorney, Agent, or Firm—Akin Gump Strauss Hauer & Feld, LLP

(57) ABSTRACT

A composite piezoelectric element has a layered configuration of a plurality of unit composite sheets. Each of the unit composite sheets includes a resin layer and a plurality of columnar piezoelectric elements arranged on the resin layer.

22 Claims, 41 Drawing Sheets

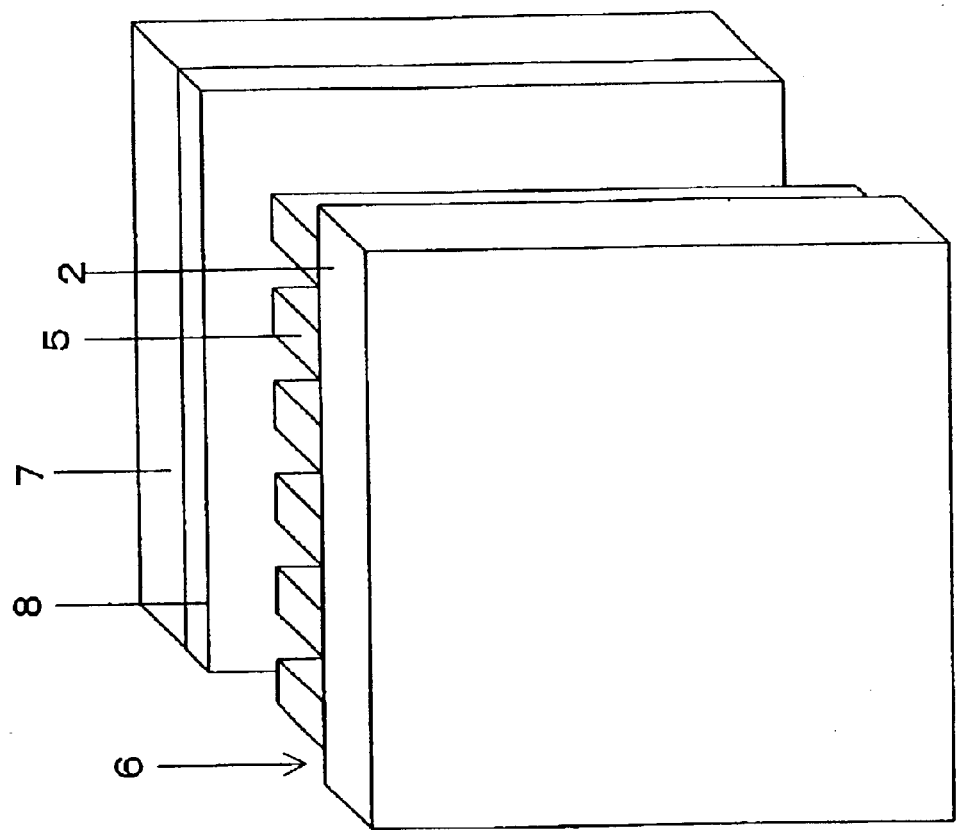
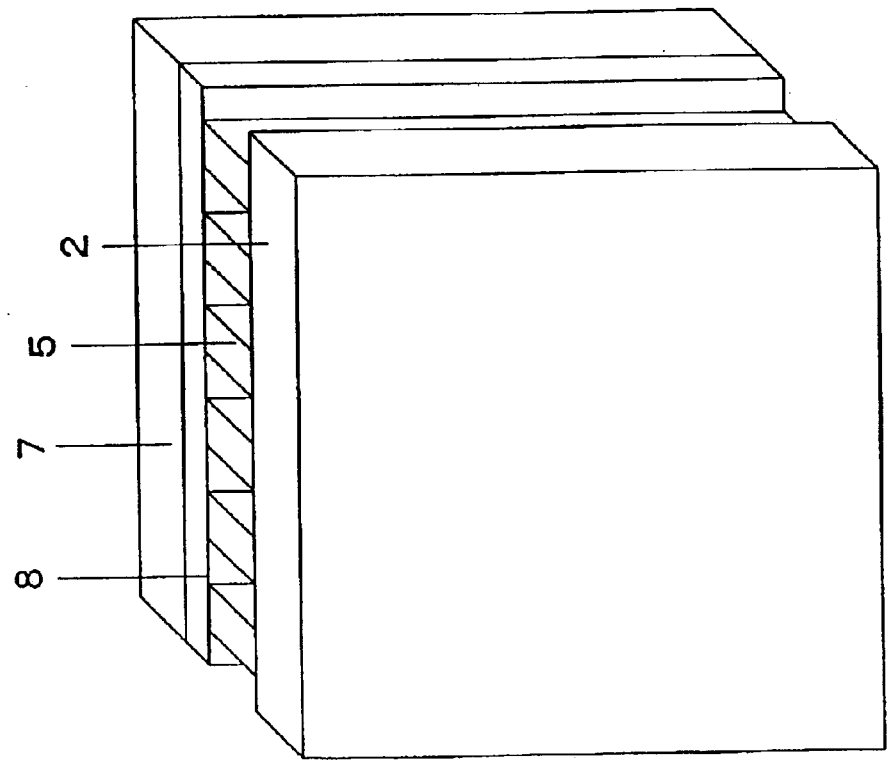
FIG.10B
FIG.10A

FIG.33
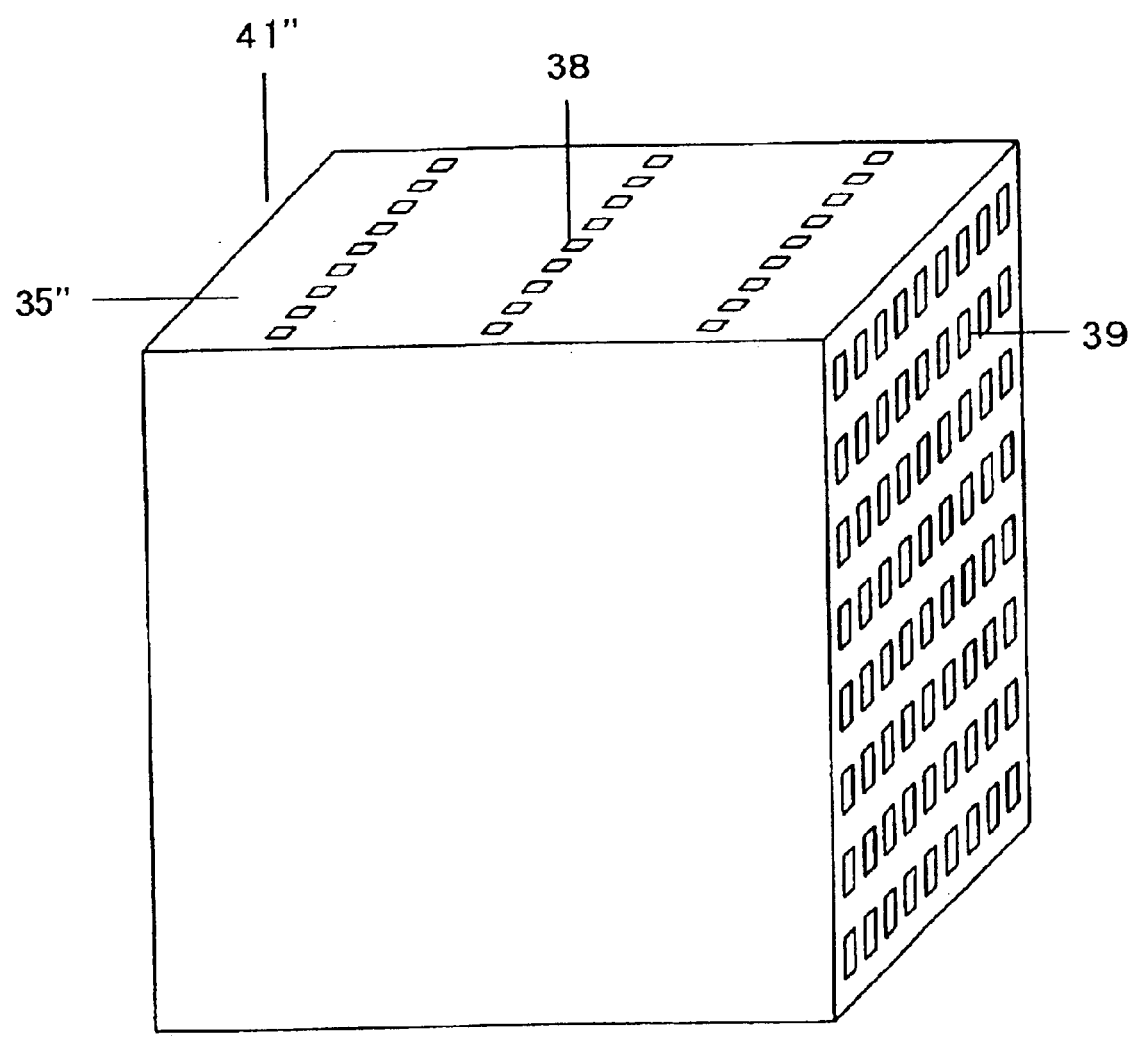
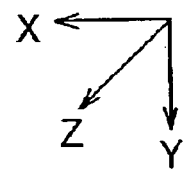

COMPOSITE PIEZOELECTRIC ELEMENT

BACKGROUND OF THE INVENTION

The present invention relates to a composite piezoelectric element used for an ultrasonic probe and the like, and a method of fabricating the composite piezoelectric element, and to an ultrasonic probe and an ultrasonic examination device employing the composite piezoelectric element.

A composite piezoelectric element is a piezoelectric material in which a piezoelectric element and a resin are compositely combined in various configurations. Such a composite piezoelectric element can widen a frequency band of oscillation. For this reason, it is studied that the piezoelectric element is utilized for an ultrasonic probe used in an ultrasonic diagnostic apparatus for medical purpose and the like. A composite piezoelectric element called as 1-3 type has a configuration in which a number of columnar piezoelectric elements are regularly or irregularly arranged, and gap portions between respective two of them are filled with a resin. It is pointed out that such a composite piezoelectric element of 1-3 type is suitable for sensitization and widening of band.

An ultrasonic probe used for diagnosing the interior of human body from the outside mainly uses an ultrasonic frequency band of about 3 to 10 MHz. In fabricating such a composite piezoelectric element of 1-3 type which transmits and receives ultrasonic waves in such a band, it is considered that the most excellent performances are attained when a ratio (L/S) is designed to be 5 or more, in the case where a length of a columnar piezoelectric element is L and a size of a section perpendicular to a longitudinal direction of the columnar piezoelectric element is S. Accordingly, when the composite piezoelectric element of 1-3 type is applied to the ultrasonic probe having a frequency band of about 3 to 10 MHz, it is necessary to form a configuration in which a number of columnar piezoelectric elements having a length L of about 160 to 500 $\mu$m and a section size S of about 30 to 100 $\mu$m or less are arranged.

In this specification, the ratio (L/S) is referred to as "an aspect ratio of a columnar piezoelectric element". When the section of the columnar piezoelectric element is a circle, the size S is a diameter of the circle. When the section of the columnar piezoelectric element is a rectangle, the size S is a length of the longer side. In the case where the section of the columnar piezoelectric element is a trapezoid, a length of the lower side is referred to as the size S.

The availability of the composite piezoelectric element is known for a long time. However, there are not so many examples which are commercially available up to the present time. The main reasons are as follows: (1) the required configuration of a columnar piezoelectric element is extremely fine, so that it is difficult to fabricate a composite piezoelectric element, and (2) even though the fabrication is possible, a high fabrication cost is required.

In recent years, in order to diagnose the possibility of narrowing of blood vessel from the interior of the blood vessel, an ultrasonic diagnostic probe of a high frequency (15 to 20 MHz) with which observation in detail of a wall of blood vessel can be performed is required. When a composite piezoelectric element which can oscillate in such a frequency band is to be fabricated, it is necessary to form a configuration in which a number of columnar piezoelectric elements each having a length L of about 80 to 100 $\mu$m, a section size S of about 16 to 20 $\mu$m or less, and an aspect ratio of 5 or more are arranged. However, it is seriously difficult to fabricate a composite piezoelectric element having such a configuration by a conventional fabrication method.

Hereinafter, a conventional fabrication method of a composite piezoelectric element of 1-3 type will be described.

Japanese Patent Publication No.1789409 and Japanese Patent Publication No.1590342 disclose a method of manufacturing a composite piezoelectric element of 1-3 type. According to the method, after cutting grooves are formed longitudinally and latitudinally by machining a block-like piezoelectric element, the cutting grooves are filled with an organic high polymer such as an epoxy resin and then the organic high polymer is hardened, thereby forming the composite piezoelectric element. This method is referred to as "dice and fill". The cutting grooves are formed by mechanical working such as dicing.

Japanese Patent Publication No.5-33836 discloses a fabricating method utilizing laser cutting instead of the dicing performed in the dice and fill method. In this method, after grooves are formed in piezoelectric ceramic with laser light, the grooves are filled with a resin and then the resin is hardened.

Both of the above-identified prior arts can be applied to the fabrication of a composite piezoelectric element used for an ultrasonic probe up to about 10 MHz, but can hardly be applied to the fabrication of a composite piezoelectric element used in a high frequency band equal to or higher than 10 MHz. Even in the case where the prior arts are applied to the ultrasonic probe up to about 10 MHz, the fabrication is extremely difficult, or even though the fabrication is possible, the fabrication cost is disadvantageously high.

Other fabrication methods of a composite piezoelectric element include a method disclosed in "IEEE 1997 ULTRASONIC SYMPOSIUM, pp. 877–881, 1997" (hereinafter referred to as a prior-art document 1), and a method disclosed in "IEEE 1998 Microelectro Mechanics Systems Workshop, pp. 223–228, 1998" (hereinafter referred to as a prior-art document 2).

The fabrication method of the prior-art document 1 is as follows:

First, a resin mold having holes with high aspect ratio is formed by deep lithography using X rays. The holes are filled with ceramic slurry. Thereafter, the resin is removed by etching or the like, and then the ceramic is sintered. In this way, it is possible to produce a configuration in which a number of fine columnar piezoelectric elements with high aspect ratio are arranged. When gaps of the columnar piezoelectric elements in this configuration are filled with an organic high polymer, a composite piezoelectric element of 1-3 type can be produced.

The fabrication method of the prior-art document 2 is as follows.

Holes with high aspect ratio is formed in a silicon substrate by deep etching. The holes are filled with ceramic slurry. Thereafter, the ceramic is sintered while the holes in the silicon substrate are filled with the ceramic. After the sintering, the silicon substrate is removed by etching or the like. Thus, a configuration in which a number of fine columnar piezoelectric elements of high aspect ratio are arranged. Thereafter, gaps between the respective columnar piezoelectric elements are filled with an organic high polymer, thereby producing a composite piezoelectric element of 1-3 type.

The above-identified prior-art documents describe that it is possible to form a composite piezoelectric element having a section size equal to or smaller than 20 μm. However, both of the production methods include complicated processes, and the burning of mold requires a complicated process and a long time. In addition, a production apparatus to be utilized is expensive. As a result, the increase in production cost is a serious problem.

Moreover, lead zirconate titanate-based piezoelectric ceramics (PZT) with high piezoelectric performances is generally used as a piezoelectric element of a composite piezoelectric element. However, since the PZT is a ceramic including lead of low volatilizing temperature, the composition control is difficult, and it is difficult to perform the sintering so as to exhibit sufficient piezoelectric characteristics.

SUMMARY OF THE INVENTION

The present invention provides a composite piezoelectric element having a plurality of fine columnar piezoelectric elements having high aspect ratio without degrading the performances in an inexpensive manner.

The composite piezoelectric element of the present invention is a composite piezoelectric element having a layered configuration of a plurality of unit composite sheets each including a rein layer and a plurality of columnar piezoelectric elements arranged on the resin layer.

In a preferred embodiment, the plurality of unit composite sheets are layered so that longitudinal directions of respective columnar piezoelectric elements substantially align.

In a preferred embodiment, the composite piezoelectric element further includes at least one internal conductive element extending across the plurality of columnar piezoelectric element in a direction intersecting the longitudinal direction of the plurality of columnar piezoelectric elements.

In a preferred embodiment, the internal conductive element is exposed on at least one end face of the composite piezoelectric element.

In a preferred embodiment, the internal conductive element extends along columns of the columnar piezoelectric elements.

In a preferred embodiment, a plurality of internal conductive elements are provided, and each of the plurality of internal conductive elements is disposed in corresponding one column of the columnar piezoelectric elements.

In a preferred embodiment, a plurality of the plural internal conductive elements are disposed in corresponding one column of the columnar piezoelectric element.

In a preferred embodiment, a size of a section perpendicular to a longitudinal direction of the columnar piezoelectric elements is 20 μm or less.

In a preferred embodiment, a ratio L/S is 5 or more, where a length of the columnar piezoelectric elements is L, and an average size of a section perpendicular to the longitudinal direction of the columnar piezoelectric elements is S.

In a preferred embodiment, another resin layer is inserted between respective two of the layered unit composite sheets.

In a preferred embodiment, a gap exists between adjacent ones of the columnar piezoelectric elements in each unit composite sheet.

In a preferred embodiment, a resin exists between adjacent ones of the columnar piezoelectric elements in each unit composite sheet.

In a preferred embodiment, the plurality of columnar piezoelectric elements are two-dimensionally arranged along a plane perpendicular to a longitudinal direction of the columnar piezoelectric elements.

In a preferred embodiment, the plurality of columnar piezoelectric elements are arranged in rows and columns along the plane perpendicular to the longitudinal direction of the columnar piezoelectric elements, and columns of the columnar piezoelectric elements are separated from columns of adjacent ones of the columnar piezoelectric elements by a resin layer.

The unit composite sheet of the present invention is a unit composite sheet including a resin layer and a plurality of columnar piezoelectric elements arranged on the resin layer.

The layered structure of composite sheets of the present invention is a layered structure of composite sheets in which a plurality of unit composite sheets each including a resin layer and a plurality of columnar piezoelectric elements arranged on the resin layer are layered, and the columnar piezoelectric elements are sandwiched by the resin layers, thereby fixing the dispositional relationship.

The composite piezoelectric element of the present invention is a composite piezoelectric element fabricated by cutting the layered structure of composite sheets across the longitudinal direction of the columnar piezoelectric elements.

In a preferred embodiment, the columnar piezoelectric elements are surrounded by a resin.

In a preferred embodiment, the resin is part of the resin layer of the unit composite sheet which flows and hardens.

In a preferred embodiment, the resin is obtained by impregnating a liquid resin around the columnar piezoelectric elements and by hardening the resin.

The ultrasonic probe of the present invention is an ultrasonic probe including the above-mentioned composite piezoelectric element.

The ultrasonic examination apparatus of the present invention is an ultrasonic examination apparatus provided with the above-mentioned ultrasonic probe.

The method of producing a unit composite sheet of the present invention is a method including the steps of: (a) providing a composite plate in which a resin layer is formed on one surface of a plate-like piezoelectric element, and (b) forming a plurality of columnar piezoelectric elements from the plate-like piezoelectric element by forming a plurality of grooves in the plate-like piezoelectric element of the composite plate without completely dividing the resin layer.

The method of producing a unit composite sheet of the present invention is a method including the steps of: (a) temporarily fixing a plate-like piezoelectric element on a substrate by means of an adhesive sheet; (b) forming a plurality of columnar piezoelectric elements from the plate-like piezoelectric element by forming a plurality of grooves in the plate-like piezoelectric element; and (c) transferring the plurality of columnar piezoelectric elements temporarily fixed on the substrate onto a resin layer.

In a preferred embodiment, the method includes the step of reducing a thickness of the plate-like piezoelectric element over an entire face of the plate-like piezoelectric element.

In a preferred embodiment, the step of reducing the thickness of the plate-like piezoelectric element includes sand blasting for a surface of the plate-like piezoelectric element.

In a preferred embodiment, in the step (b), the plurality of grooves formed in the plate-like piezoelectric element are formed by sand blasting.

In a preferred embodiment, on at least one face of the resin layer, an internal conductive element is formed, the internal conductive element crossing the columnar piezoelectric elements in a final configuration.

In a preferred embodiment, the plate-like piezoelectric element is a sintered piezoelectric ceramics.

The method of producing a unit composite sheet of the present invention is a method including the steps of: (a) providing, on a resin layer, a composite plate in which a plurality of piezoelectric elements extending in one direction and a plurality of conductive elements are alternately disposed; and (b) forming, on the resin layer, a plurality of columnar piezoelectric elements and a plurality of internal conductive elements extending across the plurality of columnar piezoelectric elements by forming a plurality of grooves extending in a direction intersecting a longitudinal direction of the piezoelectric element in the piezoelectric element of the composite plate.

The method of producing a unit composite sheet of the present invention is a method including the steps of: (a) temporarily fixing a composite plate in which a plurality of piezoelectric elements extending in one direction and a plurality of conductive elements are alternately disposed on a substrate by an adhesive sheet; (b) forming a plurality of columnar piezoelectric elements and a plurality of internal conductive elements extending across the plurality of columnar piezoelectric elements in a direction intersecting a longitudinal direction of the plurality of columnar piezoelectric elements by removing part of the plate-like piezoelectric element; and (c) transferring the plurality of columnar piezoelectric elements and the plurality of internal conductive elements temporarily fixed on the substrate onto a resin layer.

In a preferred embodiment, the composite plate is formed by cutting a layered structure in which a plurality of piezoelectric elements and a plurality of conductive elements are alternately layered, in parallel to a layered direction.

In a preferred embodiment, in the composite plate, a plurality of grooves are formed in the plate-like piezoelectric element, and the plurality of grooves are filled with a conductive material.

The method of fabricating a composite piezoelectric element of the present invention is a method including the steps of: (a) providing a plurality of unit composite sheets each including a resin layer and a plurality of columnar piezoelectric elements arranged on the resin layer; (b) layering the plurality of unit composite sheets; and (c) integrating the layered unit composite sheets.

In a preferred embodiment, the resin layer is formed by application of liquid resin.

In a preferred embodiment, the resin layer is a tack resin sheet.

In a preferred embodiment, the method further includes the step of cutting the integrated unit composite sheets in a direction across the columnar piezoelectric elements.

The composite piezoelectric element of the present invention is a composite piezoelectric element including a plurality of columnar piezoelectric elements and a dielectric portion between the plurality of columnar piezoelectric elements, wherein a shape of a section perpendicular to a longitudinal direction of the columnar piezoelectric element is asymmetric for a rotation of 180 degrees with respect to a center axis of the columnar piezoelectric element.

In a preferred embodiment, the section perpendicular to the columnar piezoelectric element is a trapezoid.

The composite piezoelectric element of the present invention is a composite piezoelectric element including a plurality of columnar piezoelectric elements and a dielectric portion positioned between the plurality of columnar piezoelectric elements, wherein at least part of a side face of the columnar piezoelectric element is a unprocessed surface.

BRIEF DESCRIPTION OF THE DRAWINGS

The foregoing summary as well as the following detailed description of the preferred embodiments of the invention, will be better understood when read in conjunction with the appended drawings. For the purpose of illustrating the invention, there is shown in the drawings an embodiment which is presently preferred. It should be understood, however, that the invention is not limited to the precise arrangements and instrumentalities shown.

FIGS. 10A and 10B are perspective views illustrating an exemplary process of transferring the columnar piezoelectric elements onto a resin layer.

FIG. 33 is a perspective view showing a composite piezoelectric element of Embodiment 14.

DETAILED DESCRIPTION OF THE INVENTION

Hereinafter, preferred embodiments of the composite piezoelectric element according to the present invention will be described with reference to the accompanying drawings.

(Embodiment 1)

With reference to FIGS. 1 to 6, a fabrication method of this embodiment will be described.

Figure 1:
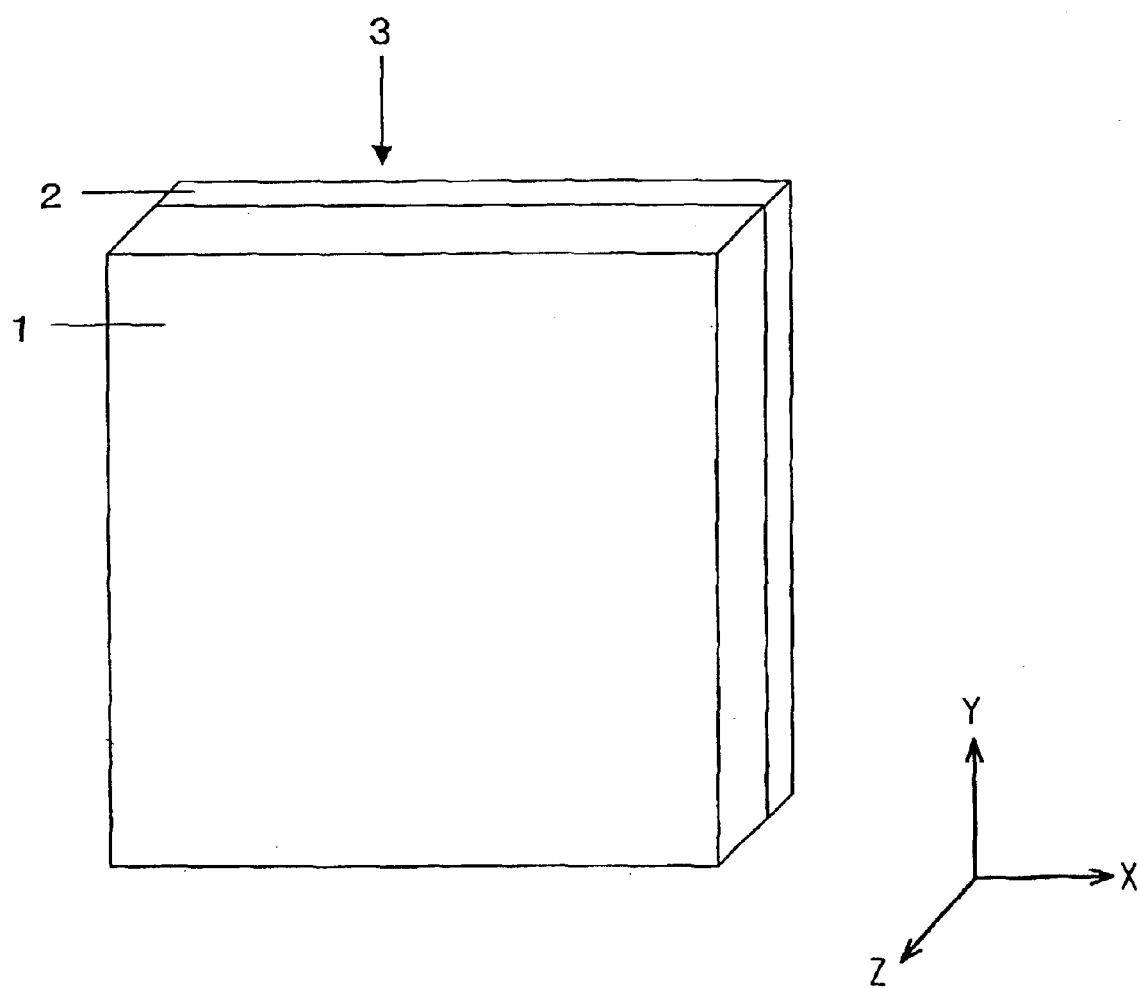
FIG. 1 is a perspective view illustrating an exemplary process of forming a composite plate.

First, as shown in FIG. 1, a resin layer 2 is stuck onto one surface of a plate-like piezoelectric element 1, so as to form a composite plate 3. As a material of the plate-like piezoelectric element 1, lead zirconate titanate-based (PZT) ceramic can be suitably used, for example. The plate-like PZT ceramic can be easily and inexpensively prepared by sintering a low-price ceramic green sheet (thickness: about 0.07 mm). The ceramic green sheet is a sheet which is not yet sintered and is composed of a ceramic powder and a resin. The ceramic green sheet is prepared by a method such as doctor blading, and suitably used for forming a piezoelectric element of a thin-film or layered configuration (such as a laminate substrate). The plate-like piezoelectric element 1 can be prepared by cutting a block-like ceramic. However, the method requires high-cost processes such as a cutting and lapping process. On the contrary, a method for preparing the plate-like piezoelectric element from the ceramic green sheet does not require the processes of cutting, lapping, and the like, so that the method is advantageous in view of reducing the cost.

In the case where the plate-like piezoelectric element 1 is prepared by sintering the ceramic green sheet, in view of reducing the equipment cost, a number of ceramic green sheets are generally stacked and simultaneously sintered. In this case, so as not to join the stacked upper and lower ceramic green sheets together, the stacking is performed in such a manner that a powder called as a peeling powder such as MgO is sprinkled between respective ceramic green sheets. Each of the plate-like piezoelectric element after the sintering is cleaned for removing the peeling powder. When the size of the plate-like piezoelectric element 1 is about 30 mm square, it is necessary to ensure sufficient strength by setting the thickness to be about 50 $\mu$m or more, so as to facilitate the handling thereof. In the case of a thin plate-like piezoelectric element having the thickness less than about 50 $\mu$m, the handling is difficult, so that fracture or chip often occurs during the handling. As a result, the production yield is reduced and the cost is disadvantageously increased.

The sizes of the plate-like piezoelectric element 1 used in this embodiment are 30 mm in X direction, 30 mm in Y direction, and 0.05 mm (=50 $\mu$m) in Z-direction. The resin layer (thickness: 0.025 mm) 2 has the same size in plane as that of the plate-like piezoelectric element 1. For example, the resin layer 2 is composed of an epoxy-based tack resin sheet. The fabrication of the composite element 3 can be performed as follows. Specifically, an epoxy-based tack resin with a peeling film attached on one face is stacked on the plate-like piezoelectric element 1, and then they are layered 120 times by means of a piston-like jig. Thereafter, a pressure is applied to the layered structure of the plate-like piezoelectric element 1 and the resin layer 2, while the layered structure is still in the jig. Concretely, for example, in an atmosphere of 120° C. and 0.1 Torr or less, the pressurizing may be performed for 5 minutes while a pressure of about 1 MPa is applied. Thereafter, the atmosphere is returned to be atmospheric and the pressure is released. Then, they are held at 150° C. for one hour. After the resin layer 2 is hardened in this way, the layered structure is taken out of the jig. By peeling the peeling film, 120 composite elements 3 can be obtained.

The plate-like piezoelectric element 1 is preferably formed from a material with high piezoelectric property. Although the PZT ceramic is used in this embodiment, the material for the plate-like piezoelectric element 1 is not limited to this. For example, as a material for the plate-like piezoelectric element 1, a ceramic such as lead titanate or barium titanate, or single crystal such as quartz, lithium niobate, or PZT single crystal may be used.

Although the method of sticking the epoxy-based tack resin sheet is adopted as the forming method of the resin layer 2, it is sufficient to adopt a method which can form a resin layer with a uniform thickness on one surface of the plate-like piezoelectric element 1. An arbitrary method for forming the resin layer 2 such as spin coating, screen printing, or the like may be used.

Next, with reference to FIGS. 2A to 2C, a method for fabricating a plurality of columnar piezoelectric elements from the plate-like piezoelectric element 1 will be described. First, as shown in FIG. 2A, a working mask 4 is formed on an exposed surface of the plate-like piezoelectric element 1 which constitutes the composite element 3. The working mask 4 used in this embodiment has a stripe pattern. A width of each stripe portion is 0.050 mm (=50 $\mu$m). The patterning of the stripe pattern is performed so that the interval is also 0.050 mm. The width of each stripe portion defines a width of a columnar piezoelectric element to be formed. It is unnecessary that the interval of the stripe portions of the working mask 4 coincides with the width of the stripe portion.

The working mask 4 is formed by, after a photo-sensitive resin sheet is stuck to the plate-like piezoelectric element 1, exposing and developing the resin sheet by using a photo mask. In the photo mask, a light blocking pattern for defining the above-mentioned stripe pattern is formed, and the development and exposure can be performed by known photolithographic techniques. By changing the pattern of the photo mask, the shape and the size of the pattern of the working mask 4 can be arbitrarily set.

Next, sand blasting is performed for the face of the composite element 3 on which the working mask 4 is formed. The sand blasting is a working process in which fine particles (particles of alumina or diamond) are injected together with compressed air, so that an object to be worked is broken by means of impact.

By the sand blasting, a soft material such as a resin is not broken, but a hard material such as ceramic can be selectively broken by brittle fracture. Accordingly, by performing the sand blasting with the working mask 4 of resin, only a region of the surface of the plate-like piezoelectric element 1 which is not covered with the stripe portion of the working mask 4 can be selectively chipped, so as to form a cutting groove in the region. As the sand blasting progresses, the cutting groove formed in the exposed surface of the plate-like piezoelectric element 1 becomes deeper. Eventually, the cutting groove reaches the resin layer 2 disposed on the back side of the plate-like piezoelectric element 1. However, the resin layer 2 is not broken by the sand blasting similarly to the working mask 4, so that when the cutting groove formed in the plate-like piezoelectric element 1 reaches the resin layer 2, the resin layer 2 is hardly worked. In this way, as shown in FIG. 2B, a plurality of columnar piezoelectric elements 5 can be formed from the plate-like piezoelectric element 1. In FIG. 2B, for simplicity, only six columnar piezoelectric elements 5 are shown. Actually, 300 columnar piezoelectric elements 5 are simultaneously formed.

According to the above-mentioned sand blasting, a wide face of the plate-like piezoelectric element 1 can be collectively processed at high speed with high precision. However, the sand blasting is not suitable in the case where a ratio of a depth to a width of an opening portion of the working mask 4 (aspect ratio) is high. However, in this embodiment, a depth direction of the cutting groove formed by the sand blasting is not parallel to but perpendicular to a longitudinal direction of the columnar piezoelectric element 5 to be formed. Accordingly, when a depth of the cutting groove formed by the working is D, and a width of the cutting groove is W, the ratio D/W in this embodiment is about 1. The ratio D/W defines the aspect ratio of the cutting groove. Depending on the material of the piezoelectric element, it is preferred that the ratio D/W is set in the range of about 1 to 2. In addition, when fine working is especially required, the ratio D/W is desired to be 1 or less.

In this embodiment, as described above, since the working of the piezoelectric element is performed in a direction perpendicular to the longitudinal direction (Y direction) of the columnar piezoelectric element 5, even if the "aspect ratio of the columnar piezoelectric element" exceeds 5, the aspect ratio of the cutting groove can be reduced. Accordingly, it is possible to easily form a columnar piezoelectric element having an aspect ratio which cannot be realized in the prior art.

Figure 2C:
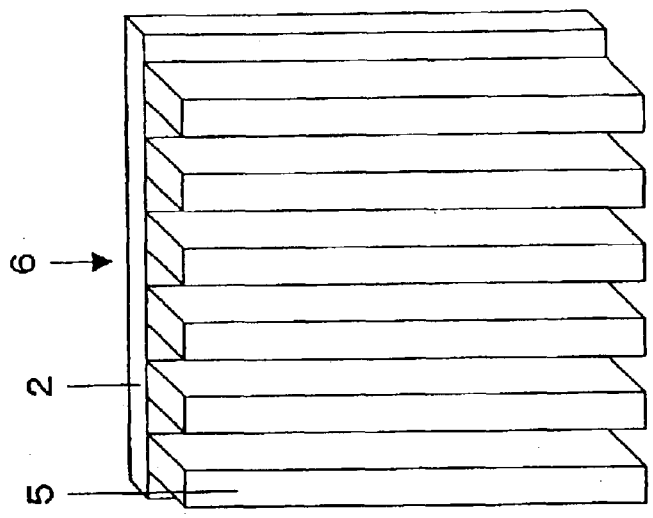
FIGS. 2A, 2B, and 2C are perspective views illustrating an exemplary process of working a plate-like piezoelectric element in the composite plate into columnar piezoelectric elements.
Figure 2B:
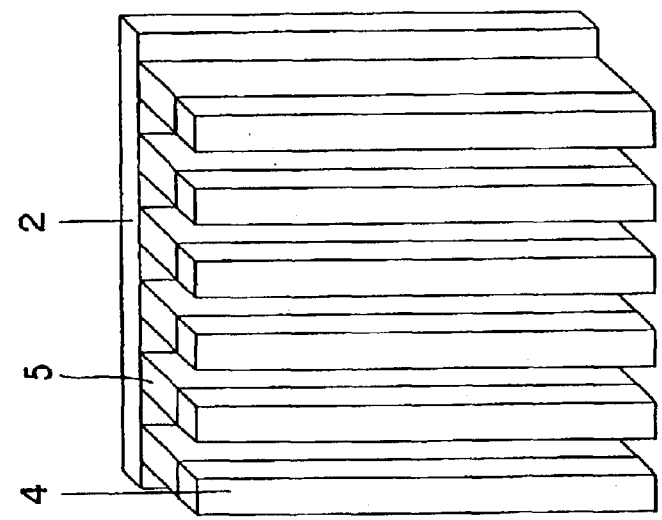
Figure 2A:
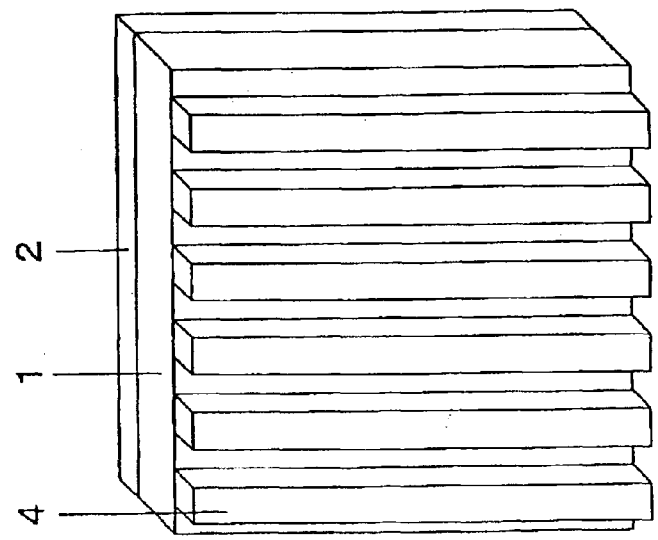

After the columnar piezoelectric element 5 shown in FIG. 2B is formed, as shown in FIG. 2C, the working mask 4 is peeled. In this way, a unit composite sheet 6 having a configuration in which a number of columnar piezoelectric elements 5 are held by the resin layer 2 can be fabricated.

Figure 3:
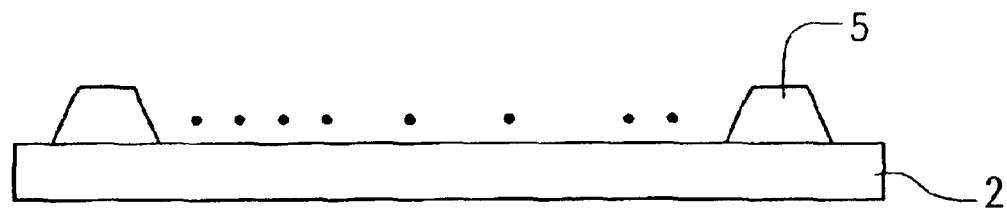
FIG. 3 is a sectional view perpendicular to a longitudinal direction of the columnar piezoelectric elements.

Each of the columnar piezoelectric elements 5 has the sizes of 30 mm in Y direction, about 40 to 50 $\mu$m in X direction, and 50 $\mu$m in Z direction. A section perpendicular to the longitudinal direction of the columnar piezoelectric element 5 is shown in FIG. 3. As is seen from FIG. 3, the section of the columnar piezoelectric element obtained in this embodiment is substantially a trapezoid. A width in the upper face of the columnar piezoelectric element 5 is about 40 to 45 $\mu$m and a width in the lower face thereof is about 55 to 60 $\mu$m. The reason why a taper is formed in the side face is that a side edge is generated by the sand blasting. Since the upper face of the columnar piezoelectric element 5 is covered with the working mask 4, the upper face is not subjected to the sand blasting. Since the plate-like piezoelectric element 1 in this embodiment is fabricated by sintering, the surface there of is a unprocessed surface. The upper face and the lower face of the columnar piezoelectric element 5 which are not subjected to the sand blasting are also the unprocessed surfaces after the working. The side face of the columnar piezoelectric element 5 is worked, so that the side face is not the unprocessed surface.

Figure 4:
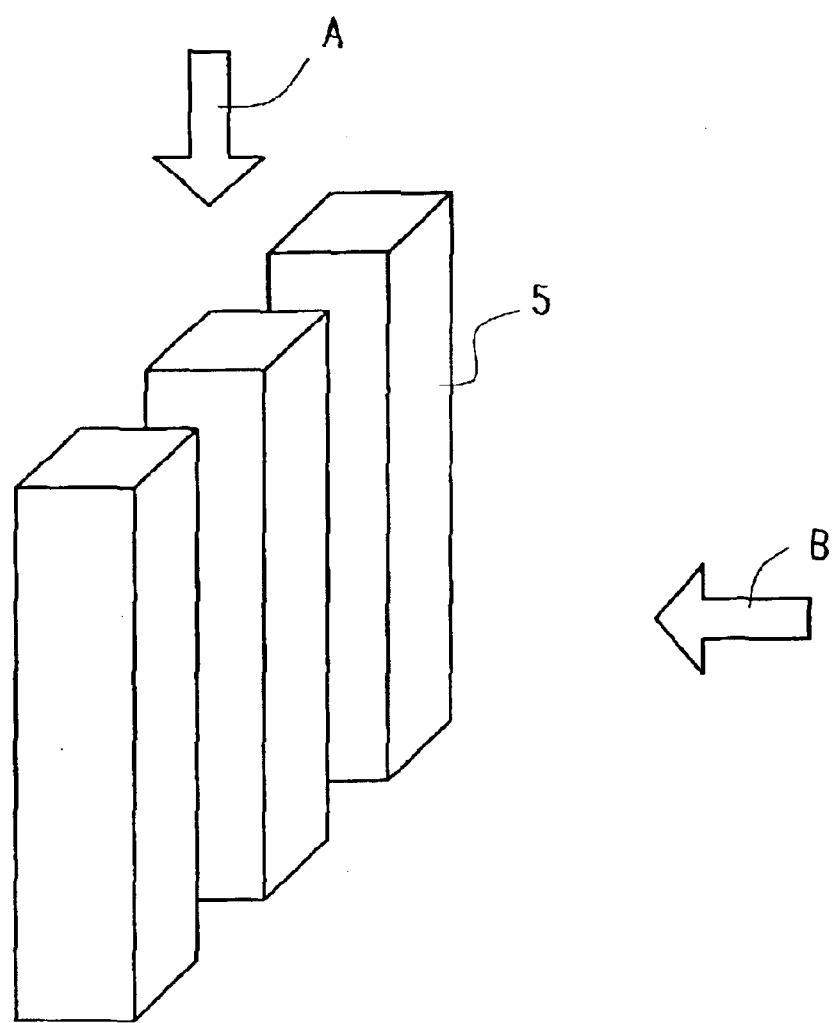
FIG. 4 is a perspective view showing a working direction for obtaining the columnar piezoelectric elements.

As described above, it is difficult to form a deep hole by the sand blasting. For this reason, as shown in FIG. 4, if the columnar piezoelectric element 5 is formed by working the piezoelectric element in a direction indicated by an arrow A, it is extremely difficult to form a columnar piezoelectric element having an aspect ratio of 5 or more. However, according to the fabrication method of this embodiment, the piezoelectric element is worked in a direction indicated by an arrow B in FIG. 4, the working depth is shallow, and full advantages of the sand blasting such as the high-speed property and the collective workability can be taken.

If the cutting method can work the plate-like piezoelectric element 1 into columnar shape, the method is not limited to the sand blasting. Other cutting methods such as dicing, ultrasonic machining, laser processing, or etching may be arbitrarily employed.

Next, 120 unit composite sheets each of which is prepared by the above-described method are prepared, and a process of lamination and integration is performed. A large area of the composite sheets can be simultaneously processed by the sand blasting, so that a time required for cutting the 120 sheets of the composite plates 3 having the above-mentioned sizes is 2 hours or less which is very short. Therefore, it is possible to shorten the production time of the unit composite sheets and to reduce the cost.

Figure 5:
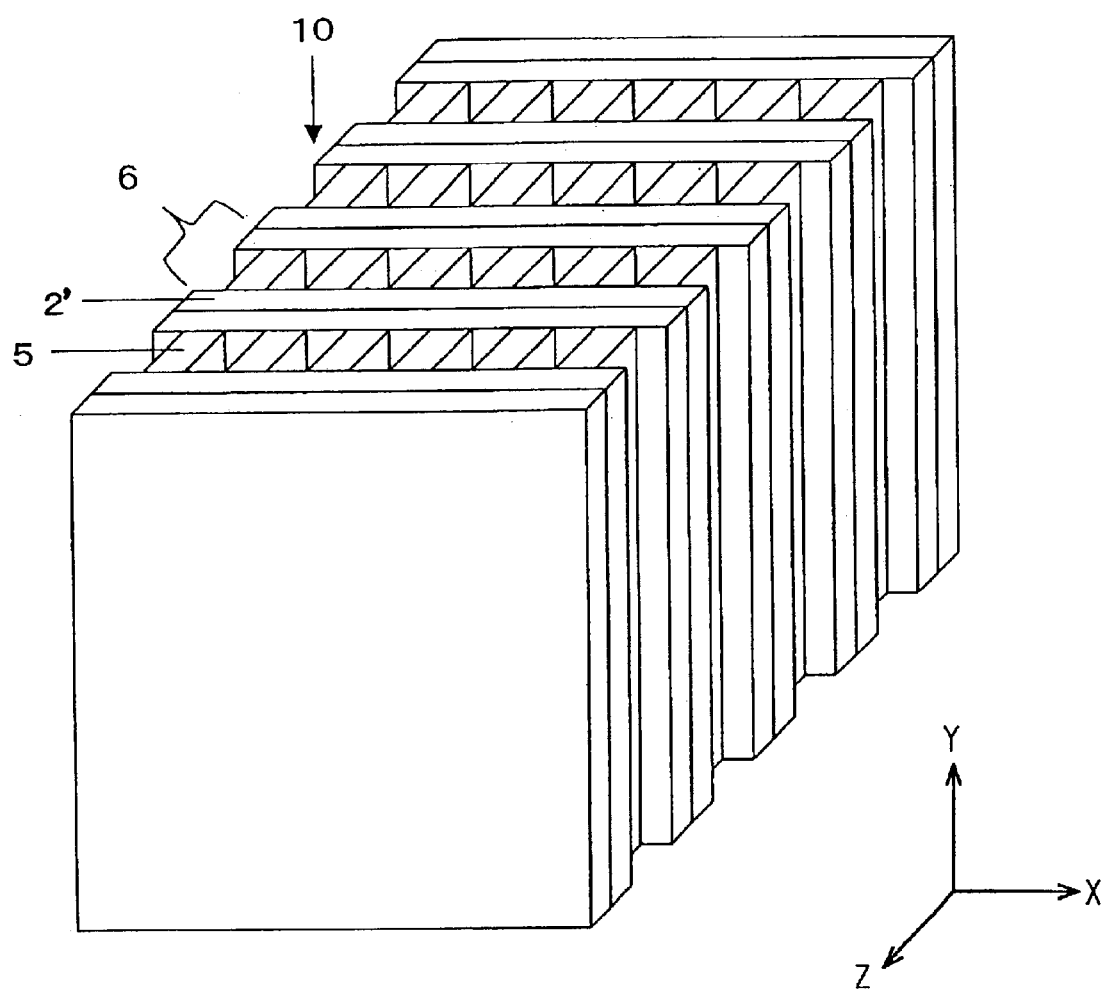
FIG. 5 is a perspective view illustrating an exemplary process of forming a composite piezoelectric element.

Next, as shown in FIG. 5, the unit composite sheets 6 are layered with another resin layer 2' which is different from the resin layer 2 constituting the unit composite sheet interposed therebetween. In FIG. 5, for simplicity, four unit composite sheets 6 are shown. In actuality, 120 unit composite sheets 6 are layered. In layering, the unit composite sheets 6 are disposed in such a manner that the columnar piezoelectric elements 5 in each layer are substantially parallel to each other. In the uppermost portion, two epoxy-based tack resin sheets each having sizes of 30 mm in X direction, 30 mm in Y direction, and 0.025 mm in Z direction are disposed. In FIG. 5, positions of the columnar piezoelectric elements 5 disposed in each of adjacent two unit composite sheets are mutually matched and aligned. However, in actuality, the positions of the columnar piezoelectric elements 5 may be shifted for every unit composite sheet.

The thus-layered structure is left for 10 minutes while applying a pressure of about 0.1 MPa at 120° C. and 0.1 Torr or less. Thereafter, the pressure is returned to be atmospheric, and the layered structure is heated for 1 hour at 180° C. without applying a pressure. As a result, the resin layers 2 and 2' are hardened, and the layered structure is integrated, thereby obtaining a composite piezoelectric element 10 as the composite sheet layered structure. The obtained composite piezoelectric element 10 has a rectangular parallelepiped shape having sizes of 30 mm in X direction, 30 mm in Y direction, and 12 mm in Z direction. In one composite piezoelectric element 10, 36,000 (=300× 120) columnar piezoelectric elements 5 are held substantially in parallel by means of the resin.

Figure 6:
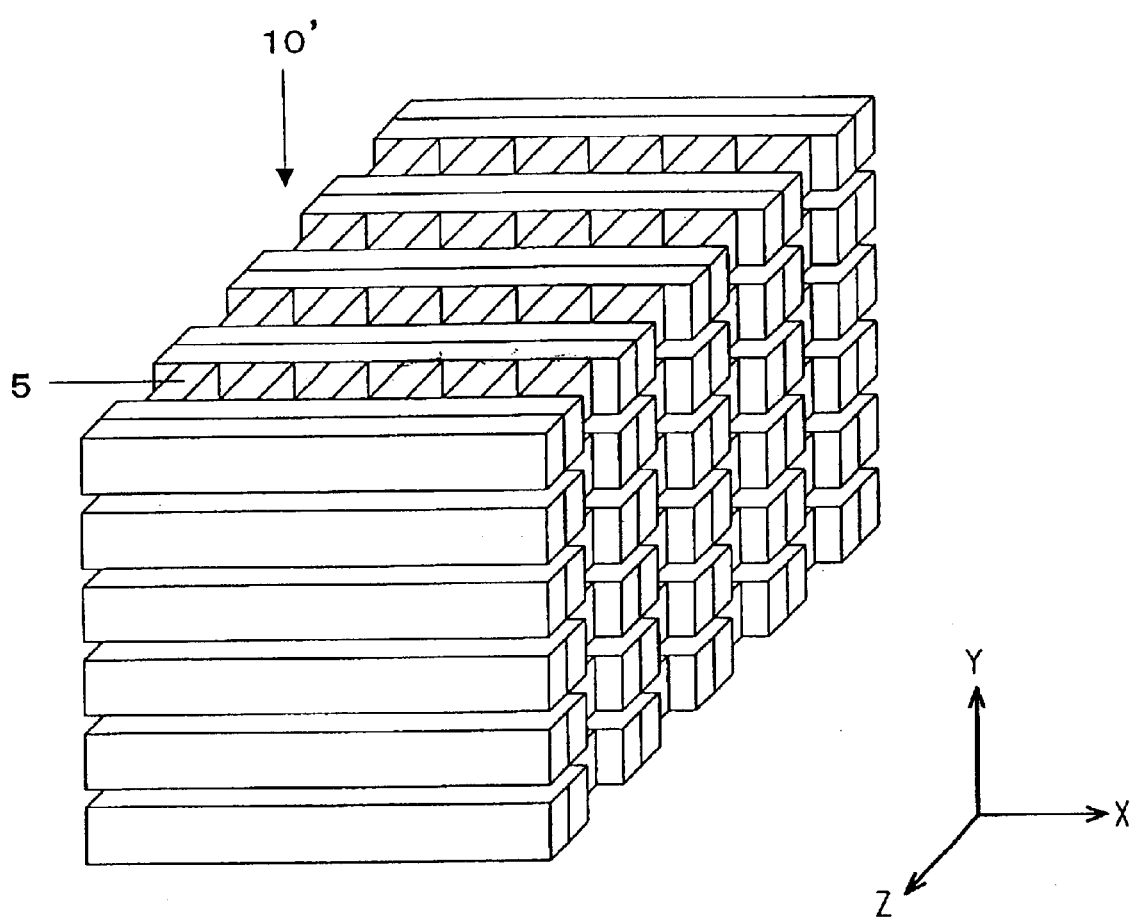
FIG. 6 is a perspective view illustrating an exemplary process of cutting the composite piezoelectric element.

Next, as shown in FIG. 6, the composite piezoelectric element 10 is cut along a plane perpendicular to the longitudinal direction (Y direction) of the columnar piezoelectric elements 5 (a plane parallel to the X-Z plane) and separated into a plurality of composite piezoelectric elements 10'. When the cutting pitch is 0.3 mm, and the cutting margin is 0.1 mm, 100 composite piezoelectric elements 10' having the sizes of 30 mm in X direction, 0.20 mm in Y direction, and 12 mm in Z direction can be obtained from one composite piezoelectric element 10. The size in Z direction of the composite piezoelectric element 10' after the cutting can be adjusted by changing the cutting pitch. In the case where the composite piezoelectric element of this embodiment is applied to a probe for an ultrasonic diagnostic apparatus for diagnosing the interior of human body from the outside, it is preferred that the size in Z direction of the composite piezoelectric element 10' after the cutting be set in the range of 0.2 to 2 mm.

Next, after gold electrodes are formed on upper and lower faces of each of the composite piezoelectric elements 10' by sputtering, a polarization process is performed at 180° C. and 400 V, so as to obtain a composite piezoelectric element exhibiting piezoelectric characteristics.

According to the fabrication method of this embodiment, direct handling is not performed with respect to the respective columnar piezoelectric elements 5, and it is unnecessary to arrange a number of columnar piezoelectric elements 5 on a substrate one by one. In addition, according to the fabrication method, it is possible to inexpensively fabricate a composite piezoelectric element in a short time with good yield without using expensive equipment as compared with the prior-art fabrication method.

Both of the upper and lower faces of the thus-fabricated composite piezoelectric element are unprocessed surfaces, as described above, because a piezoelectric ceramic prepared by sintering a thin green sheet is used. In addition, part of the unprocessed surface is covered with a resin, and is not subjected to the working, so that the part of the unprocessed surface exists in the final composite piezoelectric element. The unprocessed surface of the piezoelectric element is dense as compared with the worked surface, and the property resistant to environments of the unprocessed surface is high. Thus, as compared with the case where the whole of the circumference is subjected to the sand blasting, preferred characteristics can be exhibited.

The composite piezoelectric element of this embodiment has a multi-layer configuration arranged along a thickness direction (Z direction) of the unit composite sheets. In other words, among a plurality of columnar piezoelectric elements arranged in two-dimension along X-Z plane, respective columns arranged in X direction are mutually separated by the resin layer. Since the composite piezoelectric element of this embodiment has such a layered configuration, an effect that the interference in lateral direction can be reduced is attained.

(Embodiment 2)

Hereinafter, a second embodiment of the composite piezoelectric element according to the present invention will be described.

The composite piezoelectric element according to this embodiment is a composite piezoelectric element suitable for a high-frequency ultrasonic piezoelectric transducer. The second embodiment is different from the first embodiment in that a process of making the plate-like piezoelectric element 1 of the composite plate 3 thinner is additionally performed. The other production processes are the same as those in the first embodiment.

Figure 7A:
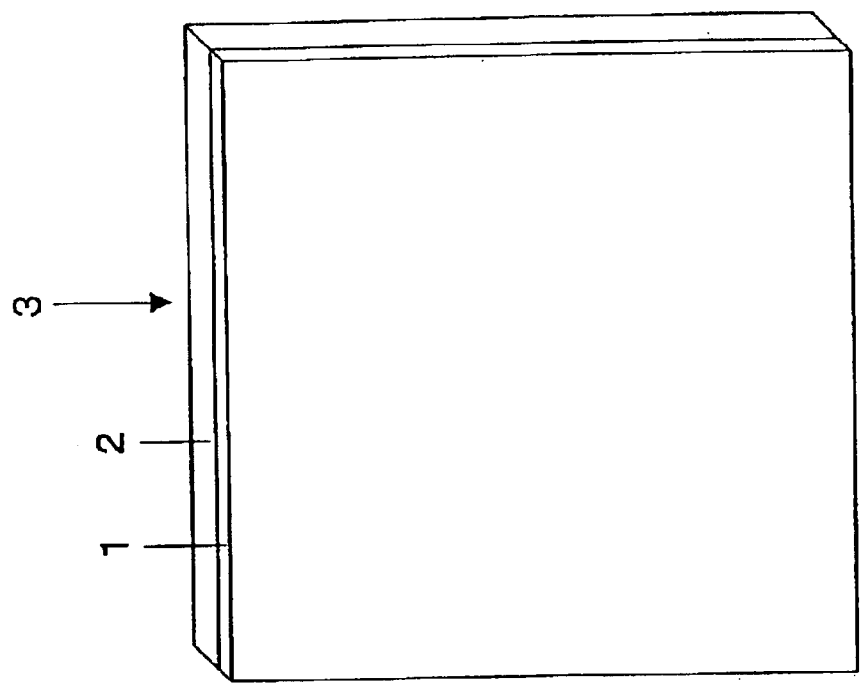
FIGS. 7A and 7B are perspective views illustrating an exemplary process of reducing a thickness of a plate-like piezoelectric element of the composite plate.
Figure 7B:
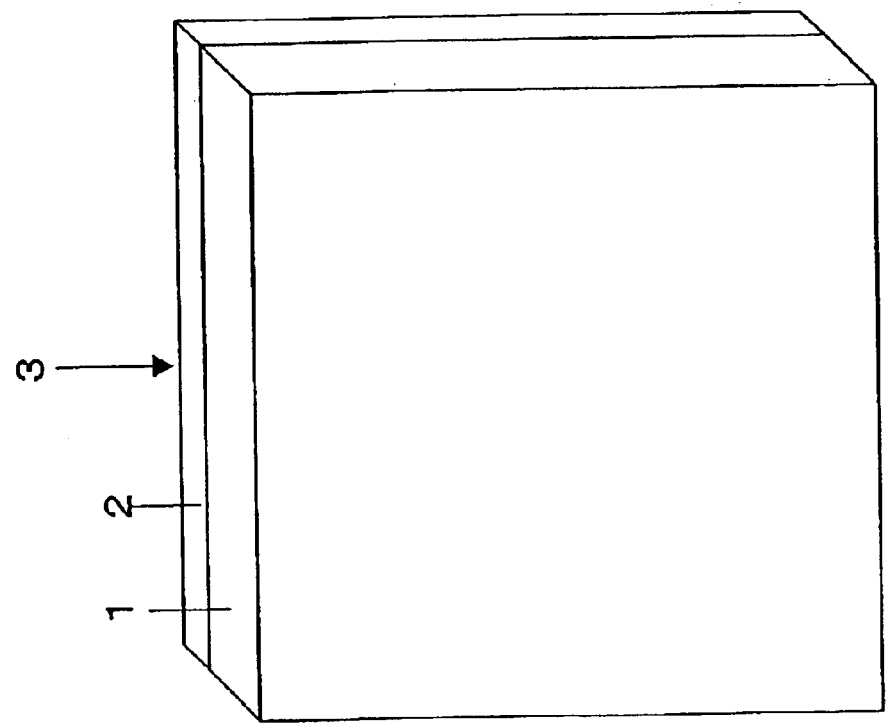

First, a composite plate 3 shown in FIG. 7A is prepared by the above-mentioned method. Next, a process for reducing a thickness (a size in Z direction) of a plate-like piezoelectric element 1 of the composite plate 3 is performed, so as to form a thin composite plate 3 shown in FIG. 7B. In this embodiment, the thickness of the plate-like piezoelectric element 1 is reduced from 0.050 mm to 0.020 mm (=20 μm).

Thereafter, by using a working mask similar to the working mask 4 shown in FIG. 2A, a number of columnar piezoelectric elements are formed from the plate-like piezoelectric element 1. At this time, a width of a stripe portion of the working mask used in this embodiment is set to be 0.020 mm (=20 μm). Mask materials and exposing devices are improved, so that a working mask having a fine pattern of about 0.020 mm can be formed with high accuracy at the present time. As described above, the width of the stripe portion of the mask defines the width of the columnar piezoelectric element, so that a section of the columnar piezoelectric element is smaller as compared with the composite piezoelectric element in the first embodiment. However, in this embodiment, since the plate-like piezoelectric element 1 which is to be subjected to sand blasting is made thin, it is possible to form a columnar piezoelectric element having a reduced width with high accuracy while the aspect ratio of the cutting groove is maintained to be small. Processes after the process of forming the working mask are the same as those in the first embodiment.

The thus-prepared unit composite sheets are layered and integrated by the above-described method, and then cutting, electrode formation, and polarization processes are performed, thereby obtaining 150 composite piezoelectric elements each having sizes of 30 mm in X direction, 30 mm in Y direction, and 0.100 mm in Z direction.

As described above, since the thickness of the plate-like piezoelectric element 1 stuck to the resin layer 2 is reduced in this embodiment, a low-price PZT ceramic is used as the plate-like piezoelectric element 1, and a composite piezoelectric element in which a number of columnar piezoelectric elements each having a section size S of about 0.020 mm are arranged is produced. When a length (a size in Y direction) of the columnar piezoelectric element in the final composite piezoelectric element is "L", an aspect ratio L/S of the columnar piezoelectric element is 5 or more, so that a configuration suitable for transmitting and receiving high-frequency ultrasonic waves.

According to this embodiment, it is possible to produce a composite piezoelectric element suitable for high frequency in a short time at low cost without using expensive equipment.

(Embodiment 3)

Hereinafter, a third embodiment of the composite piezoelectric element according to the present invention will be described.

Figure 8:
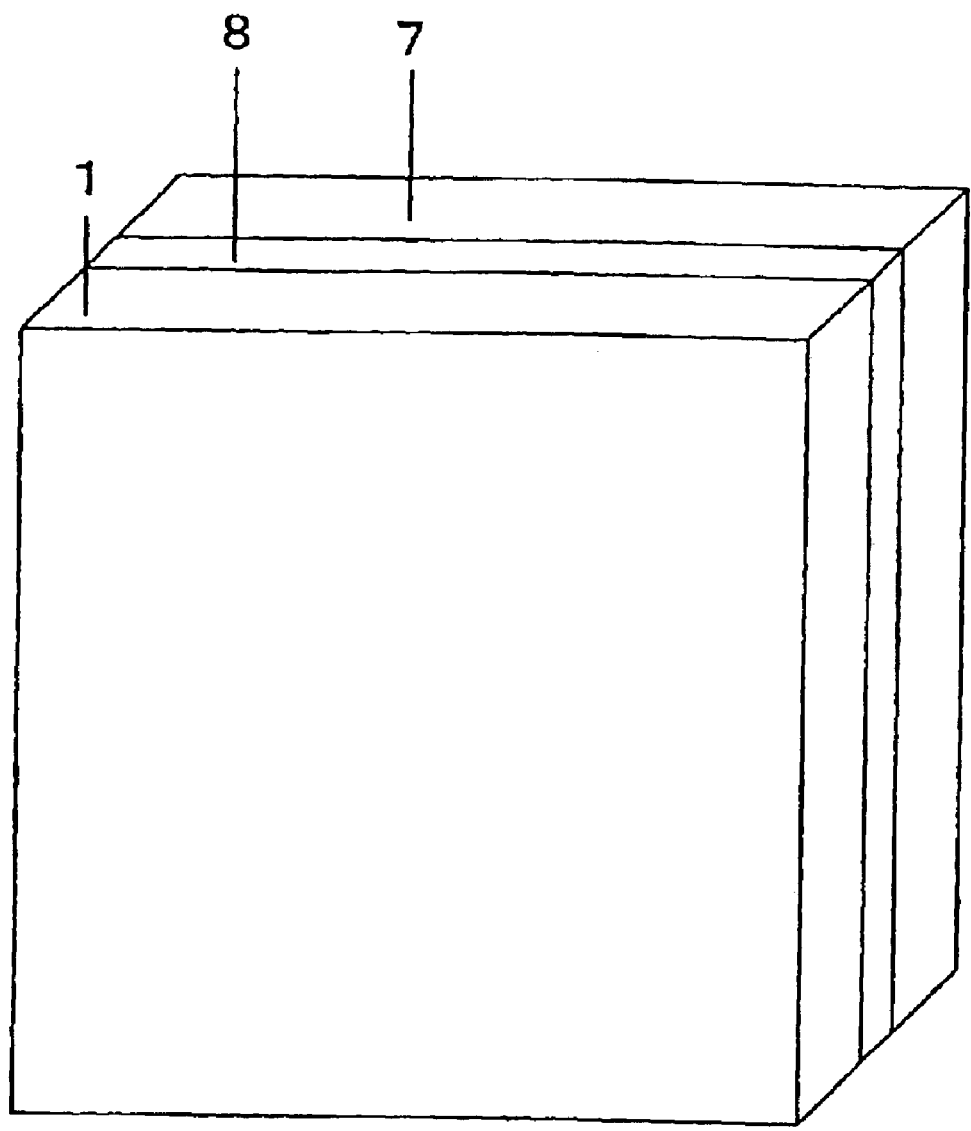
FIG. 8 is a perspective view illustrating an exemplary process of temporarily fixing the plate-like piezoelectric element.

First, as shown in FIG. 8, a process of temporarily fixing a plate-like piezoelectric element 1 to a glass substrate 7 by means of an adhesive sheet 8 is performed. In this embodiment, as the plate-like piezoelectric element 1, a piezoelectric ceramic having sizes of 30 mm in X direction, 30 mm in Y direction, and 0.050 mm in Z direction is used as in the first embodiment. As the adhesive sheet 8, a thermally peeling sheet is used. The adhesive sheet 8 is not limited to the thermally peeling sheet, but may be a sheet which satisfies the following conditions. The sheet can hold the plate-like piezoelectric element 1, the plate-like piezoelectric element 1 is not peeled off from the peeling sheet in the cutting process, and the sheet can be peeled off by any action after the working. For example, a peeling sheet by UV light irradiation can be used as the adhesive sheet 8.

Figure 9:
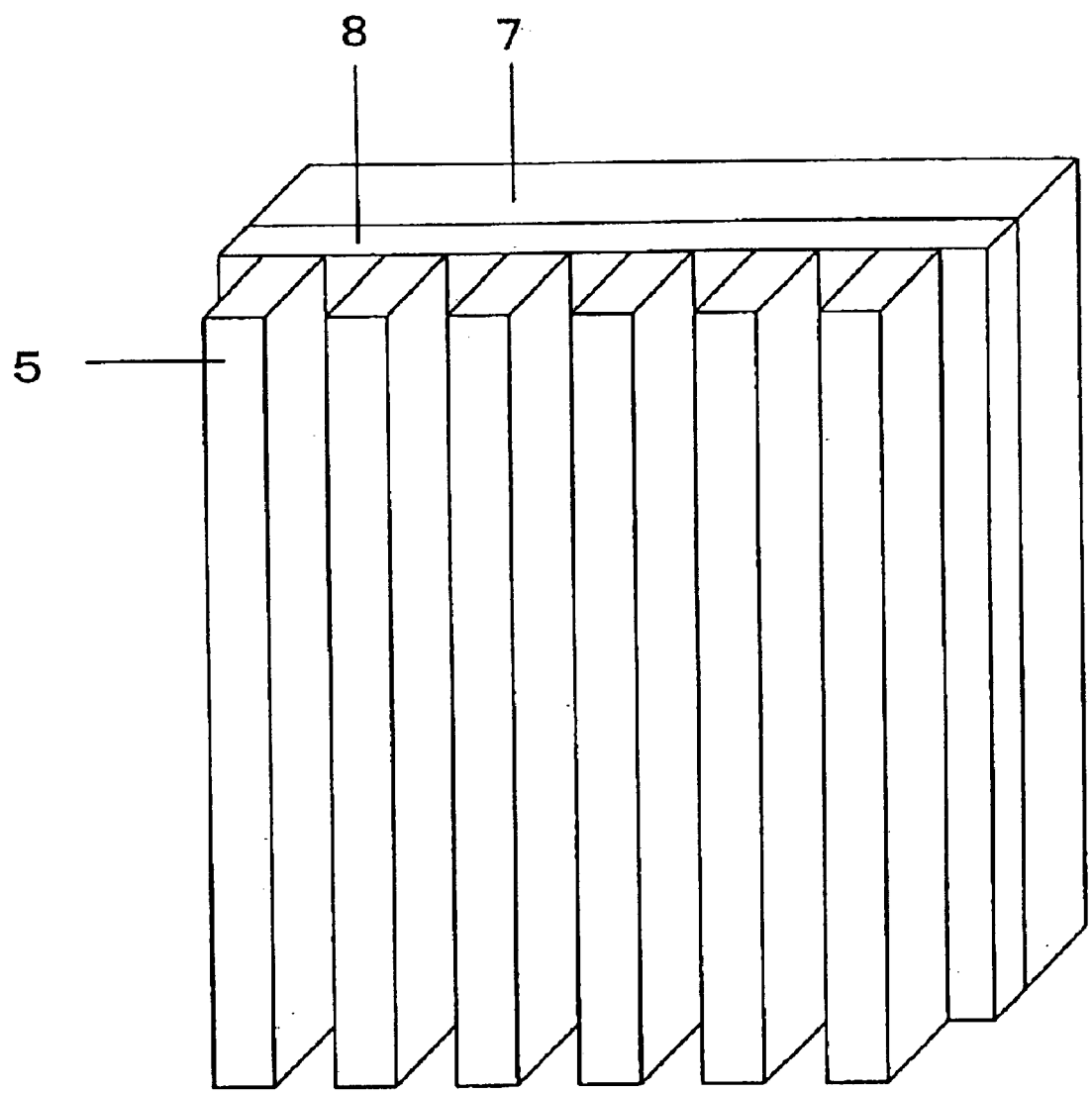
FIG. 9 is a perspective view illustrating an exemplary process of working the plate-like piezoelectric element.

Next, as shown in FIG. 9, a plurality of cutting grooves parallel to the plate-like piezoelectric element 1 are formed, so as to cut the plate-like piezoelectric element 1, thereby forming a plurality of columnar piezoelectric elements 5. Specifically, by the same method as that described with reference to FIGS. 2A to 2C, a working mask 4 is formed, and then sand blasting is performed. In this way, as shown in FIG. 9, a configuration in which columnar piezoelectric elements 5 are temporarily fixed on the substrate 7 by means of the adhesive sheet 8 can be obtained. In this embodiment, as in the first embodiment, a width and an interval of the stripe portion of the working mask are set to be 0.050 mm.

Next, as shown in FIG. 10A, the plurality of columnar piezoelectric elements 5 temporarily fixed on the substrate 7 are disposed so as to face a sheet-like resin layer 2. As the resin layer 2, an epoxy-based tack resin sheet having a thickness of about 0.050 mm can be suitably used.

Next, to the resin layer 2 and the substrate 7 in a condition where the resin layer 2 is in contact with the columnar piezoelectric elements 5, a pressure of about 0.1 MPa is applied, for example, and heating is performed for 10 minutes at 120° C. The pressurizing and heating process causes the resin layer 2 and the columnar piezoelectric elements 5 to adhere, and a thermally peeling effect of the adhesive sheet 8 is exhibited. Accordingly, as shown in FIG. 10B, the columnar piezoelectric elements 5 are peeled off from the adhesive sheet 8, and transferred to the resin layer 2.

In this embodiment, epoxy-based tack resin sheet is used as the resin layer 2, but the resin layer 2 may be another type of adhesive sheet if the same effects can be attained. Alternatively, a liquid resin or the like may be applied onto the columnar piezoelectric elements 5 by printing or other methods, so as to form a layer of resin, and then the resin layer may be hardened and peeled off.

The 300 columnar piezoelectric elements 5 are moved onto the resin layer 2 while maintaining the arrangement on the substrate 7 with high accuracy by the above-mentioned transferring process. In this way, a unit composite sheet is prepared.

Figure 11:
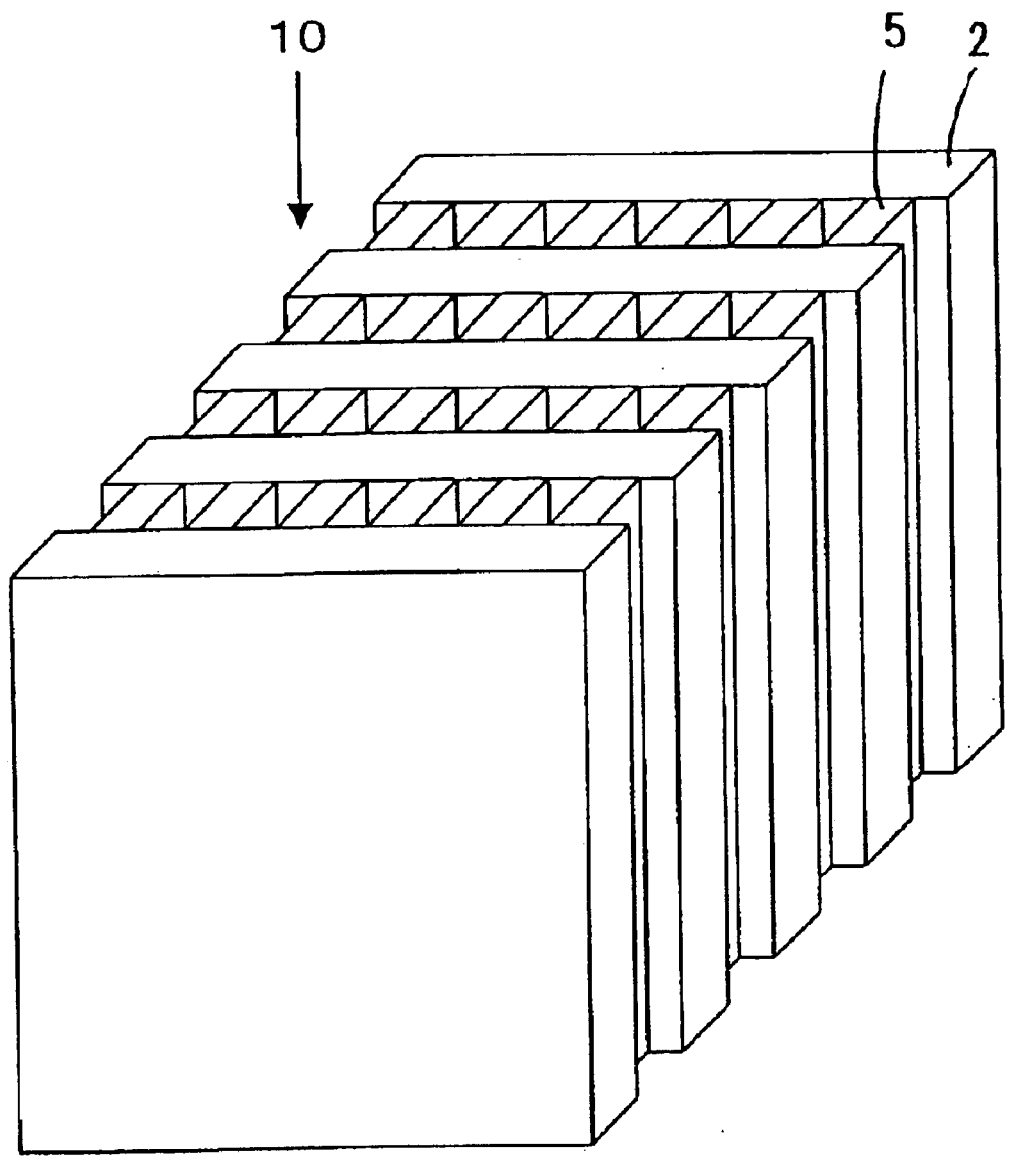
FIG. 11 is a perspective view illustrating an exemplary process of forming a composite piezoelectric element.

After 120 unit composite sheets are prepared, and layered as shown in FIG. 11, a resin layer having sizes of 30 mm in X direction, 30 mm in Y direction, and 0.050 mm in Z direction is disposed on the uppermost portion. Next, for example, in an atmosphere of 120° C. and 0.1 Torr or less, a pressure of about 0.1 MPa is applied, and the layered structure is held for 10 minutes. Thereafter, the atmosphere is recovered to be atmospheric, and the pressure is released, and then the layered structure is held at 180° C. for 1 hour. In this way, the resin layer 2 is hardened, and the layered structure is integrated, so as to form a composite piezoelectric element 10.

In this embodiment, the resin layer 2 used for the transferring is only subjected to the heat history of 120° C. or less in the transferring from the thermally peeling sheet, so that the adhesive force is kept after the transferring. Thus, it is unnecessary to interpose an additional adhesive sheet for integrating the layered structure. Accordingly, the time required for a process of integrating the layered structure can be shortened as compared with the case of Embodiment 1, and the lower cost can be realized.

The integrated composite piezoelectric element 10 has a rectangular parallelepiped shape having sizes of 30 mm in X direction, 30 mm in Y direction, and 12 mm in Z direction. In this composite piezoelectric element, 36,000 columnar piezoelectric elements are held in parallel by means of the resin layer.

(Embodiment 4)

Hereinafter, a fourth embodiment of the composite piezoelectric element according to the present invention will be described.

The composite piezoelectric element of this embodiment is a composite piezoelectric element suitable for a high-frequency ultrasonic piezoelectric transducer. This embodiment is different from the third embodiment only in that a process of making the plate-like piezoelectric element 1 of the composite plate 3 thin is additionally performed, and the width of the stripe portion of the working mask is narrow so as to be about 0.02 mm in fabrication. The process of making the plate-like piezoelectric element 1 thin, and the process of forming the working mask are the same as those described in the second embodiment.

(Embodiment 5)

Hereinafter, a fifth embodiment of the composite piezoelectric element according to the present invention will be described.

In this embodiment, after the composite piezoelectric element 10 of Embodiment 1 to Embodiment 4 is prepared, a gap portion of the composite piezoelectric element is impregnated with a filling resin 9, and then the resin is hardened. Thereafter, similarly to the above-described respective embodiments, the cutting process, the electrode forming process, and the polarization process for the composite piezoelectric element 10 are performed.

In the composite piezoelectric element 10 of Embodiment 1 to Embodiment 4, for example as shown in FIG. 5, a gap portion exists between the columnar piezoelectric elements 5 arranged on each unit composite sheet, and the gap portion is filled with air. Since the air is also dielectric, it is unnecessary to fill the gap portion with another dielectric material so as to function as a composite piezoelectric element. However, if the gap portion is embedded with a dielectric material which can be hardened, and then the material is hardened, the mechanical strength of the composite piezoelectric element can be improved, and preferably the oscillation mode of the composite piezoelectric element 10 can be appropriately adjusted.

Figure 12:
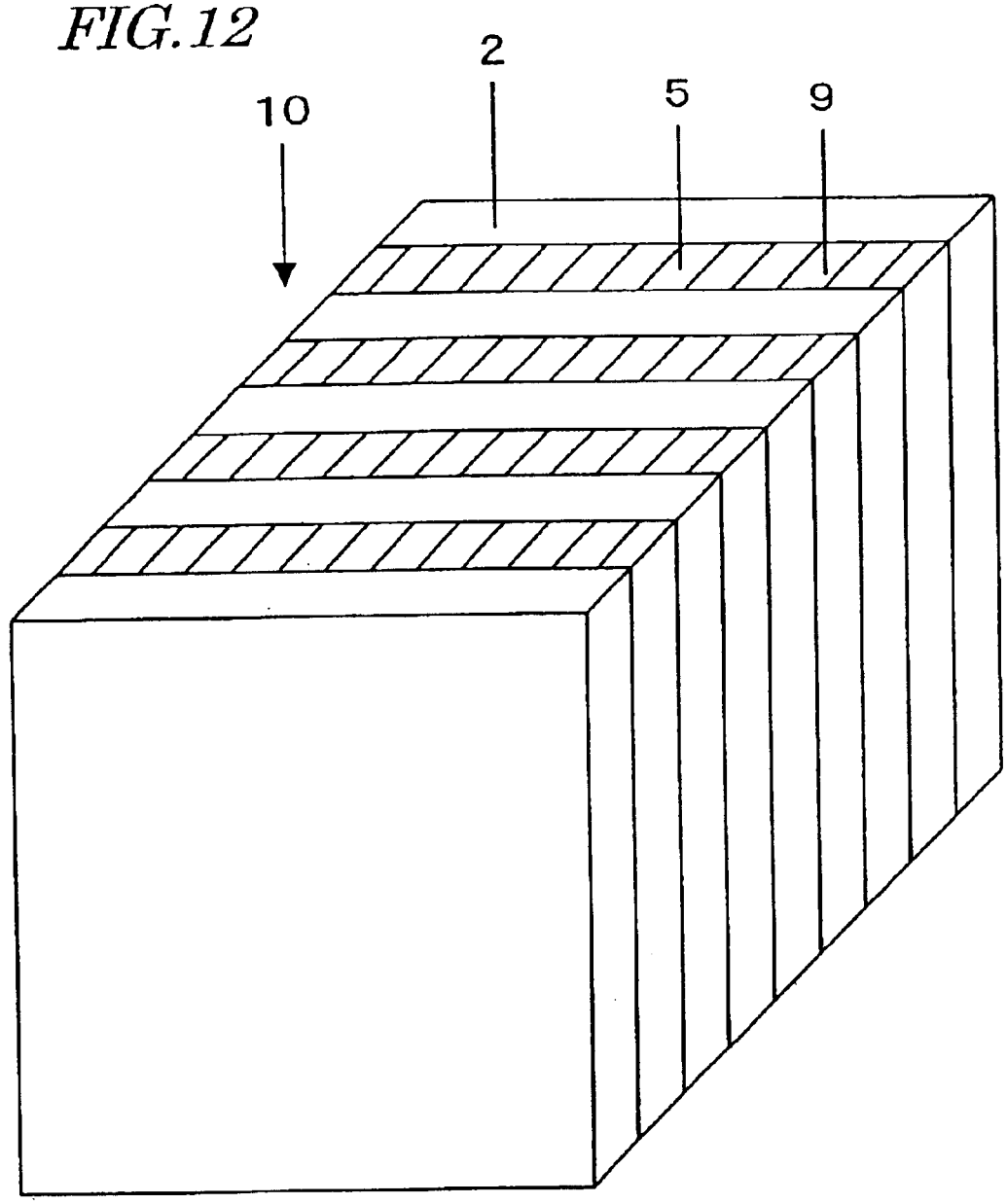
FIG. 12 is a perspective view illustrating an exemplary process of filling a gap in the composite piezoelectric element with a resin.

In this embodiment, as shown in FIG. 12, the gap portion formed between the columnar piezoelectric elements 2 is filled with a resin 9 as a dielectric element, so as to improve the mechanical strength of the composite piezoelectric element 10.

According to this embodiment, a breakage hardly occurs in process steps such as the cutting steps. As a result, the production yield is increased, and the production cost can be further reduced. When the gap portion is embedded by the resin 9, two faces on which the electrodes are formed are not conducted via the gap portion. For this reason, if the electrodes are formed by using electroless plating, it is possible to easily prevent the two electrodes from being short-circuited. Accordingly, electrodes can be collectively formed for a number of composite piezoelectric elements, and the cost can be further reduced.

(Embodiment 6)

Hereinafter, a sixth embodiment of the composite piezoelectric element according to the invention will be described.

In this embodiment, by using a method different from the method used in the fifth embodiment, respective columnar piezoelectric elements 5 are surrounded by a resin.

Figure 13:
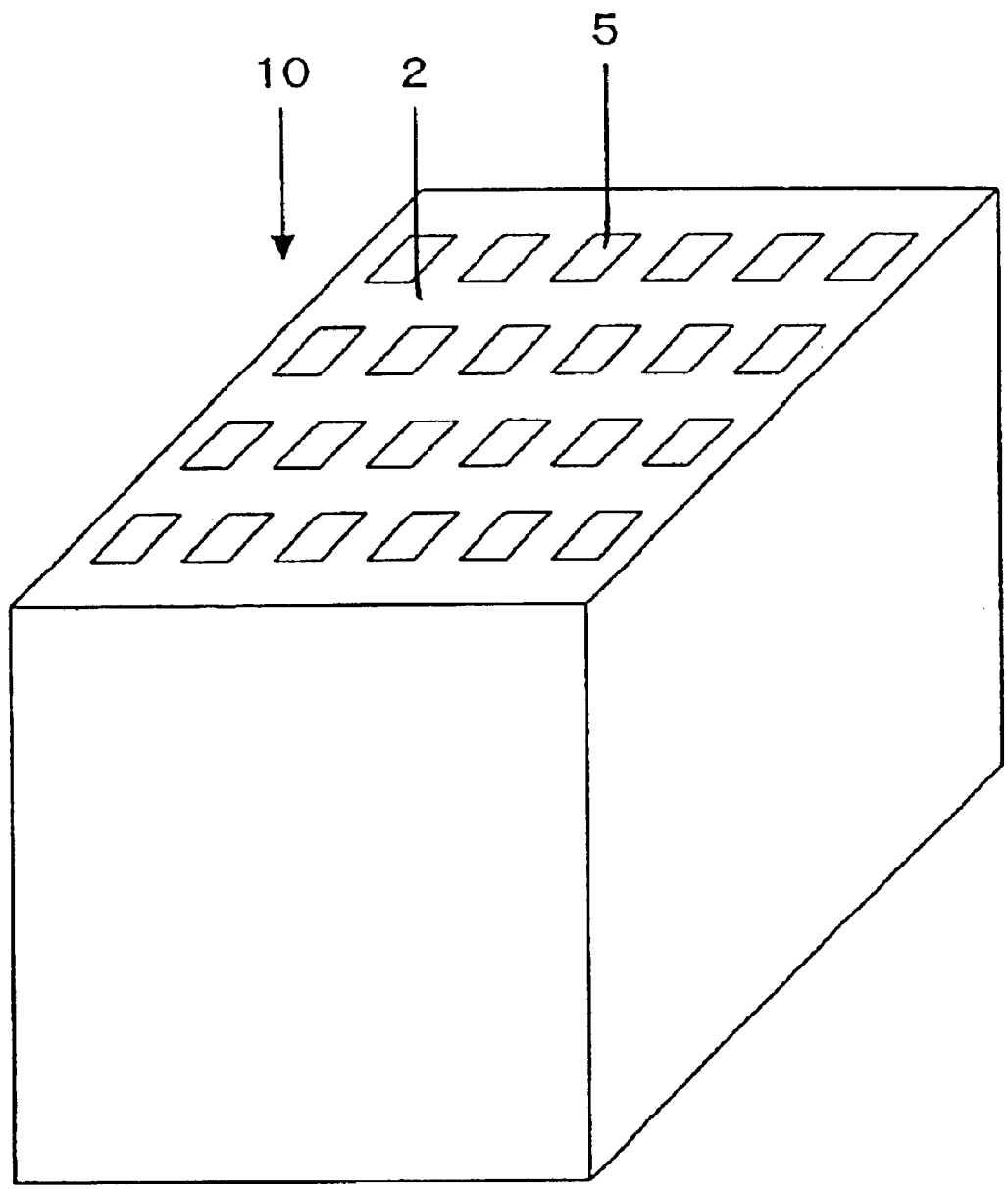
FIG. 13 is a perspective view illustrating an exemplary process of forming a composite piezoelectric element.

In this embodiment, a plurality of composite sheets are layered in such a manner that respective columnar piezoelectric elements 5 are disposed between resin layers 2. When the layered composite sheets are integrated, a pressure to be applied to the layered structure is increased. Specifically, in an atmosphere of 120° C. and 0.1 Torr or less, a pressure of 1 MPa is applied to the layered structure, and the layered structure is left for 10 minutes. Thereafter, the pressure is returned to be the atmospheric pressure, and the layered structure is heated at 180° C. for one hour while the atmospheric pressure is applied to the layered structure. As described above, in the case where the adhesion and the integration are performed while a relatively high pressure is applied, an epoxy-based tack resin sheet or a resin layer which is not yet hardened interposed between the unit composite sheets in the layering flows and embeds gaps of the columnar piezoelectric elements 5. As a result, a composite piezoelectric element 10 in which all gaps are filled with the resin as shown in FIG. 13 can be obtained. The succeeding process steps are the same as those in the above-described embodiments.

In this embodiment, the gap portions are filled with the resin by the above-mentioned method, so as to improve the mechanical strength as a composite piezoelectric element. Thus, a breakage hardly occurs in process steps s such as the cutting steps, and the production yield is increased. As a result, the production cost can be reduced. Moreover, in this embodiment, electroless plating can be used for the electrode formation, so that electrodes can be collectively formed for a large number of composite piezoelectric elements. Thus, the low cost can be realized.

As compared with the fifth embodiment, this embodiment can omit the resin filling process after the layering, so that the production time can be shortened, and the production cost can be further reduced.

(Embodiment 7)

Figure 14:
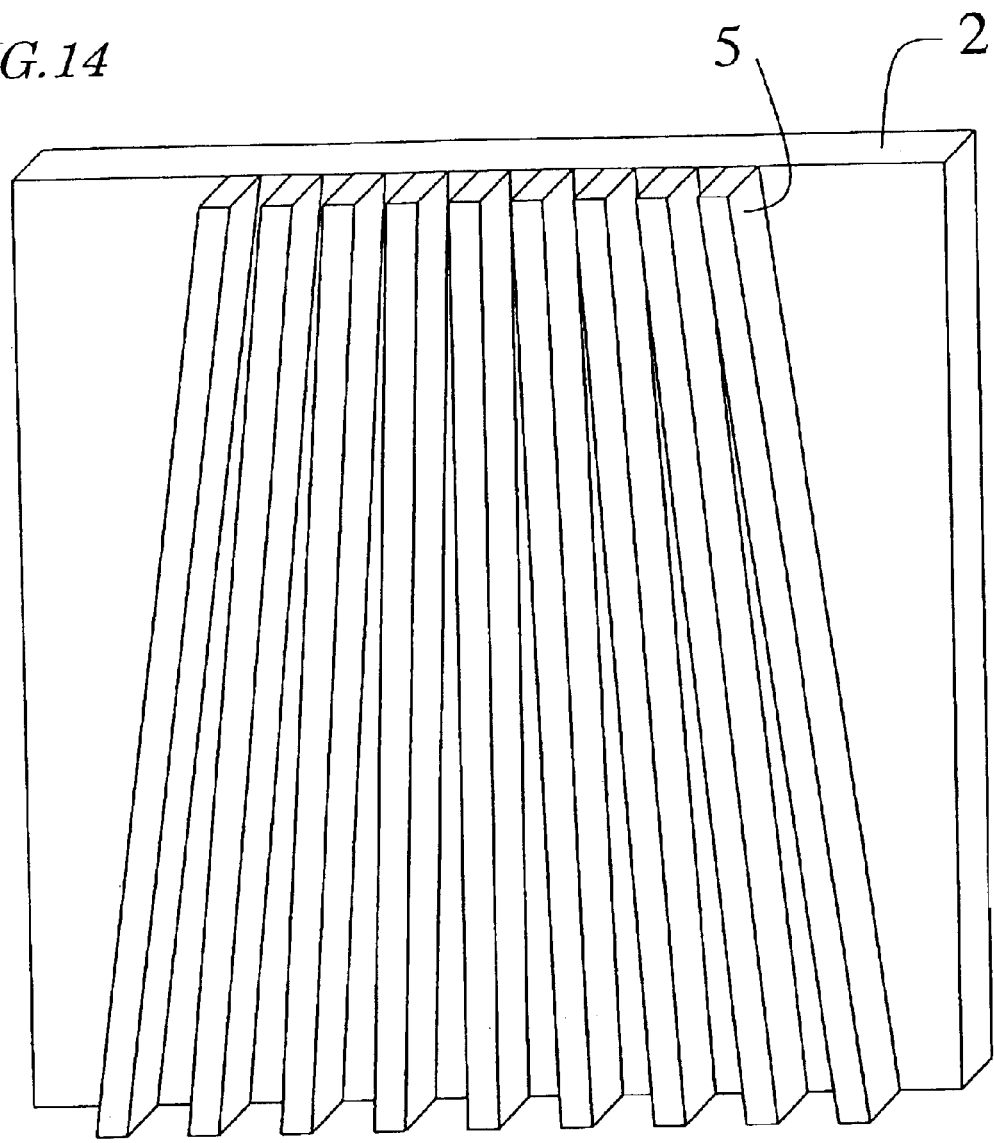
FIG. 14 is a perspective view showing an exemplary variation of a pattern of columnar piezoelectric elements.
Figure 15:
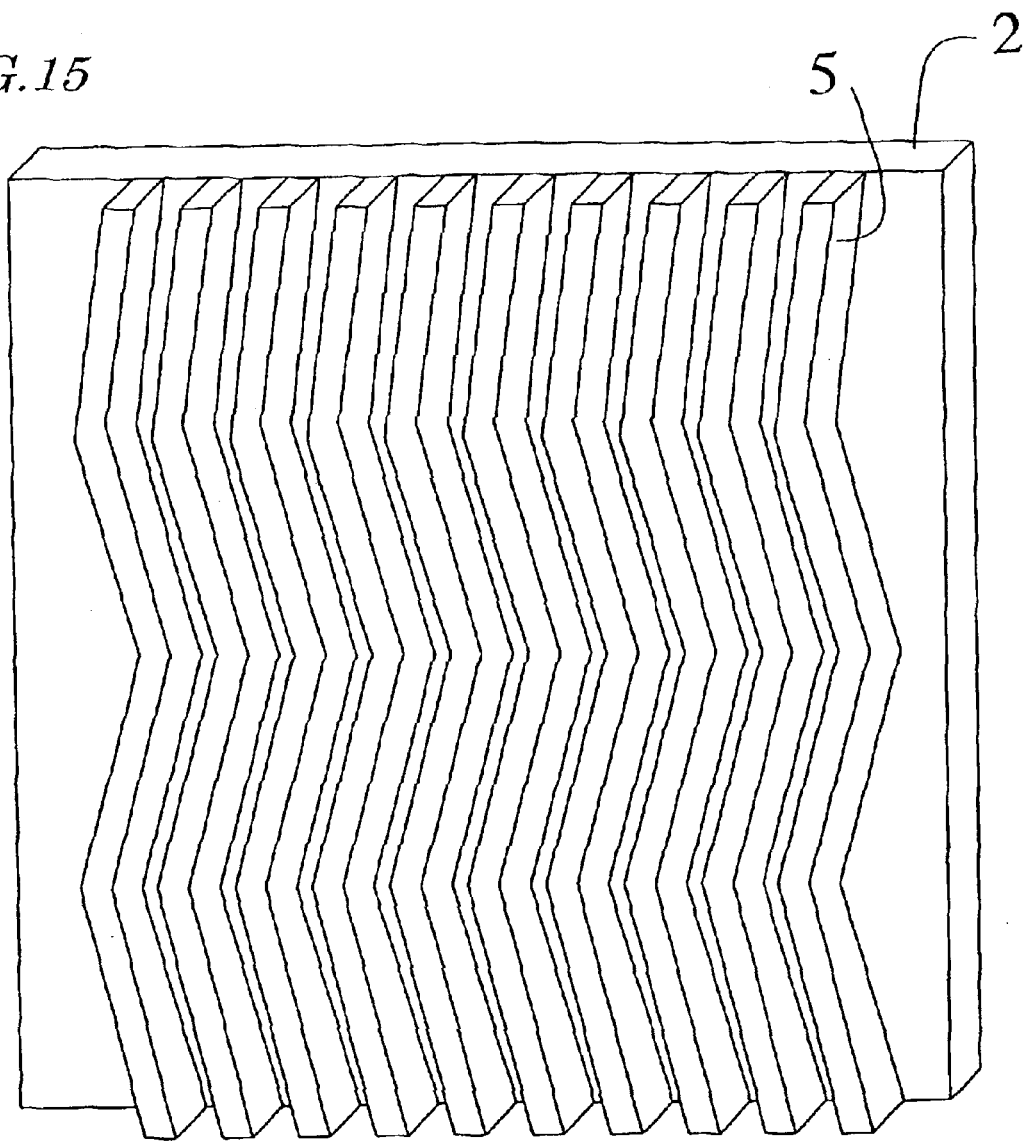
FIG. 15 is a perspective view showing another exemplary variation of a pattern of columnar piezoelectric elements.
Figure 16:
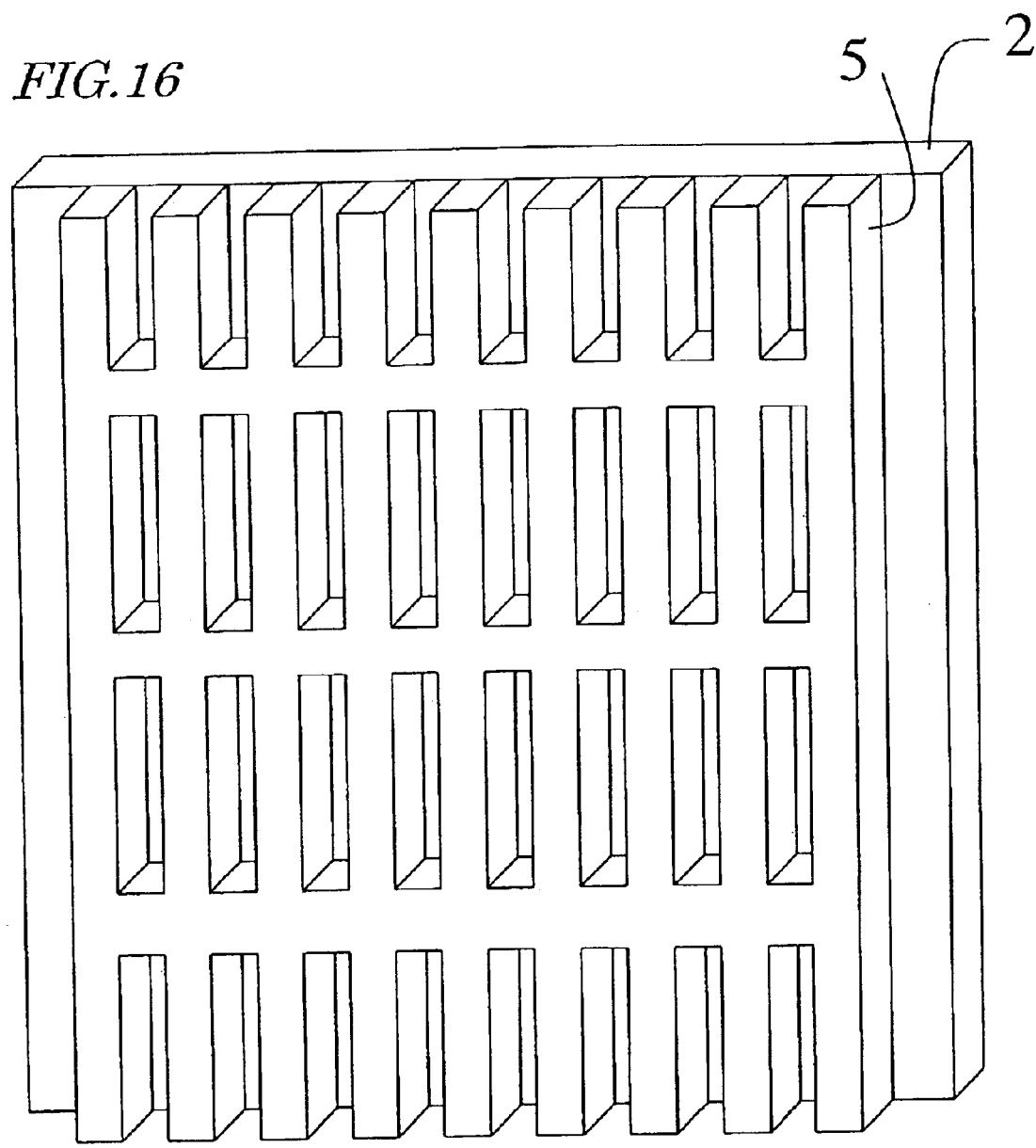
FIG. 16 is a perspective view showing still another exemplary variation of a pattern of columnar piezoelectric elements.
Figure 17:
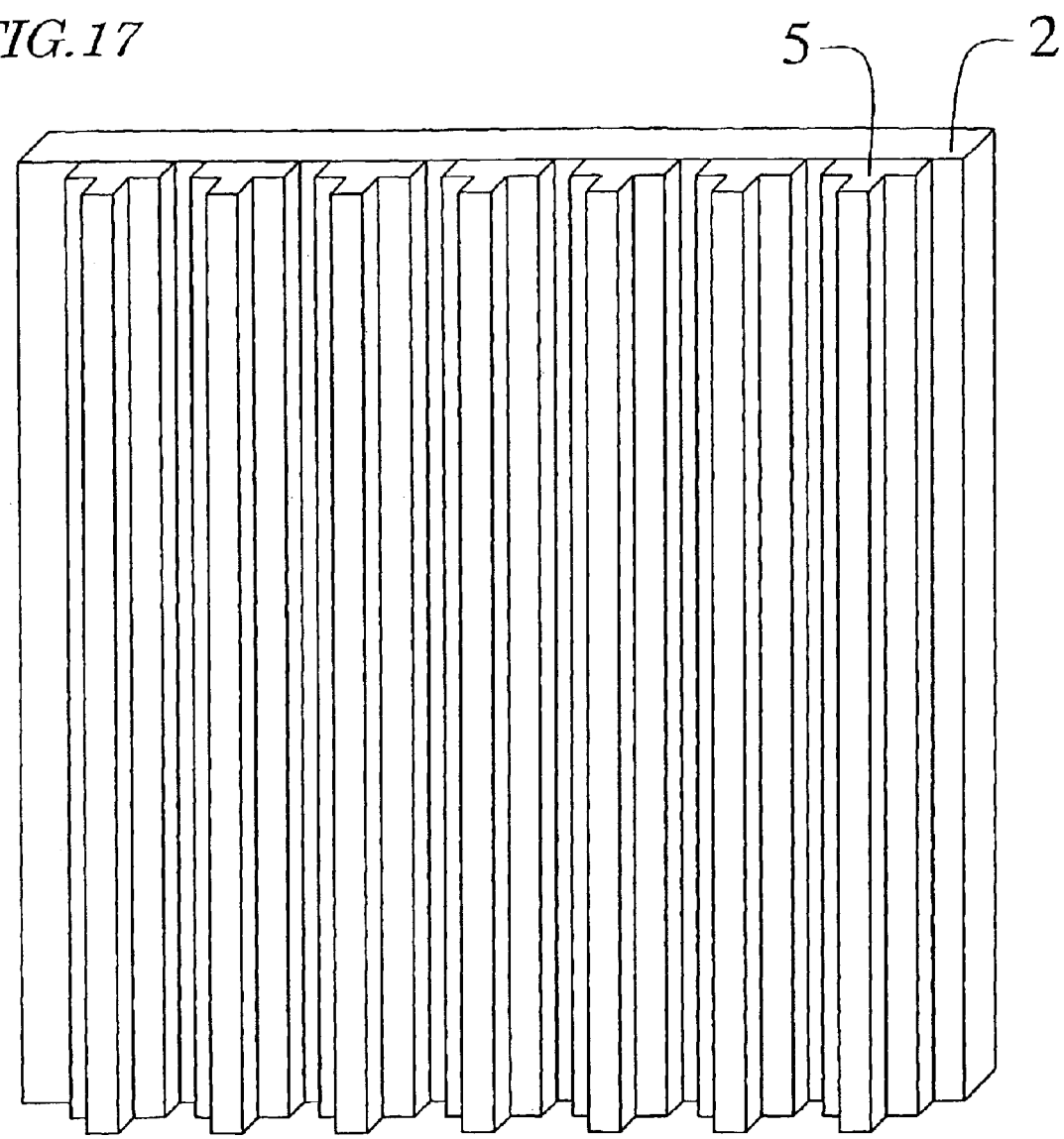
FIG. 17 is a perspective view showing an exemplary variation of a shape of columnar piezoelectric elements.

In the above-described embodiments, the shapes of all columnar piezoelectric elements in a unit composite sheet are linear, and the columnar piezoelectric elements are arranged in parallel. However, the shape of a piezoelectric element in a unit composite sheet is not limited to be linear. In addition, the arrangement is not limited to the parallel arrangement. For example, as shown in FIG. 14 to FIG. 16, various shapes of columnar piezoelectric elements may be formed. FIG. 14 shows an example in which the columnar piezoelectric elements are not arranged in parallel. FIG. 15 shows an example in which the columnar piezoelectric element does not extend linearly, but bends. FIG. 16 shows an example in which the columnar piezoelectric elements are coupled to each other, so as to form a lattice pattern. FIG. 17 shows an example in which a section of the columnar piezoelectric element is not square, but polygonal. In order to form columnar piezoelectric elements having such a shape in section by sand blasting, it is sufficient to regulate an injection time of particles in the sand blasting. The section of the columnar piezoelectric element perpendicular to the longitudinal direction thereof is not necessarily a polygon constituted by linear sides. Alternatively, the section has a shape in which part of the section may include a curve. After a working mask is removed, for example, it is possible to change an exposed surface of a columnar piezoelectric element to a gently curved face by additionally performing the sand blasting or other workings in a short time. It is preferred that the side face of the columnar piezoelectric element be a curved face, because interference of oscillation mode hardly occurs between adjacent piezoelectric elements.

(Embodiment 8)

Figure 18:
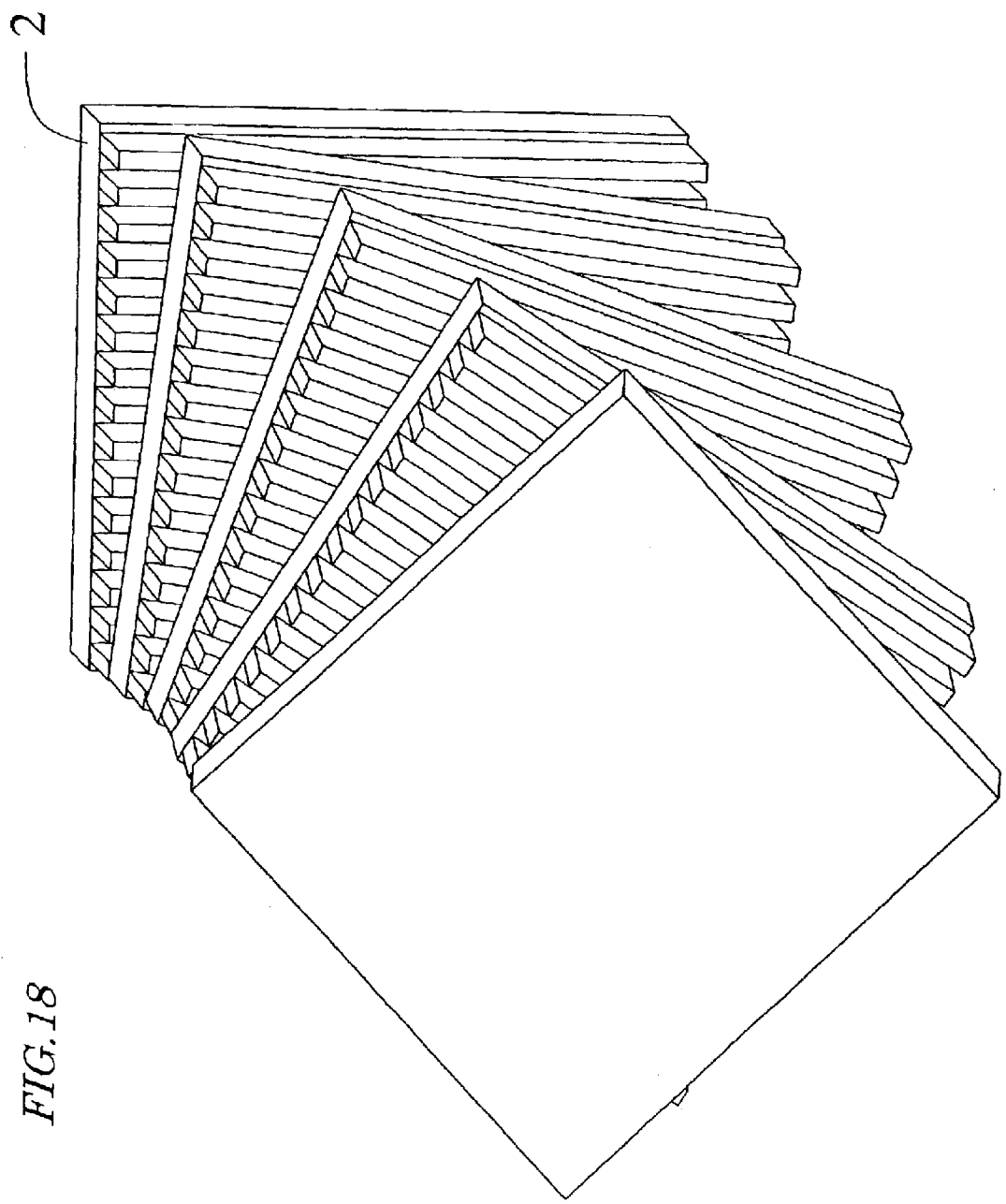
FIG. 18 is a perspective view showing an exemplary variation of a layered configuration of unit composite sheets.

In the above-described embodiments, when unit composite sheets are to be layered, unit composite sheets having the same shape are used, and the unit composite sheets are disposed in such a manner that columnar piezoelectric elements are arranged in the same direction. However, the present invention is not limited to the arrangement. For example, as shown in FIG. 18, directions of the respective unit composite sheets may be shifted, and the longitudinal direction of the columnar piezoelectric elements may be rotated for every unit composite sheet.

Alternatively, the unit composite sheets shown in FIG. 14 to FIG. 17 may be layered and integrated in arbitrary combinations. Moreover, when a layered structure of composite sheets in which unit composite sheets are layered and integrated is to be cut, the cut face is not necessarily a plane, but a curved face.

Alternatively, a resin layer of the unit composite sheet is not necessarily flat, but bent.

(Embodiment 9)

Figure 19:
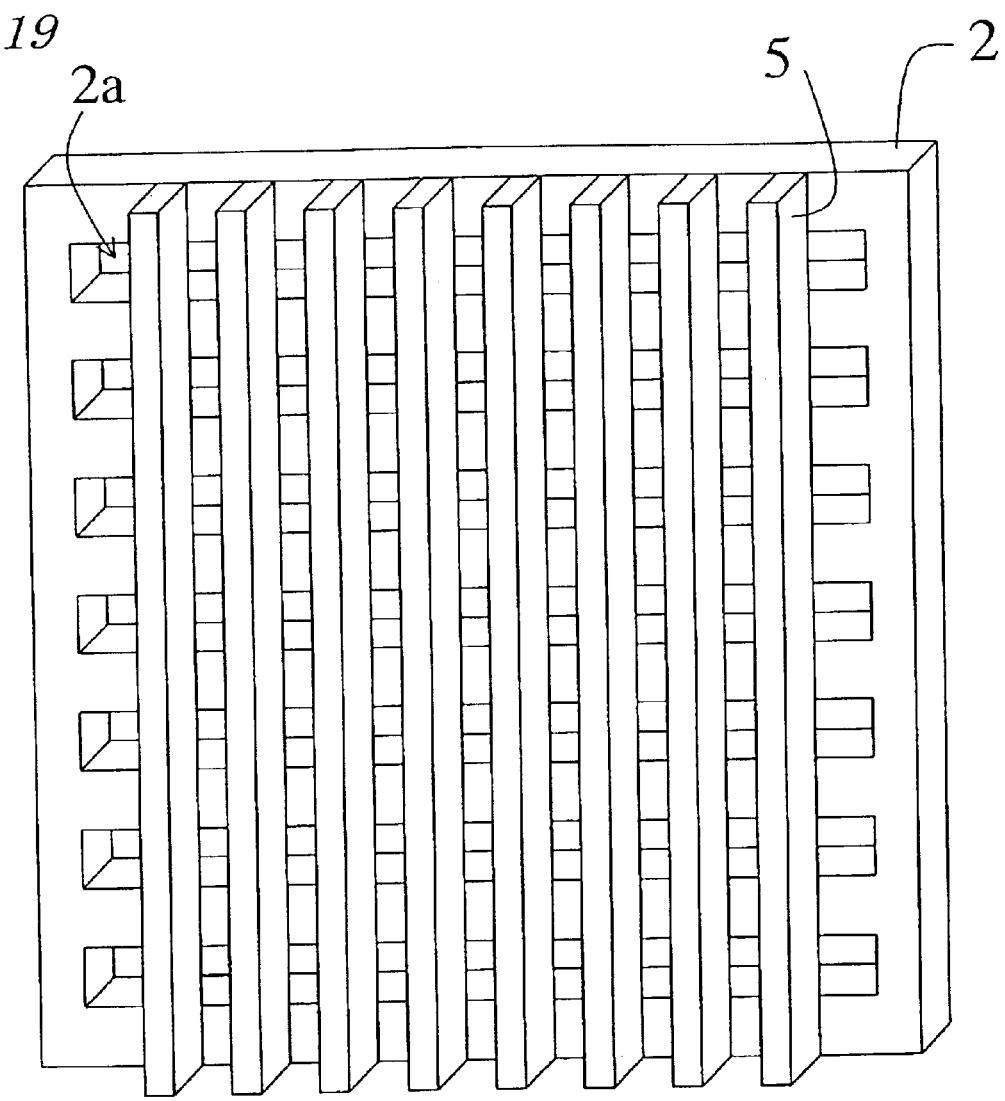
FIG. 19 is a view showing an exemplary variation of a resin layer constituting a unit composite sheet.

In the above-described embodiments, as a resin layer for holding a piezoelectric element, a continuous sheet without any openings is used. The resin layer is not limited to such a type of sheet. For example, as shown in FIG. 19, a resin layer 2 in which an opening portion 2a is formed in part may be used. Alternatively, a resin layer in which a thickness of one part is different from a thickness of the other part may be used.

(Embodiment 10)

In the above-described embodiments, the dispositional relationship of columnar piezoelectric elements on respective unit composite sheets is fixed. However, in the process of layering and integrating a plurality of unit composite sheets, there is a possibility that a relative dispositional relationship between columnar piezoelectric elements on one unit composite sheet and columnar piezoelectric elements on another unit composite sheet may change. In the case of a composite piezoelectric element for a normal use, even if the relative positional relationship of the columnar piezoelectric elements is changed, the piezoelectric characteristics are hardly affected. For this reason, the alignment for the columnar piezoelectric elements is not particularly required. However, in the case where the relative dispositional relationship of the columnar piezoelectric elements is defined with high accuracy for some reasons, it is preferred that the alignment by image recognition be performed in the layering process.

Figure 20:
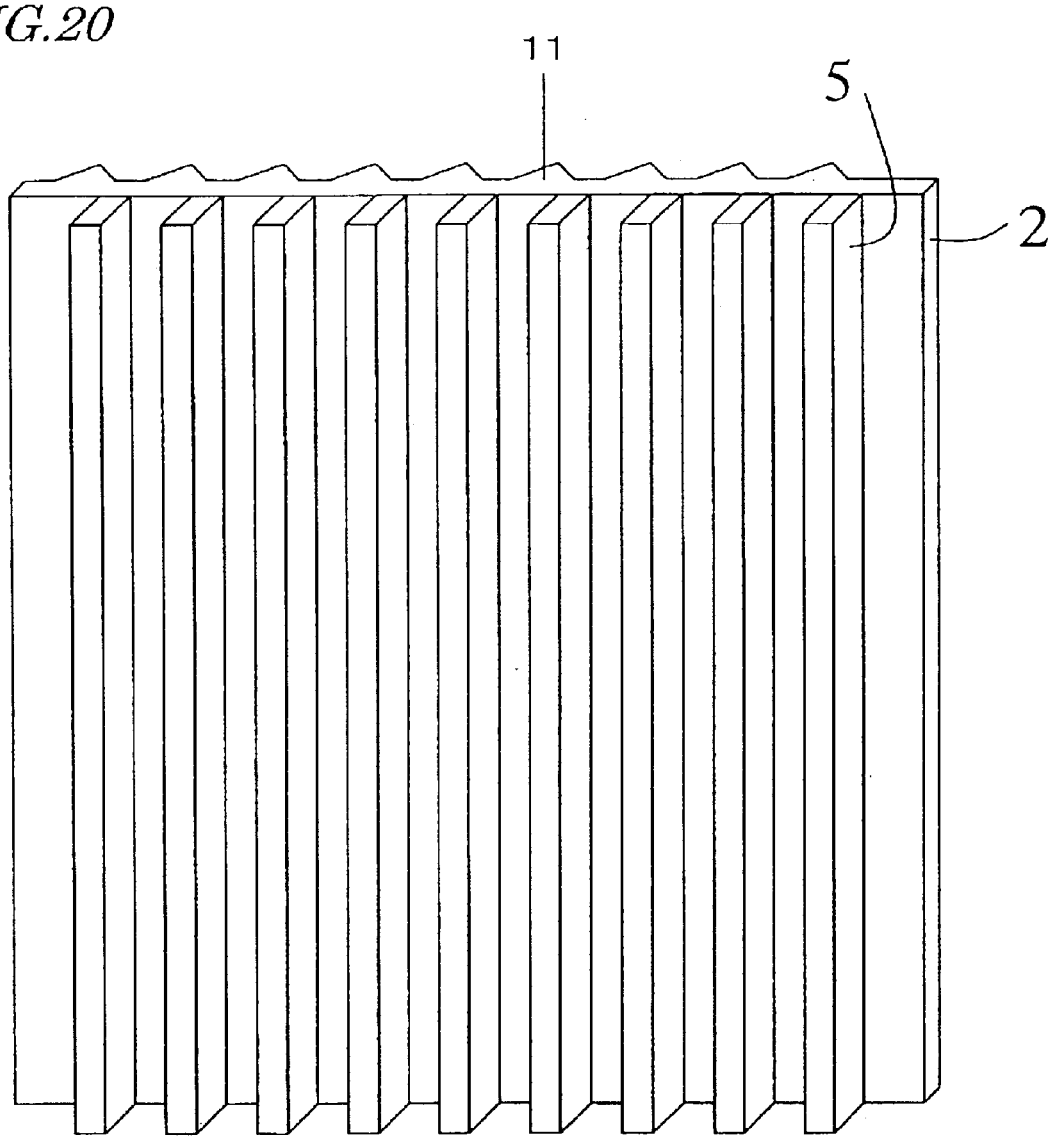
FIG. 20 is a view showing another exemplary variation of a resin layer constituting a unit composite sheet.

In order to easily perform the alignment for layering unit composite sheets, as shown in FIG. 20, a plurality of projections 11 may be periodically arranged in a resin layer of the unit composite sheet (a face which is not in contact with columnar piezoelectric elements). The arranged pitch of the projections 11 is set so as to be equal to the pitch of columnar piezoelectric elements 5 on another unit composite sheet disposed oppositely to the resin layer 2. The size and shape of each projection 11 is designed so that, when the unit composite sheets are layered, a columnar piezoelectric element is fitted in a recess portion formed between adjacent two projections 11. Such projections 11 can exhibit a function of reducing a gap between adjacent columnar piezoelectric elements, and thus improving the strength of the composite piezoelectric element. According to this embodiment, when a gap portion is filled with a resin as in the fifth embodiment, all gaps can be filled with a reduced amount of resin. In addition, when a resin layer is caused to flow so as to surround a piezoelectric element with a resin as in the sixth embodiment, the layering and integration process can be performed at a lower pressure.

(Embodiment 11)

A fabrication method of this embodiment will be described with reference to FIG. 21 to FIG. 27.

Figure 21B:
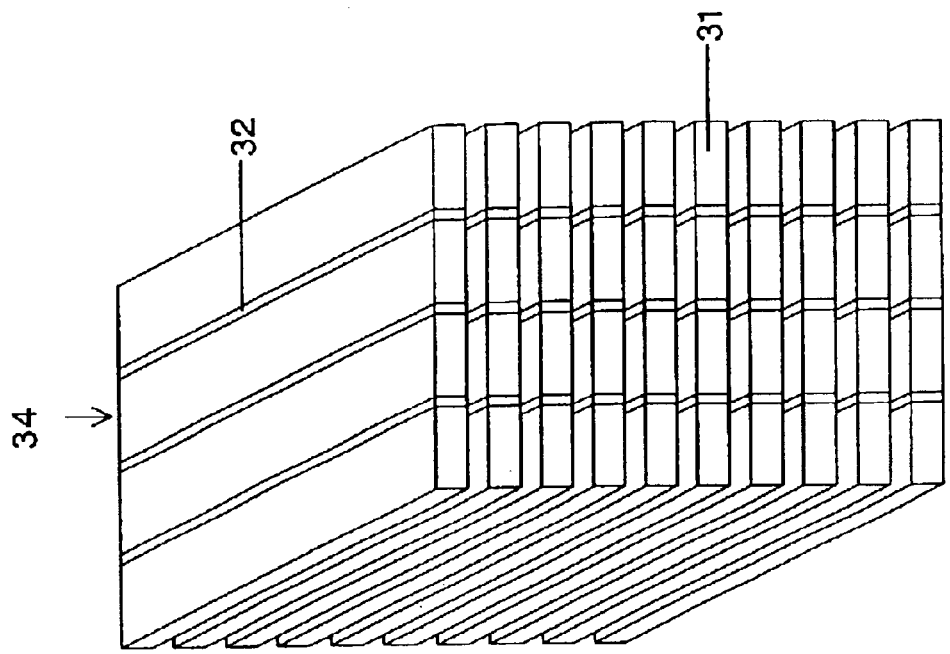
FIGS. 21A and 21B are perspective views illustrating an exemplary process of preparing a composite plate of the composite piezoelectric element in Embodiment 11 of the present invention.
Figure 21A:
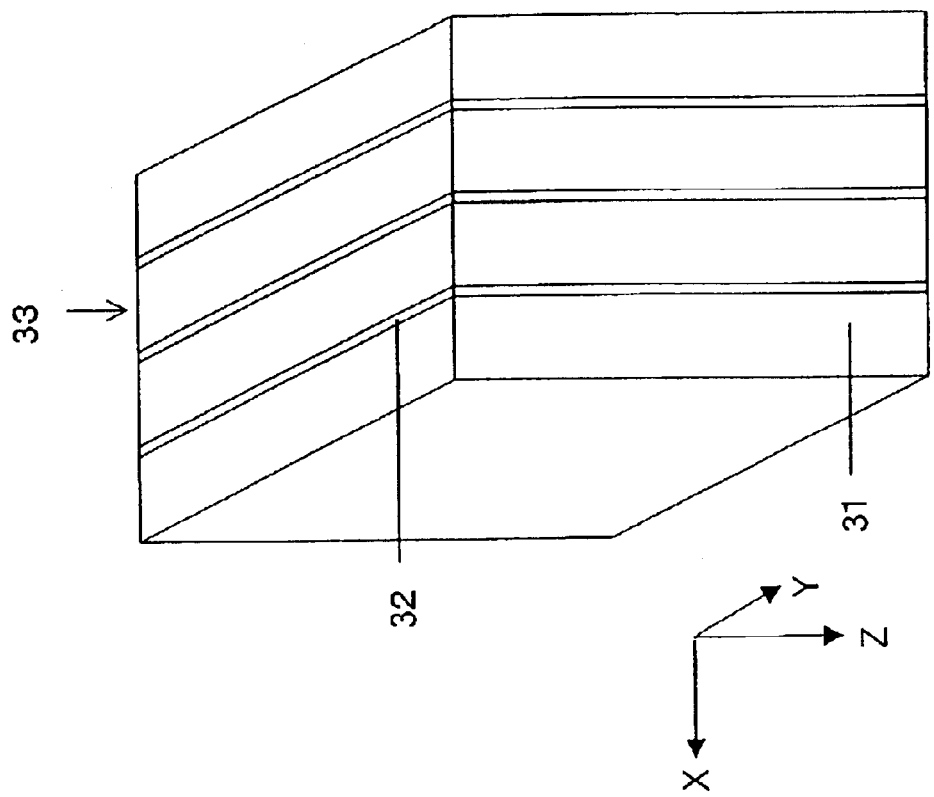

As shown in FIG. 21A, a layered structure 33 in which a piezoelectric element 31 and a conductive element 32 are alternately layered is formed. In the coordinate system shown in FIG. 21A, the sizes of each piezoelectric element 31 are, for example, 0.5 mm (500 $\mu$m) in X direction, 20 mm in Y direction, and 20 mm in Z direction. The sizes of each conductive element 32 are 0.01 mm (10 $\mu$m) or less in X direction, 20 mm in Y direction, and 20 mm in Z direction. By alternately layering the piezoelectric element 31 and the conductive element 32 a plurality of times, a layered structure 33 having sizes of 20 mm in X direction, 20 mm in Y direction, and 20 mm in Z direction is formed. The sizes of the piezoelectric element 31 and the conductive element 32 and the sizes of the layered structure 33 are not limited to these values, but can be appropriately selected to be preferable sizes in accordance with the intended use.

As a material which constitutes the piezoelectric element 31, a material with high piezoelectric properties is preferable. For example, a ceramic such as lead zirconate titanate, lead titanate, barium titanate, or the like, or a single crystal constituted by quartz, lithium niobate, lead zirconate titanate can be used. As the conductive element 32, a material with high conductivity is sufficient, and the material is selected from metals such as gold, silver, platinum, and nickel, or carbon, depending on the cost and the conductivity required for the intended use.

The piezoelectric element 31 and the conductive element 32 having the above-mentioned sizes may be joined with an appropriate adhesive, so as to form a layered structure. Alternatively, a ceramic green sheet made of the above-mentioned material and a conductive paste may be layered and sintered, so as to form a layered structure 33.

Next, as shown in FIG. 21B, the layered structure 33 is cut along a plane (X-Y plane) parallel to the layering direction (X direction), thereby obtaining a plurality of composite plates 34. In this embodiment, by using dicing machine, the layered structure was cut at pitches of 0.1 mm, and then the composite plate 34 was lapped so as to have a thickness of 0.05 (50 $\mu$m). In this way, 200 composite plates 34 can be obtained from the layered structure 33. In order to cut the layered structure 33, various work machine using a wire saw, laser, ultrasonic, or the like can be used, instead of the dicing machine. As for the pitches of cutting and the thickness of each composite plate 34, other values can be selected in accordance with the intended use.

Figure 22:
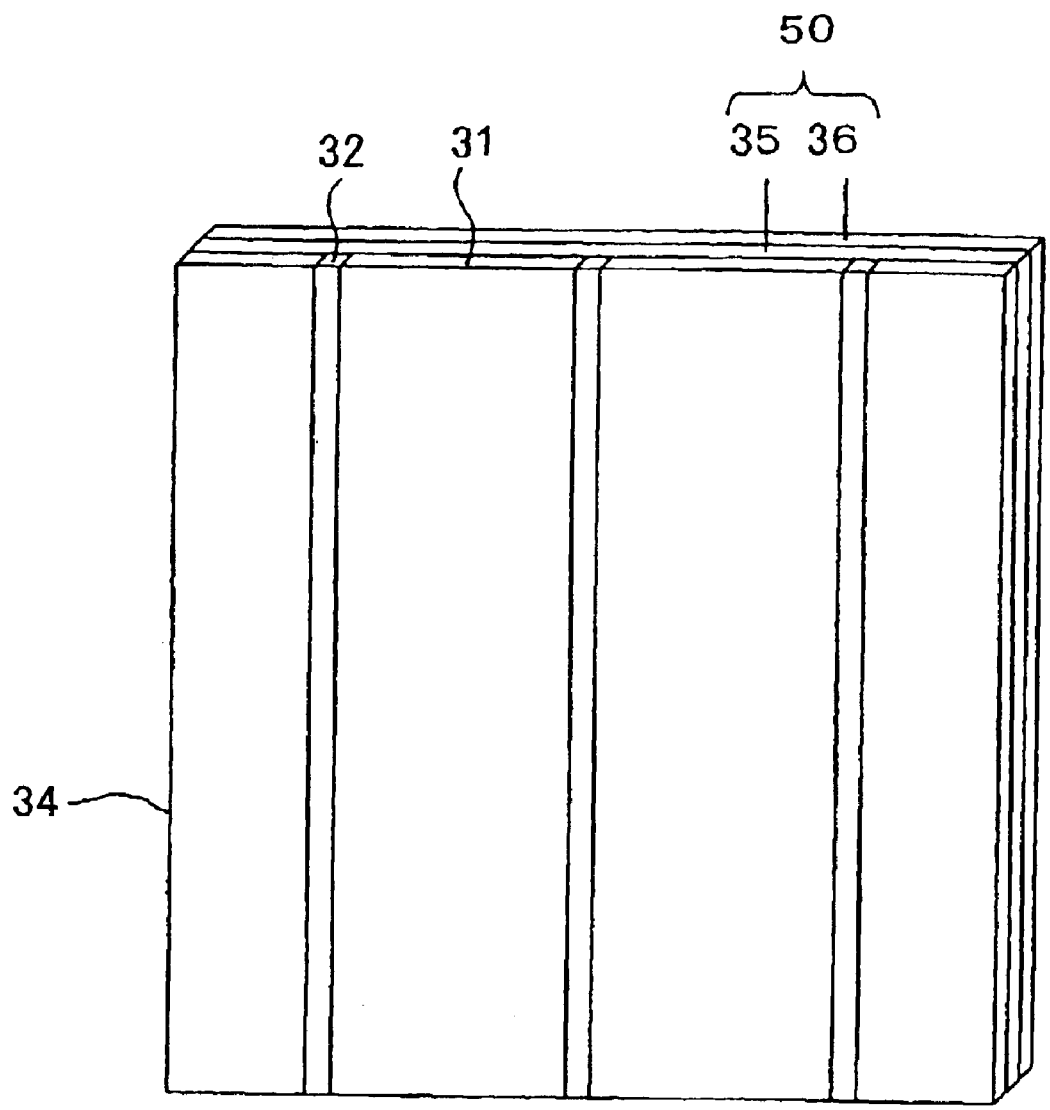
FIG. 22 is a perspective view showing a condition in which a resin sheet is stuck on the composite plate of FIGS. 21A and 21B.

Next, as shown in FIG. 22, a resin adhesive sheet 20 including a resin layer 35 and a peeling film 36 is prepared, and the resin layer 35 is stuck to one face of the composite plate 34. The sizes of the resin layer 35 are, for example, 20 mm in X direction, 20 mm in Y direction, and 0.025 mm (25 $\mu$m) in Z direction. The sticking of the resin adhesive sheet 20 is performed as follows, for example. First, an epoxy-based tack resin 35 with a peeling film 36 attached on one surface thereof is layered on a composite plate 34. The layering is performed 200 times by piston-like jig. Next, for example, a pressure of about 1 MPa is applied to the jig, and the layered structure held by the jig is heated at 120° C. for 5 minutes under a reduced pressure condition of 0.1 Torr or less. Thereafter, the pressure is returned to the atmospheric pressure, and the layered structure is heated at 180° C. after releasing the pressurization by the jig. Thus, the epoxy-based tack resin is hardened. Thereafter, the layered structure is cooled to a room temperature, and the peeling film 36 is removed.

In this embodiment, the resin layer 35 is formed on the composite plate 34 by using the resin adhesive sheet 20. Alternatively, a resin layer having a uniform thickness may be formed on one surface of the composite plate 34 by spin coating, screen printing, or other methods.

Next, with reference to FIGS. 23 and 24, a method by which a plurality of columnar piezoelectric elements and a plurality of internal conductive elements extending across the columnar piezoelectric elements in a direction intersecting the longitudinal direction of the columnar piezoelectric elements are formed from a composite plate 34 will be described.

Figure 23:
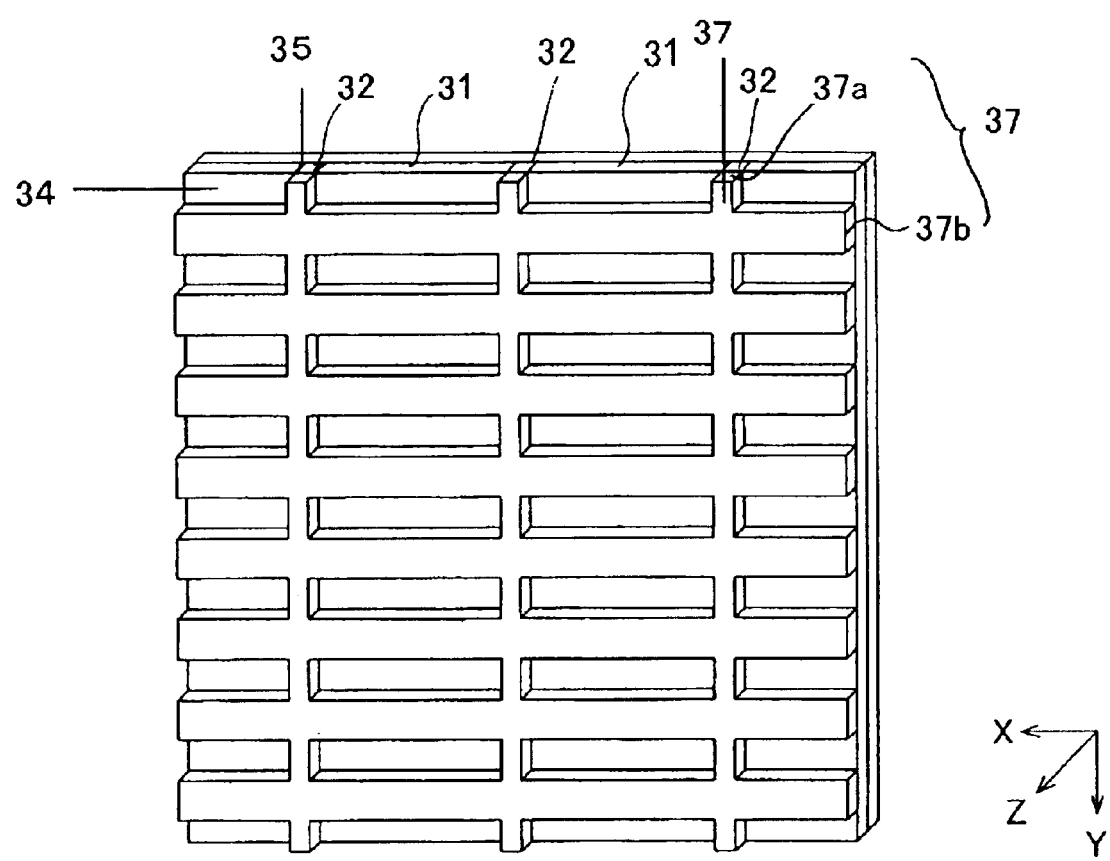
FIG. 23 is a perspective view showing a condition in which a mask pattern is formed on the composite plate of FIG. 22.

As shown in FIG. 23, a working mask 37 is formed on a surface of the composite plate 34 on which the resin layer 35 is not formed. The working mask 37 includes a pattern 37a completely covering an upper portion of the conductive element 32 of the composite plate 34 and a pattern 37b for forming a plurality of columnar piezoelectric elements from the composite plate 34. Widths of the pattern 37b are 0.05 mm (50 $\mu$m), respectively, and intervals of the pattern 37b are also 0.05 mm. The widths of the pattern 37b are not necessarily equal to the intervals thereof.

The working mask 37 is formed in such a manner that, after a photo-sensitive resin sheet is stuck to the composite plate 34, the resin sheet is exposed and developed by using a photo mask. In the photo mask, a light blocking pattern for defining the patterns 37a and 37b is formed. The development and exposure can be performed by known photolithographic techniques. By changing the pattern of the photo mask, shapes and sizes of patterns of the working mask 37 can be arbitrarily set.

Next, to the surface of the composite plate 34 on which the working mask 37 is formed, sand blasting is performed. The sand blasting is the working process by injecting fine particles (particles such as alumina, diamond, or the like) together with compressed air (or fluid such as water), so as to break the object to be worked by means of impact.

By the sand blasting, a soft material such as a resin is not broken, but a hard material such as a ceramic can be selectively broken by brittle fracture. Accordingly, by performing the sand blasting by using the resin working mask 37, a region of the surface of the composite plate 34 which is not covered with the pattern 37b can be selectively cut away, and a cutting groove can be formed in the portion. As the sand blasting progresses, the cutting groove formed in the exposed surface of the composite plate 34 becomes deeper, and eventually the cutting groove reaches the resin layer 35 disposed on the back face side of the composite plate 34. However, similarly to the working mask 37, the resin layer 35 is not broken by the sand blasting, so that the resin layer 35 is hardly worked even if the cutting groove formed in the composite plate 34 reaches the resin layer 35. A portion in which the conductive elements 32 are formed is covered with the pattern 37a, so that the conductive elements 32 are not cut away at all.

Figure 24B:
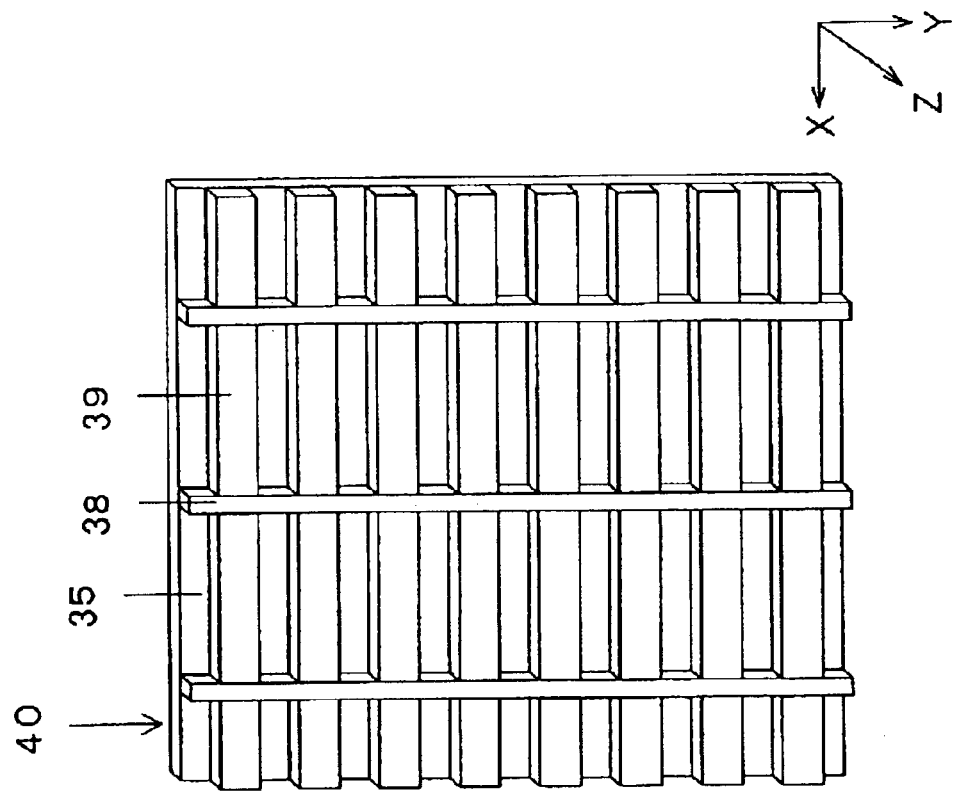
FIGS. 24A and 24B are perspective views illustrating an exemplary process of working the composite plate of FIG. 23 by using the mask pattern, thereby forming a unit composite sheet.
Figure 24A:
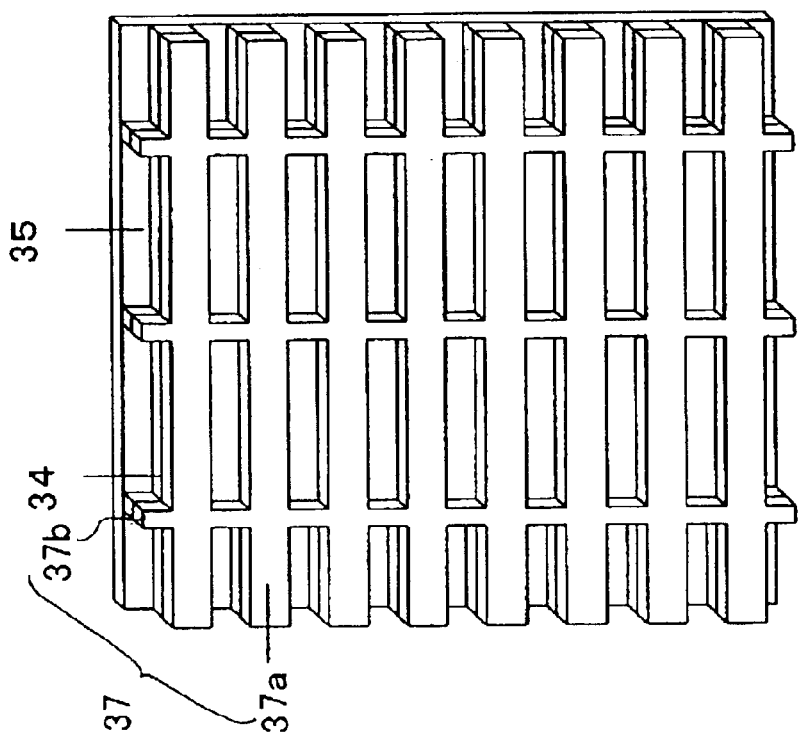

As described above, as shown in FIG. 24A a composite plate 34 in which portions covered with the working mask 37 including the patterns 37a and 37b are left can be obtained. The cutting groove is formed between the patterns 37b, but separated by the pattern 37a. Thereafter, as shown in FIG. 24B, the working mask 37 is peeled off, thereby obtaining a unit composite sheet 40 in which a plurality of columnar piezoelectric elements 39, and a plurality of internal conductive elements 38 extending across the respective columnar piezoelectric elements 39 in a direction intersecting the longitudinal direction of the columnar piezoelectric elements 39, for coupling adjacent columnar piezoelectric elements 39 are formed on the resin layer 35. In FIG. 24B, only eight columnar piezoelectric elements 39 and three internal conductive elements 38 are shown. In actuality, 250 columnar piezoelectric elements 39 and 40 internal conductive elements 38 are formed. In FIG. 24B, the internal conductive elements 38 cross the columnar piezoelectric elements 39 so as to completely divide the columnar piezoelectric elements 39. However, if the internal conductive elements 38 cross the columnar piezoelectric elements 39 so as to be in contact with the respective columnar piezoelectric elements 39, it is possible to electrically transmit and receive a signal from and to the columnar piezoelectric elements 39 to and from the inside. Accordingly, in the specification of this application, the word "cross" includes not only the case where the internal conductive elements 38 cross the columnar piezoelectric elements 38 so as to completely divide them, but also the case where the internal conductive elements 38 cross the columnar piezoelectric elements 39 so as to be in contact with part of the columnar piezoelectric elements 39.

By the above-described sand blasting, a wide surface of the composite plate 34 can be collectively worked at high speed with high precision. However, the sand blasting is an inappropriate cutting method in the case where a ratio (aspect ratio) of a depth to a width of an opening portion of the working mask 37 is large. However, in this embodiment, a depth direction of the cutting groove formed by the sand blasting is not in parallel to, but perpendicular to the longitudinal direction of the columnar piezoelectric elements 39 to be formed. When a depth of a cutting groove formed by the working is D, and a width of the cutting groove is W, a ratio D/W in this embodiment is about 1. The ratio D/W defines the aspect ratio of the cutting groove. Although depending on the material of the piezoelectric element, it is preferred that the ratio D/W be set in the range of about 1 to 2. In the case where minute working is particularly required, it is desired that the ratio D/W be set to be 1 or less.

In this embodiment, as described above, the working of the piezoelectric element is performed in the direction perpendicular to the longitudinal direction (Y direction) of the columnar piezoelectric elements 39. Therefore, even if the "aspect ratio of the columnar piezoelectric element" has a value exceeding 5, the aspect ratio of the cutting groove can be reduced. For this reason, a columnar piezoelectric element having an aspect ratio which is impossible by the prior art can be easily formed.

Figure 25:
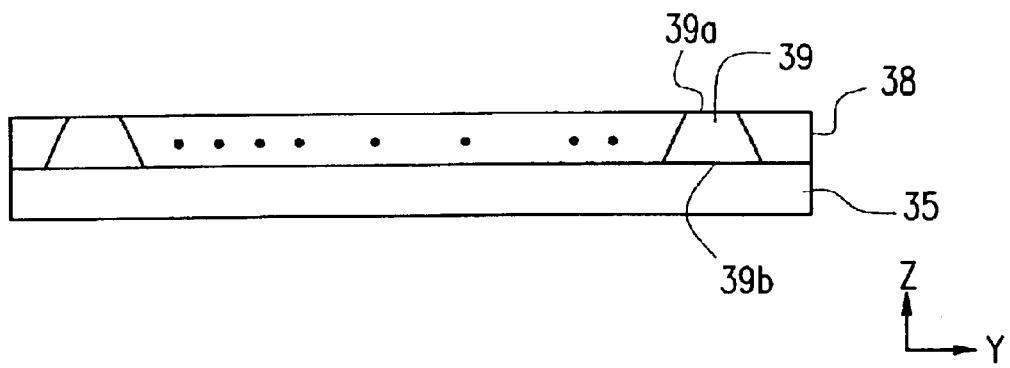
FIG. 25 is a sectional view of the unit composite sheet of FIGS. 24A and 24B.

FIG. 25 shows a section perpendicular to the longitudinal direction of the columnar piezoelectric element 39. As is seen from FIG. 25, the section of the columnar piezoelectric element 39 obtained in this embodiment is asymmetric for the rotation of 180 degrees with respect to a center axis of the columnar piezoelectric element 39. Specifically, the section of the columnar piezoelectric element 39 is substantially a trapezoid. A width in an upper face 39a of the columnar piezoelectric element 39 is about 40 to 45 $\mu$m, and a width of a lower face 39b is about 55 to 60 $\mu$m. The reason why tapers are formed on side faces is that side etching occurs by the sand blasting.

Figure 26:
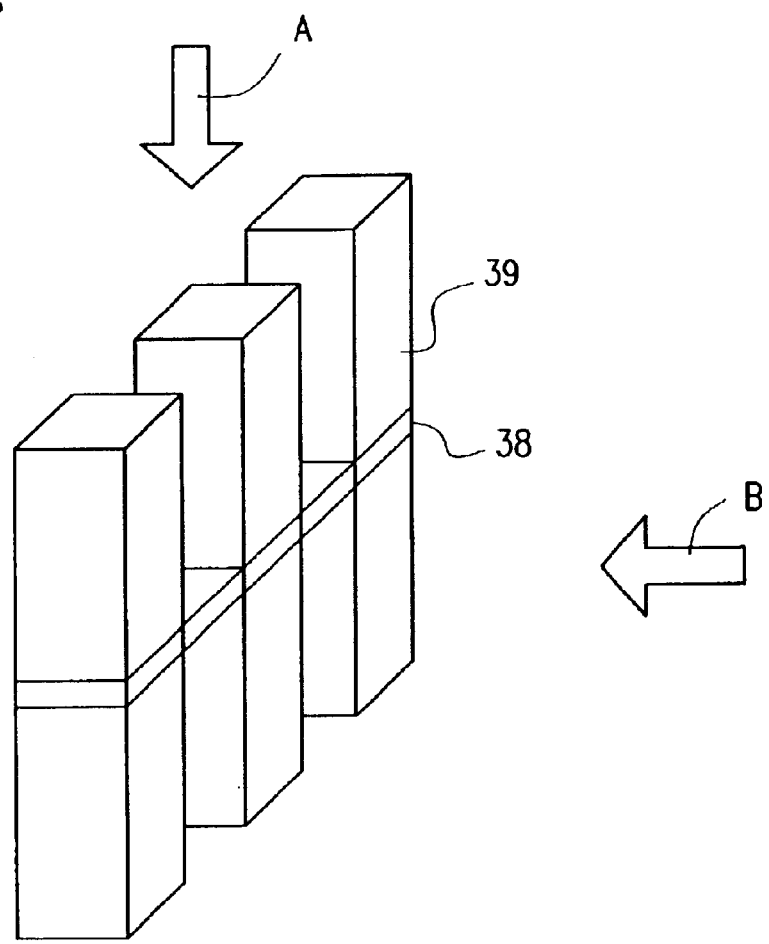
FIG. 26 is a perspective view showing a working direction for obtaining columnar piezoelectric elements.

As described above, it is difficult to form a deep hole by the sand blasting. Accordingly, as shown in FIG. 26, if the columnar piezoelectric element 39 is prepared by working the piezoelectric element in a direction indicated by arrow A, it is extremely difficult to form a columnar piezoelectric element having an aspect ratio of 5 or more. Moreover, since there exists the internal conductive element 38 crossing the columnar piezoelectric element 39 and coupling the adjacent columnar piezoelectric elements 39, it is impossible to cut away the piezoelectric element without cutting nor removing the internal conductive element 38 and to form columnar piezoelectric elements. However, according to the fabrication method of this embodiment, the piezoelectric element is worked in a direction indicated by arrow B, so that the working depth is shallow. Thus, the high-speed property and collective working possibility of the sand blasting can be taken advantage of. Moreover, the columnar piezoelectric elements 39 can be formed from the piezoelectric element while the internal conductive elements 38 disposed for coupling the adjacent piezoelectric elements 39 are left.

The cutting method is not limited to the sand blasting. If the method can work a composite plate 34 into columnar piezoelectric elements, any cutting method such as dicing, ultrasonic working, or laser working may arbitrarily be employed.

By the above-described method, 200 unit composite sheets 40 are prepared. The time required for working the 200 composite sheets having the above-mentioned sizes is about 2 hours or less which is very short. Accordingly, the production time for the unit composite sheets can be shortened, and the cost can be reduced.

Figure 27:
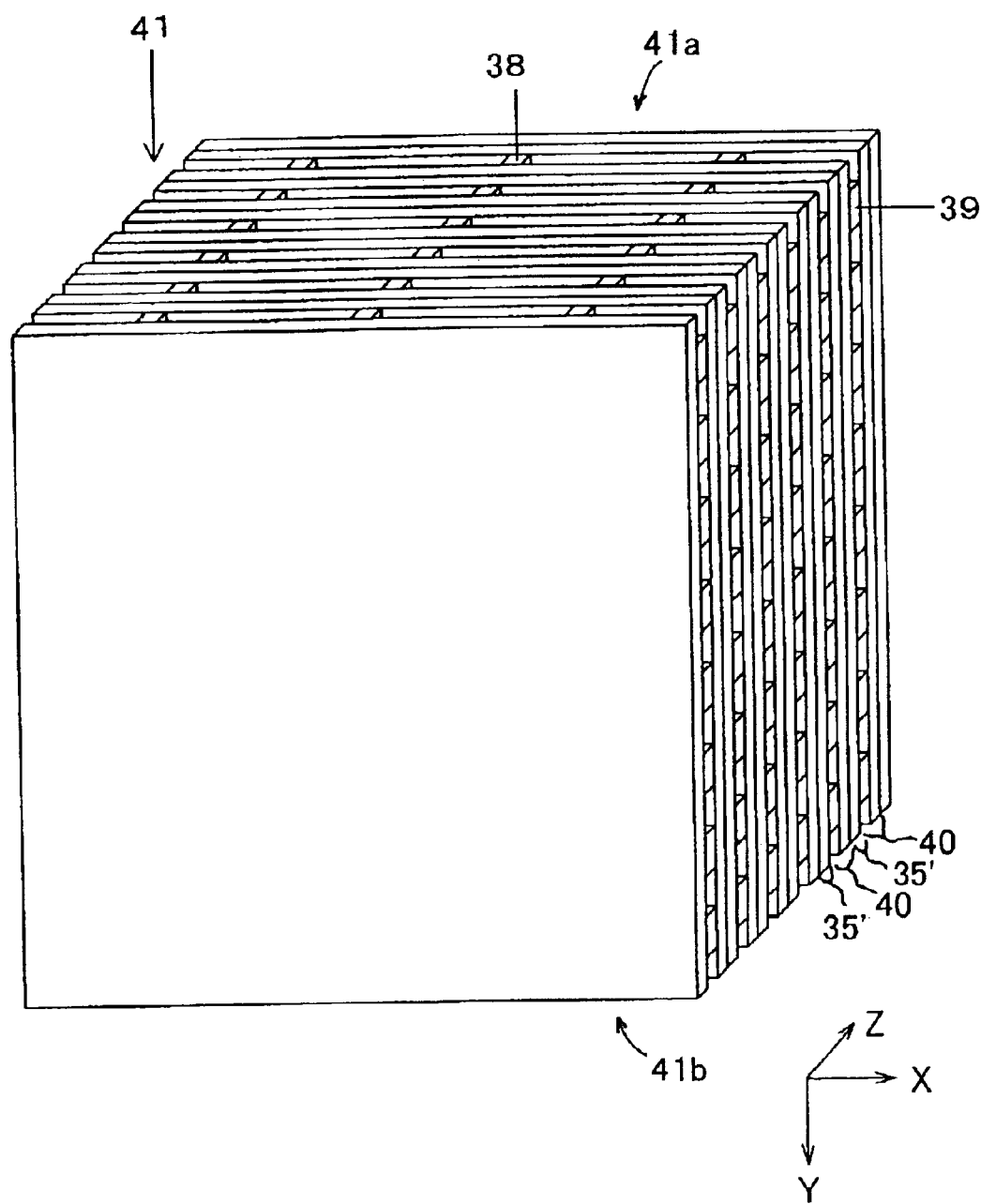
FIG. 27 is a perspective view showing the composite piezoelectric element of Embodiment 11.

Next, a plurality of unit composite sheets 40 are layered and integrated. As shown in FIG. 27, the unit composite sheets 40 are layered with a resin layer 35' which is different from the resin layer 35 constituting the unit composite sheet 40 interposed therebetween. In FIG. 27, for simplicity, only six unit composite sheets 40 are shown. In actuality, 200 unit composite sheets 40 are layered. In the uppermost portion, one epoxy-based tack resin sheet having sizes of 20 mm in X direction, 20 mm in Y direction, and 0.05 mm in Z direction is disposed.

When the 200 unit composite sheets 40 are layered, the alignment may be performed in such a manner that the positions of the internal conductive elements 38 align in the X direction. That is, if there is no displacement in the X direction, some displacement in the Y direction does not cause a serious problem. Accordingly, expensive equipment for alignment is not required, and the time required for alignment is short. Thus, the cost can be reduced.

The layered structure is left for 10 minutes at 120° C. and 0.1 Torr or less while applying a pressure of 0.1 MPa. Thereafter, the pressure is returned to the atmospheric pressure, and the layered structure is heated at 180° C. for 1 hour without applying any pressure. Thus, the resin layers 35 and 35' are hardened, so that the layered structure is integrated. As a result, a composite piezoelectric element 41 as the layered structure of composite sheets can be obtained. The obtained composite piezoelectric element 41 has a cubic shape having sizes of 20 mm in X direction, 20 mm in Y direction, and 20 mm in Z direction. In the composite piezoelectric element 41, 40,000 columnar piezoelectric elements 39 extending in the X direction in the figure, and 8,000 internal conductive elements 38 extending in the Y direction are formed.

In the composite piezoelectric element 41, the columnar piezoelectric elements 39 are arranged in matrix constituting rows (Y direction) and columns (Z direction) in a plane (Y-Z plane) perpendicular to the longitudinal direction (X direction) thereof. The respective columns of the columnar piezoelectric elements 39 are isolated by the resin layers 35 and 35'. As described with reference to FIG. 25, the section (Y-Z plane) perpendicular to the longitudinal direction (X direction) of each columnar piezoelectric element 39 is a trapezoid.

In each column of the columnar piezoelectric elements 39, the internal conductive elements 38 extend across the respective columnar piezoelectric elements 39 in the row direction of the columnar piezoelectric elements 39 so as to couple the columnar piezoelectric elements 39 arranged in the row direction. The columnar piezoelectric elements 39 separated by crossing the internal conductive elements 38 are in contact with the internal conductive elements 38 and electrically connected thereto. Accordingly, the internal conductive elements 38 electrically connects the plurality of columnar piezoelectric elements 39 in each column. In addition, in two end faces 11*a* and 11*b* of the composite piezoelectric element 41, end portions of each internal conductive element 38 are exposed. Accordingly, the respective columnar piezoelectric elements 39 can be completely and easily connected to an external circuit via the internal conductive elements 38.

The unit composite sheets 40 are layered in the thickness direction (Z direction). Among the plurality of columnar piezoelectric elements 39 two-dimensionally arranged along the Y-X plane, the respective columns arranged in the Y direction are mutually isolated by the resin layer. With such a layered configuration, interference hardly occurs between the columnar piezoelectric elements isolated by the resin layer.

On the other hand, in each unit composite sheet 40 of this embodiment, a gap between the columnar piezoelectric elements 39 is not filled with a resin, but a space is formed. After the composite piezoelectric element 41 is completed, a resin may be poured into the space, or the space may be left so that the space between the columnar piezoelectric elements 39 is filled with the air. When the space is filled with the air, accoustic leakage from the columnar piezoelectric elements 39 can be advantageously reduced.

The direct handling or arrangement of the columnar piezoelectric elements or internal conductive elements are not required. In addition, the precise alignment for arranging the columnar piezoelectric elements in matrix is not required. Accordingly as compared with the prior-art fabrication method, the production yield is good in a short time, and the fabrication can be performed by using inexpensive fabrication equipment.

(Embodiment 12)

Hereinafter, a twelfth embodiment of the composite piezoelectric element according to the present invention will be described.

Figure 28:
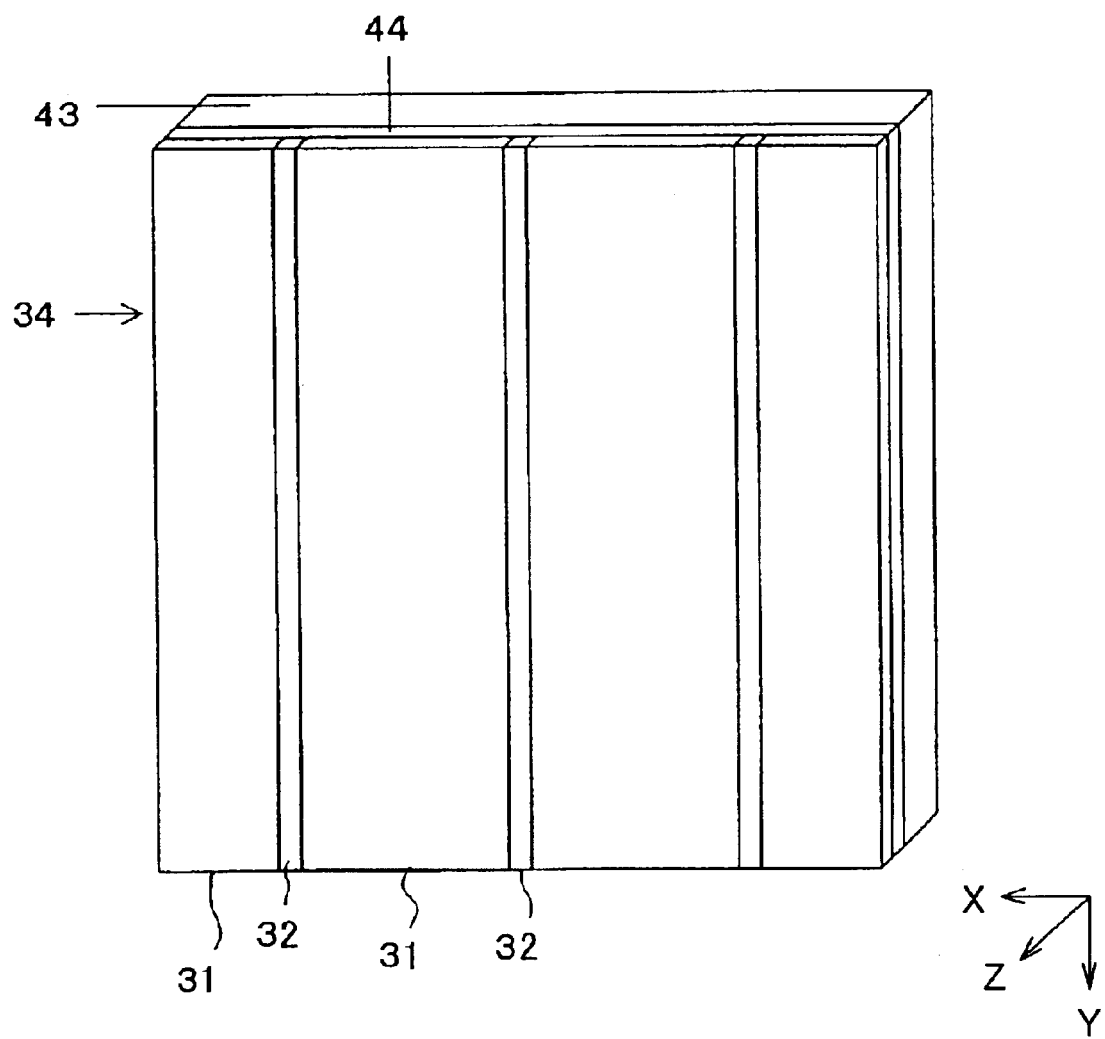
FIG. 28 is a perspective view illustrating an exemplary process of preparing a composite plate of the composite piezoelectric element in Embodiment 12 of the present invention.

Similarly to Embodiment 11, as shown in FIG. 28, 200 sheets of composite plates 34 in which piezoelectric elements 31 and conductive elements 32 extending in one direction are alternately layered are prepared. The composite plate 34 is temporarily fixed onto a substrate 43 such as a glass substrate by means of an adhesive sheet 44. As the adhesive sheet 44, a thermally peeling sheet is employed in this embodiment. The adhesive sheet 44 is not limited to the thermally peeling sheet, but may be an adhesive sheet which can hold the composite plate 34 and from which the composite plate 34 is not peeled during the cuffing process, but is peeled by means of any action after the process. For example, a peeling sheet by UV light irradiation can be used as the adhesive sheet 44.

Figure 29:
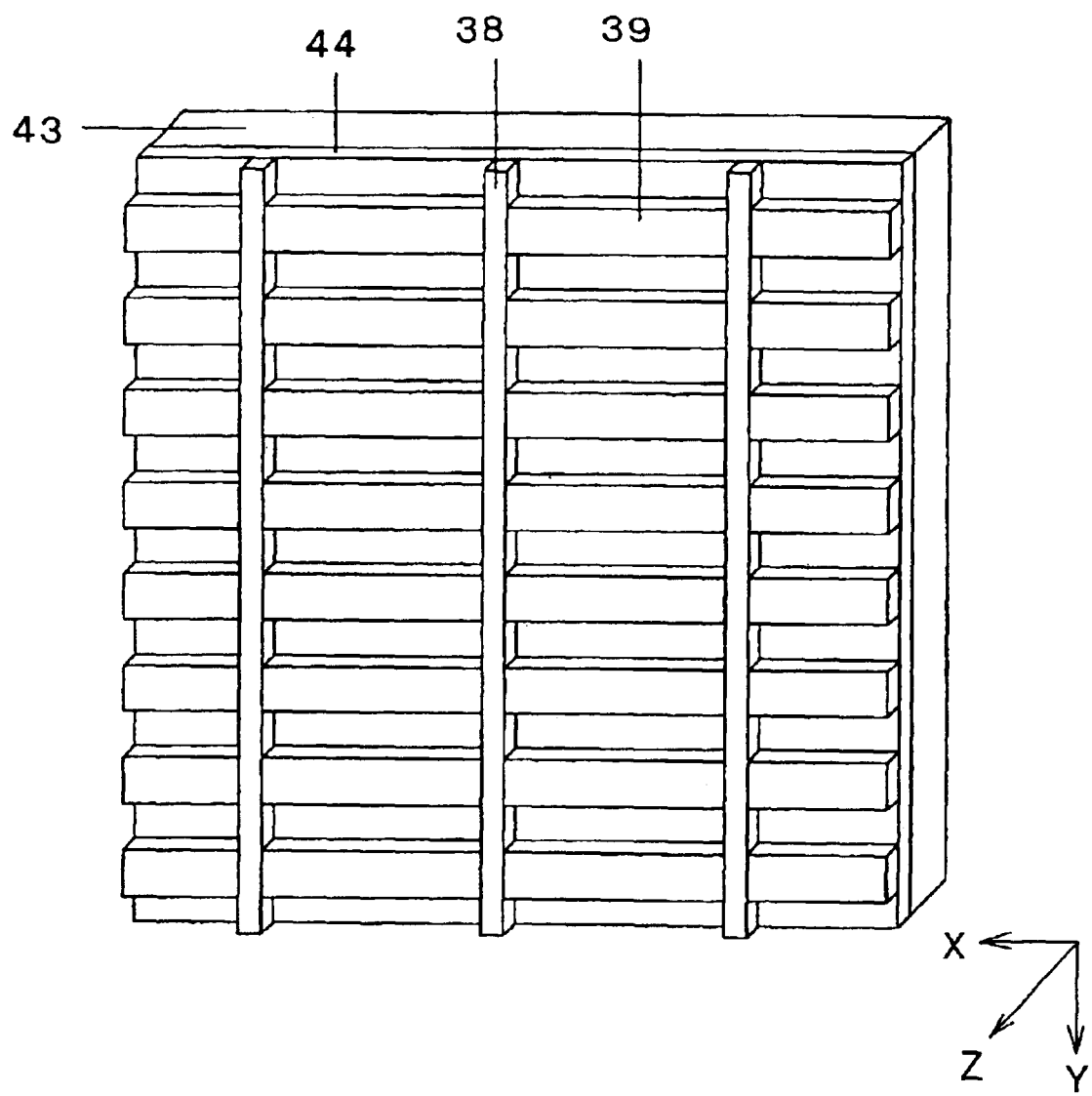
FIG. 29 is a perspective view showing a condition in which a mask pattern is formed on the composite plate of FIG. 28.

Next, the composite plate 34 is worked, so as to form a glass substrate 43 in which a plurality of columnar piezoelectric elements 39 and a plurality of internal conductive elements 38 extending across the plurality of columnar piezoelectric elements 39 in a substantially perpendicular manner, and coupling the columnar piezoelectric elements 39 are held by the adhesive sheet 44, as shown in FIG. 29. Specifically, by the same method as that described with reference to FIGS. 22 to 24, a working mask is formed, and then sand blasting is performed.

Figure 30B:
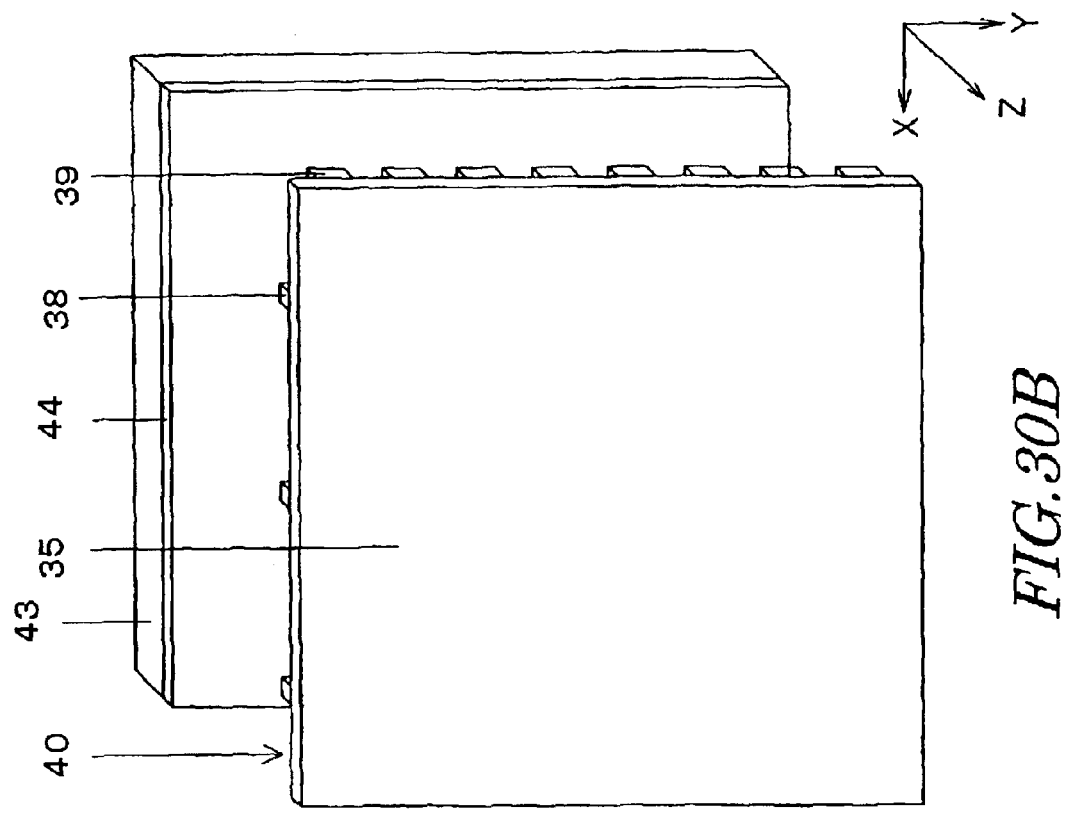
FIGS. 30A and 30B are perspective views illustrating an exemplary process of transferring columnar piezoelectric elements and internal conductive elements onto a resin layer.
Figure 30A:
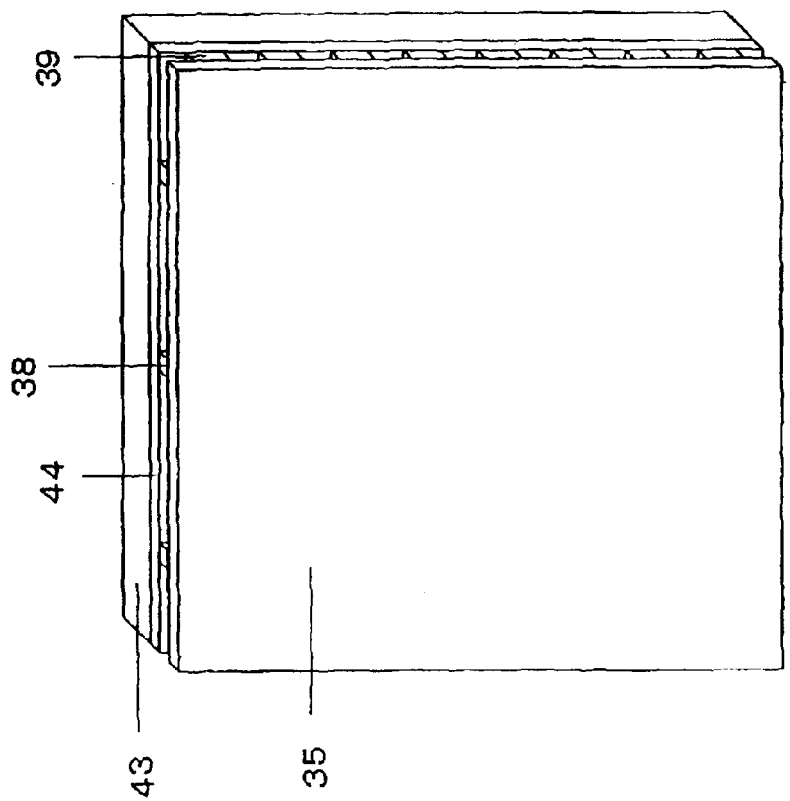

Next, as shown in FIG. 30A, the columnar piezoelectric elements 39 and the internal conductive elements 38 for coupling them which are temporarily fixed to the substrate 43 are disposed so as to face a sheet-like resin layer 35. As the resin layer 35, an epoxy-based tack resin sheet having a thickness of about 0.050 mm can be suitably used.

In a condition where the resin layer 35 is in contact with the columnar piezoelectric elements 39 and the internal conductive elements 38, a pressure of about 0.1 MPa, for example, is applied to the resin layer 35 and the substrate 43, and heating is performed at 120° C. for 10 minutes. By the pressurizing and heating process, the resin layer 35, and the columnar piezoelectric elements 39 and the internal conductive elements 38 are caused to adhere, and the thermally peeling effect of the adhesive sheet 44 is exhibited. Accordingly, as shown in FIG. 30B, the columnar piezoelectric elements 39 and the internal conductive elements 38 are peeled from the adhesive sheet 44, and transferred onto the resin layer 35.

In this embodiment, the epoxy-based tack resin sheet is used as the resin layer 35. The resin layer 35 may be another type of adhesive sheet, if the same effects can be attained.

Alternatively, a liquid resin or the like is applied to the columnar piezoelectric elements 39 and the internal conductive elements 38 by printing or other methods, and a resin layer is formed. Thereafter, the resin is hardened, and then peeled off.

As a result, 200 columnar piezoelectric elements 39 coupled by 40 internal conductive elements 38 are moved onto the resin layer 35 by the above-described transferring process while maintaining the arrangement on the substrate 44 with high precision. Thus, a unit composite sheet is produced.

Figure 31:
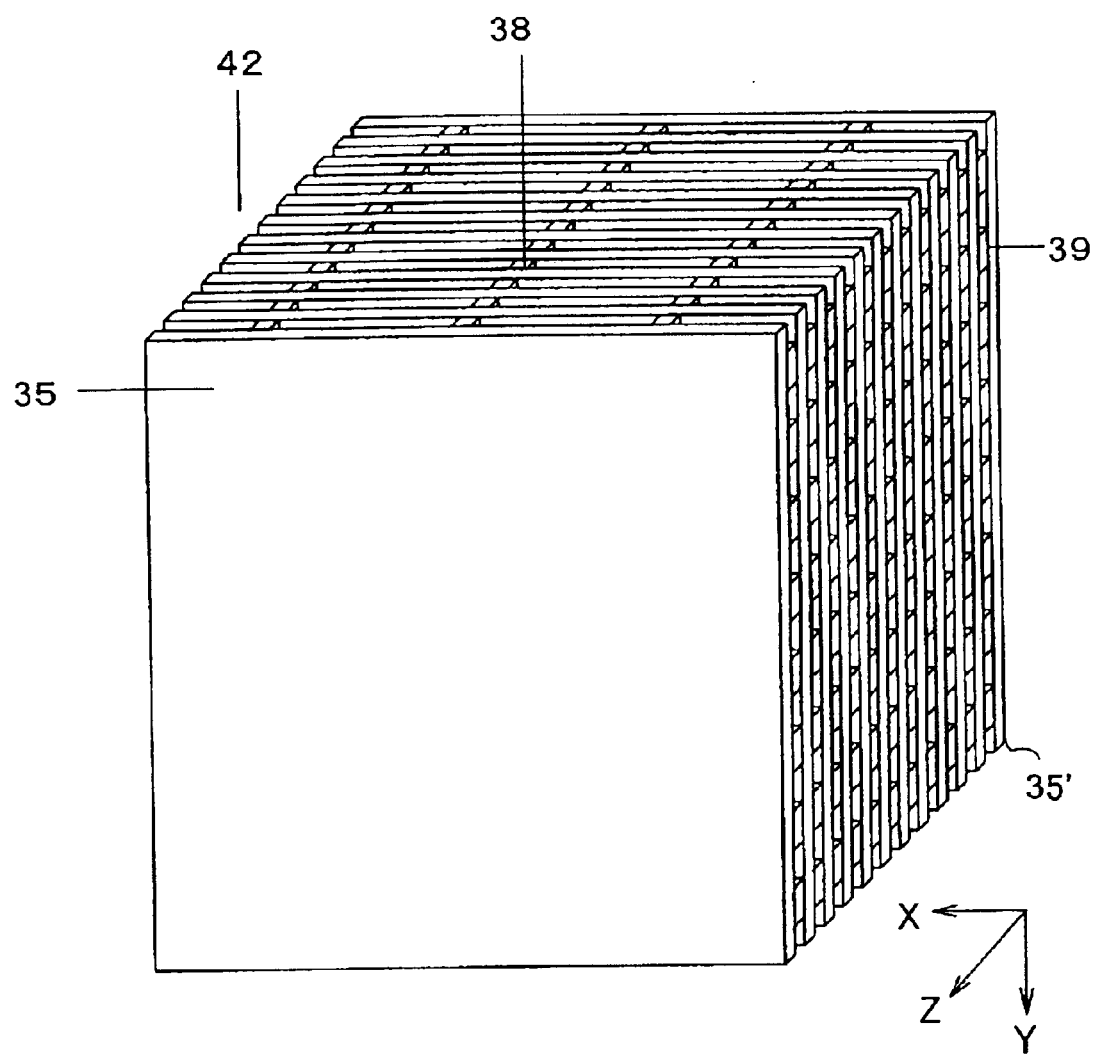
FIG. 31 is a perspective view showing the composite piezoelectric element of Embodiment 12.

After 200 sheets of unit composite sheets are prepared and layered as shown in FIG. 31, a resin layer 35' having sizes of 20 mm in X direction, 20 mm in Y direction, and 0.050 mm in Z direction is disposed on the uppermost portion. Next, for example, in a reduced-pressure atmosphere of 120° C. and 0.1 Torr or less, the layered structure is held for 10 minutes while a pressure of 0.1 MPa is applied. Then, after the atmosphere is returned to the atmospheric condition, and the pressure is released, the layered structure is held at 180° C. for 1 hour. In this way, the resin layer 35' is hardened, and the layered structure is integrated, thereby forming a composite piezoelectric element 42.

The resin layer 35 used for the transferring in this embodiment is only subjected to the heat history of 120° C. or less during the transferring from the thermally peeling sheet, so that the adhesive strength thereof is maintained after the transferring. Therefore, when the layered structure is to be integrated, it is unnecessary to interpose an additional adhesive sheet. Accordingly, the time required for integrating the layered structure is shortened as compared with the case of Embodiment 11, and the cost can be further reduced.

The integrated composite piezoelectric element 42 has a cubic shape having sizes of 20 mm in X direction, 20 mm in Y direction, and 20 mm in Z direction. In this composite piezoelectric element, 8,000 internal conductive elements 38 and 40,000 columnar piezoelectric elements 39 are held in parallel by the resin layer 35.

(Embodiment 13)

This embodiment describes a method of fabricating a composite piezoelectric element 41' including a layer of internal conductive elements 38 arranged in column direction of the columnar piezoelectric elements 39 obtained by cutting the composite piezoelectric elements 41 and 42 obtained in Embodiments 11 and 12 in parallel to the internal conductive elements 38 by a dicing machine, as shown in FIG. 32.

Figure 32B:
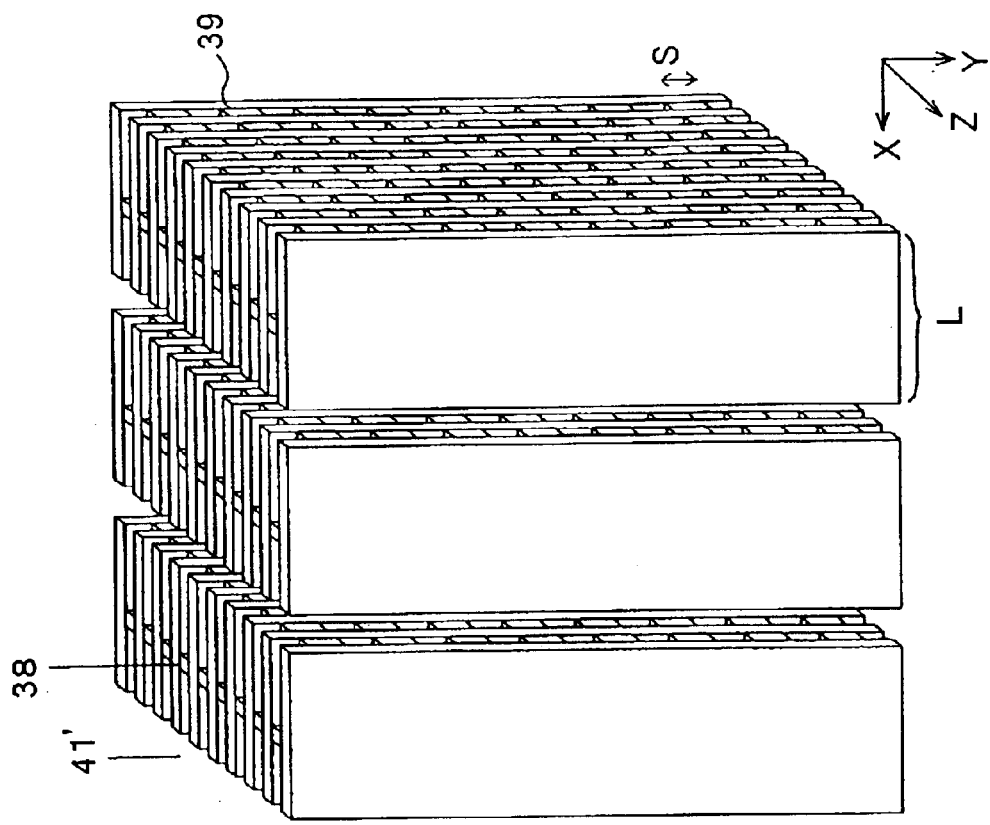
FIGS. 32A and 32B are perspective views illustrating an exemplary fabrication process of a composite plate of Embodiment 13.
Figure 32A:
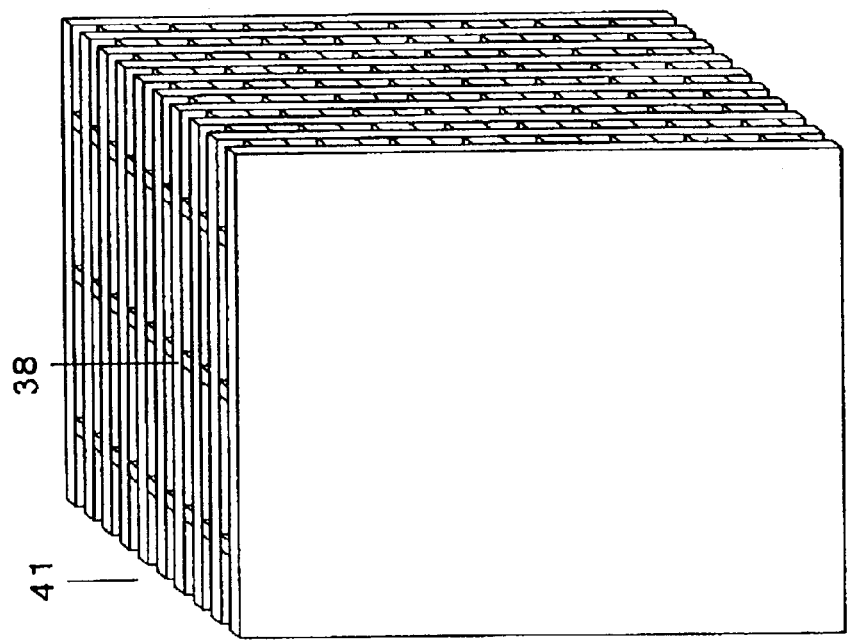

As shown in FIGS. 32A and 32B, cutting is performed between columns of internal conductive elements 38 arranged in the X direction at pitches of 0.5 mm with a cutting margin of 0.1 mm, so as to obtain a composite piezoelectric element 41' having sizes of 20 mm in X direction, 20 mm in Y direction and 0.4 mm in Z direction and including a layer of internal conductive elements 38. Electrodes are formed on both cut faces, and polarization process is performed by applying a voltage across the internal conductive element 38 and the electrodes on both cut faces, thereby exhibiting piezoelectric characteristics in the columnar piezoelectric elements 39.

In the composite piezoelectric element 41' of this embodiment, the ratio (aspect ratio) of a length L in a longitudinal direction of each columnar piezoelectric element to a size S of a section perpendicular to the longitudinal direction is 8 (0.4 mm/0.05 mm). Thus, the composite piezoelectric element 41' of this embodiment satisfies the condition of the aspect ratio of 5 or more with which the performances are the best in the 1-3 type composite piezoelectric element.

In each of the columnar piezoelectric elements 39, the internal conductive element 38 is disposed in a substantially middle position in the longitudinal direction. This configuration is equivalent to a condition where two composite piezoelectric elements having a half of the thickness are connected in parallel. Thus, when a driving signal is applied to the internal conductive element 38, the capacity of the composite piezoelectric element is increased by four times as compared with the initial composite piezoelectric element. As a result, as compared with the case where the internal conductive element 38 is not provided, an electric impedance is about ¼, so that a composite piezoelectric element with a larger aspect ratio and reduced electric impedance can be realized.

In this embodiment, a composite piezoelectric element having a layer of internal conductive elements is fabricated. By changing the cutting position, it is possible to form a composite piezoelectric element having the arbitrary number of internal electrodes. As the cutting method, another working machine such as a wire saw, a laser, or the like may be used, instead of the dicing.

(Embodiment 14)

Hereinafter, a fourteenth embodiment of the composite piezoelectric element according to the present invention will be described.

In the piezoelectric elements 41 and 42 in the eleventh and twelfth embodiments, as shown in FIG. 27, for example, a gap portion exists between the columnar piezoelectric elements 39 arranged on each unit composite sheet, and the gap portion is filled with air. Since the air is dielectric, it is unnecessary to fill the gap portion with another dielectric material, in order to function as a composite piezoelectric element. However, if the gap portion is embedded with a dielectric material which can be hardened, and the material is hardened, the mechanical strength of the composite piezoelectric element can be increased. In addition, it is preferred that the oscillation mode of the composite piezoelectric elements 41 and 42 be appropriately adjusted.

For this purpose, in this embodiment, when a plurality of composite sheets are layered and integrated in such a manner that columnar piezoelectric elements 39 are disposed between resin layers 35, the pressure to be applied to the lamination is increased. Specifically, in an atmosphere of 120° C. and 0.1 Torr or less, a pressure of about 1 MPa is applied to the layered structure, and then the layered structure is left for 10 minutes. Thereafter, the pressure is returned to be atmospheric, and the layered structure is heated at 180° C. for 1 hour while applying the pressure. If the bonding and integration are performed while applying a relatively high pressure, an epoxy-based tack resin sheet inserted between unit composite sheets for the layering and a resin layer which is not yet hardened are caused to flow, so as to embed gaps between the columnar piezoelectric elements 39. As a result, a composite piezoelectric element 41" in which all of the gaps are filled with a resin 5" as shown in FIG. 33 is obtained.

In this embodiment, the gap portions are filled with the resin as described above, so that the mechanical strength as the composite piezoelectric element can be increased. In addition, breakage in the processes such as cutting hardly occurs, and the production yield is increased. As a result, the production cost can be reduced. In this embodiment, electroless plating can used for forming electrodes, so that the electrodes can be collectively formed for a large number of composite piezoelectric elements. Thus, the lower cost can be realized.

(Embodiment 15)

Hereinafter a fifteenth embodiment of the composite piezoelectric element according to the present invention will be described.

In this embodiment, a composite plate used for a unit composite sheet is produced in such a manner that a groove is formed in a plate-like piezoelectric element and the groove is filled with a conductive element.

Figure 34A:
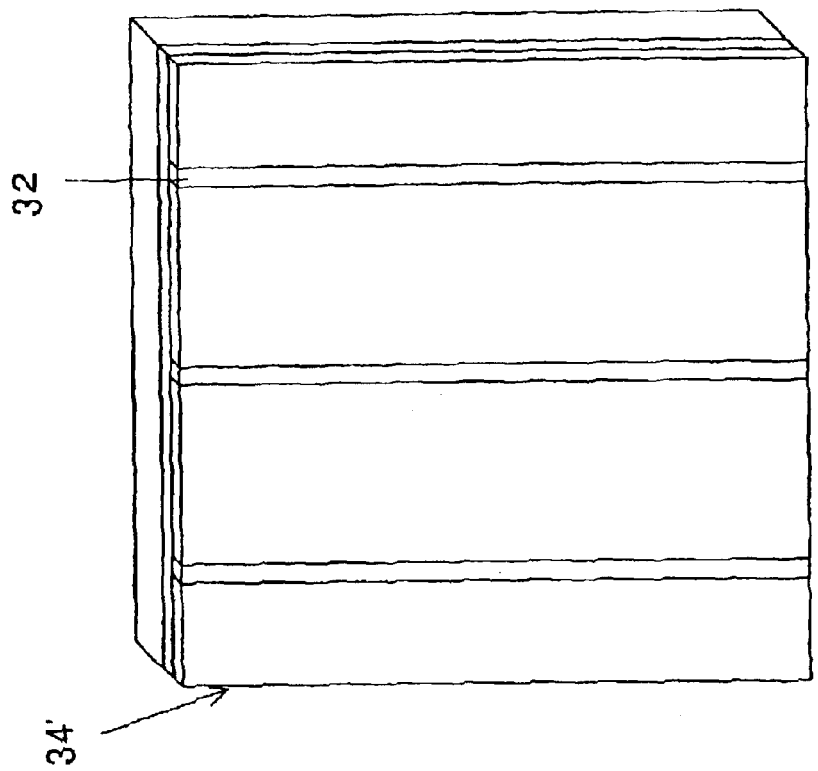
FIGS. 34A and 34B are perspective views illustrating an exemplary process of preparing a composite plate of the composite piezoelectric element in Embodiment 15 of the present invention.
Figure 34B:
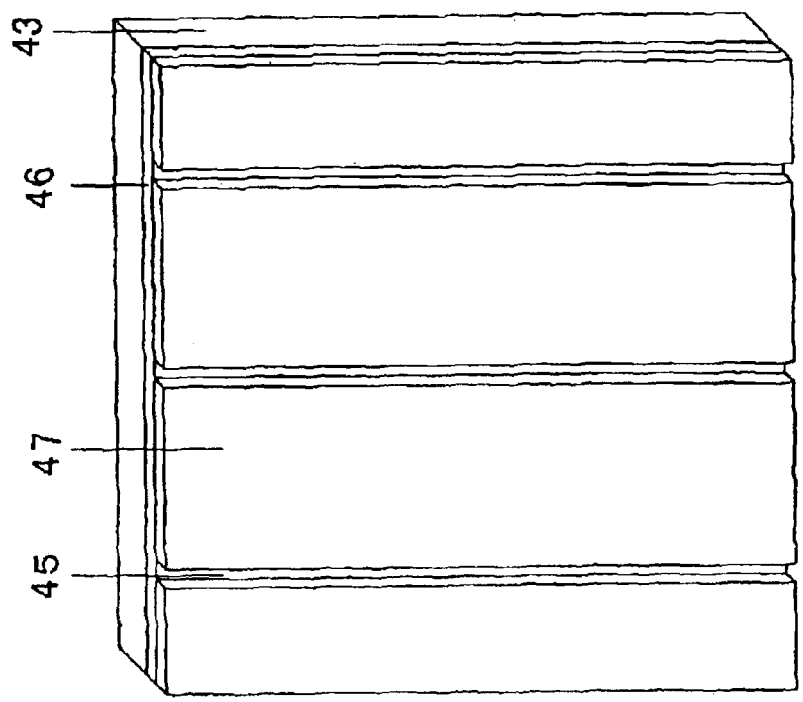

As shown in FIG. 34A, a plate-like piezoelectric element 47 having sizes of 20 mm in X direction, 20 mm in Y direction, and 0.05 mm in Z direction is fixed on a substrate 43 such as a glass substrate via a thermally peeling sheet 46 stuck onto the substrate 43. In the plate-like piezoelectric element 47, grooves 45 extending in the Y direction at pitches of 0.5 mm (width: about 0.03 mm) are formed. Then, as shown in FIG. 34B, the thus-formed grooves 45 are filled with a conductive element 32.

In this embodiment, as the plate-like piezoelectric element 47, a piezoelectric ceramic formed by sintering a ceramic green sheet was used. The ceramic green sheet is a sheet which is constituted by ceramic powder and a resin and is not yet subjected to the sintering. The ceramic green sheet is prepared by a method such as doctor blading is suitably used in the case where a piezoelectric element having a thin layer or layered configuration (a laminated substrate or the like) is formed. The method of producing a plate-like piezoelectric element from a ceramic green sheet is advantageous in that the cost is low because the process steps such as cutting and lapping are not required. Alternatively, if a method can produce a thin ceramic at low cost, such as extrusion molding, a piezoelectric ceramic produced by a method other than the doctor blading may be used.

As a method of forming a groove 45 which is filled with a conductive element, a dicing machine is used in this embodiment. Specifically, by using a blade having a width of 0.025 mm, the plate-like piezoelectric element 47 is completely cut, thereby forming a groove 45 having a depth of 0.05 mm and a width of 0.03 mm. The grooves 45 are formed at relatively wide intervals. In this embodiment, 40 grooves 45 are formed at pitches of 0.5 mm. Therefore, even by the cutting method in which grooves are formed one by one, such as dicing, the required time is short, and the cost for the working is low.

In the case of the dicing, the intervals and the like of the grooves which are filled with the conductive element can be easily adjusted only by changing a grinding program. For this reason, a pattern of conductive element for the intended use can be formed, and the electric impedance of the composite piezoelectric element can be adjusted.

As methods of forming the grooves 45, other cutting methods such as sand blasting, laser working, etching can be selected depending on the production quantity, the production cost, the required size precision, and the like.

As the conductive element in this embodiment, silver paste in which silver particles are dispersed in a resin is used. A silver paste defoamed in vacuum is rubbed in the plate-like piezoelectric element 47 in which the grooves 45 are formed by means of a rubber squeegee, and left at 80° C. for 1 hour for hardening. By this process, the silver paste which is rubbed in only embeds the grooves 45, and is fixed therein.

The conductive element is not limited to the silver paste. Alternatively, a paste including a material having conductivity such as gold, platinum, and nickel can be used. Among the metals, an optimum material may be selected in view of the required cost and conductivity.

In this embodiment, the thermally peeling sheet 46 of resin is used for temporarily fixing the plate-like piezoelectric element 47 on the substrate 43, so that it is not appropriate to use a glass paste which requires high temperature processing. However, if as the method of temporarily fixing the plate-like piezoelectric element 47 on the substrate 32, a method of adsorbing a porous ceramic of higher heat resistance in vacuum, or the like is used, for example, a paste including glass can be used. The paste including glass is required to be subjected to heat treatment at about 500° C., but the adhesion strength with the piezoelectric ceramic is large. Accordingly, if the paste including glass is used for forming the conductive element, a composite plate with high reliability can be produced.

The grooves 45 formed by dicing machine are filled with the silver paste, and the silver paste is hardened. Then, the composite plate is heated at 120° C. for 10 minutes, thereby peeling off the thermally peeling sheet 46 from a composite plate 34'. Thereafter, as described in Embodiment 11, the composite plate 34' is subjected to the sand blasting, in order to form a columnar piezoelectric pattern. If a composite piezoelectric element is produced as in Embodiment 12, the thermally peeling sheet 43 is not peeled off from the composite plate 34', but the sand blasting may be performed for the composite plate 34' with the thermally peeling sheet 43. In the case where the conductive element formed in the grooves 45 sufficiently includes the resin component, a mask pattern for covering the conductive element is not required for the sand blasting for the composite plate 34'. Since the conductive element includes the resin component, the hardness of the conductive element is decreased, and brittle fracture hardly occurs.

In this embodiment, the plate-like piezoelectric element 47 is completely cut by the grooves 45. Alternatively, a groove is formed up to a middle position in the thickness direction of the plate-like piezoelectric element 47, and the groove is filled with a conductive element. In this case, a groove 45 reaching about 80% of the thickness of the plate-like piezoelectric element 47 is disposed, and the groove is filled with the conductive element, so that substantially the same performances as those in the case where the plate-like piezoelectric element 47 is completely cut can be obtained. In such a case, the plate-like piezoelectric element 47 is not separated after the formation of the grooves 45, so that it is unnecessary to temporarily fix the plate-like piezoelectric element 47 to a thermally peeling sheet or the like. Accordingly, the grooves 45 can be filled with the above-mentioned metal paste including glass, and a composite plate with higher reliability can be produced.

As described above, according to the present invention, an inexpensive ceramic thin plate formed by doctor blading, or the like is used, and grooves are formed in this thin plate, and are filled with a conductive element. Thus, as compared with the case where composite plates are formed from a large-size block by using process steps such as cutting or lapping, this embodiment can produce a composite plate at a lower const. In addition, the intervals of the grooves which are filled with a conductive element can be easily changed, so that various kinds of composite piezoelectric elements can be produced at a lower cost.

Alternatively, a production method by which a pattern of conductive element is formed on a surface of the plate-like piezoelectric element or on a surface of a resin sheet without forming any grooves in the plate-like piezoelectric element may be adopted. Hereinafter, with reference to FIGS. 43A to 43F, such an example will be described.

Figure 43A:
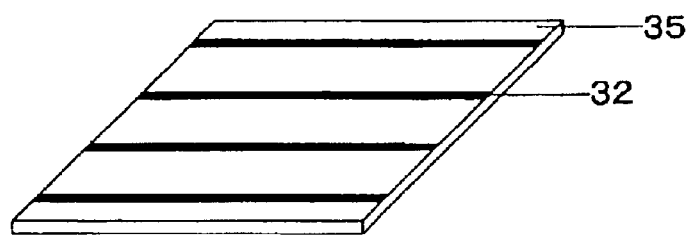
FIGS. 43A to 43F are perspective views illustrating a process of another example in the composite piezoelectric element of Embodiment 15 in the present invention.
Figure 43B:
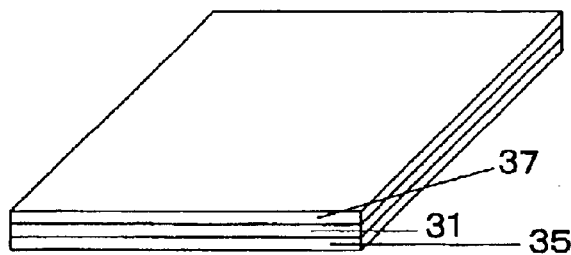

First, as shown in FIG. 43A, a plurality of linear internal conductive elements 32 are formed on a resin layer 35. Next, as shown in FIG. 43B, after the resin layer 35 and a plate-like piezoelectric element 31 are stuck to each other, a working mask 37 is formed on the plate-like piezoelectric element 31.

Figure 43C:
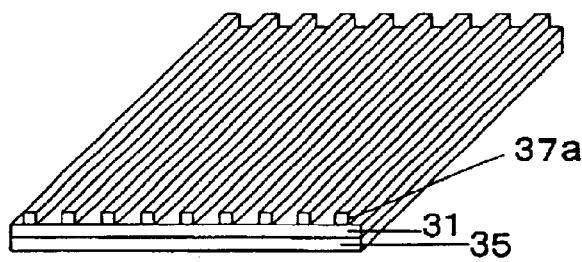
Figure 43D:
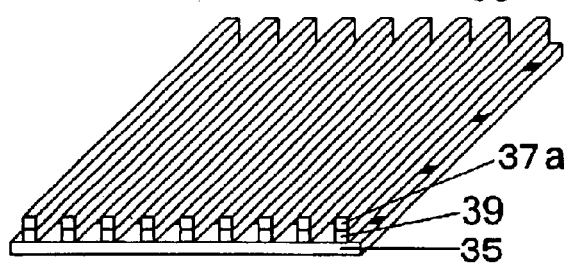

Next, as shown in FIG. 43C, a pattern 37a is formed from the working mask 37, and then the plate-like piezoelectric element 31 is worked by sand blasting. At this time, as shown in FIG. 43D, a region of the plate-like piezoelectric element which is not covered with the pattern 37a is selectively cut off, thereby forming a plurality of columnar piezoelectric elements 39 from the plate-like piezoelectric element 31. The columnar piezoelectric elements 39 cross an internal conductive element 32.

Figure 43E:
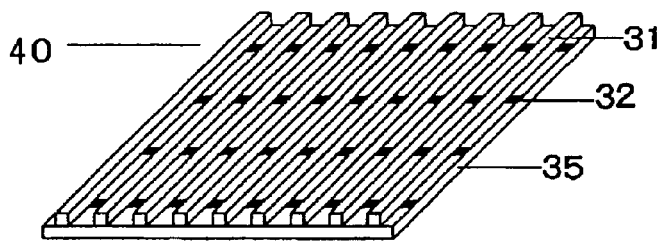
Figure 43F:
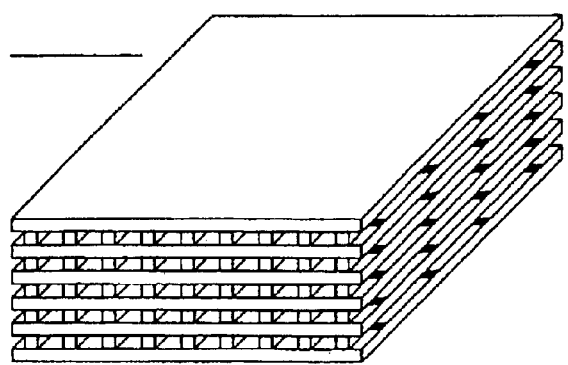

When the working pattern 37a is removed, a unit composite sheet 40 shown in FIG. 43E is completed. A plurality of unit composite sheets 40 are layered, so as to obtain a layered structure 33 shown in FIG. 43F.

According to the example shown in FIGS. 43A to 43F, one side face of each columnar piezoelectric element 39 is in contact with the internal conductive element 32. When the internal conductive element 32 is formed on both faces of the resin sheet 35, a configuration in which the internal conductive element 32 is in contact with two side faces of each columnar piezoelectric element can be obtained.

(Embodiment 16)

Figure 35:
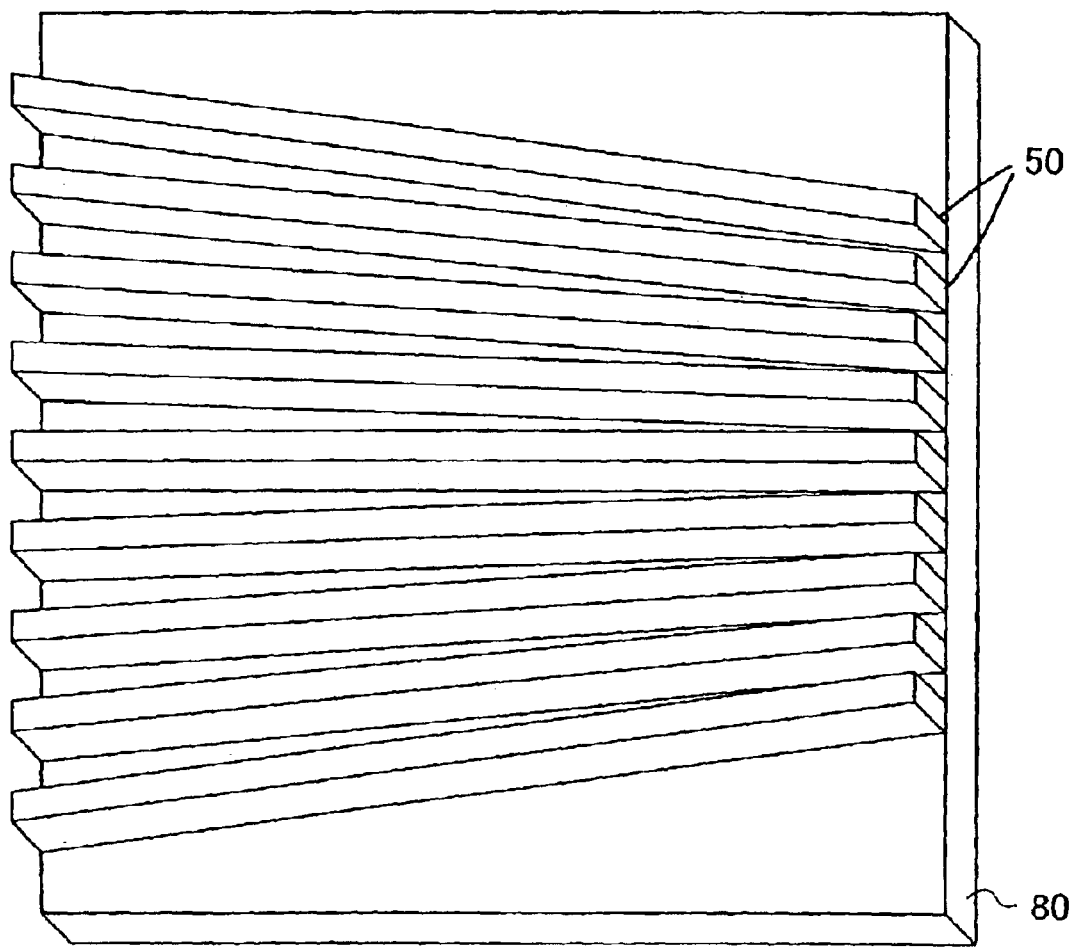
FIG. 35 is a perspective view showing exemplary shape and arrangement of columnar piezoelectric elements in a unit composite sheet of the composite piezoelectric element in Embodiment 16 of the present invention.
Figure 36:
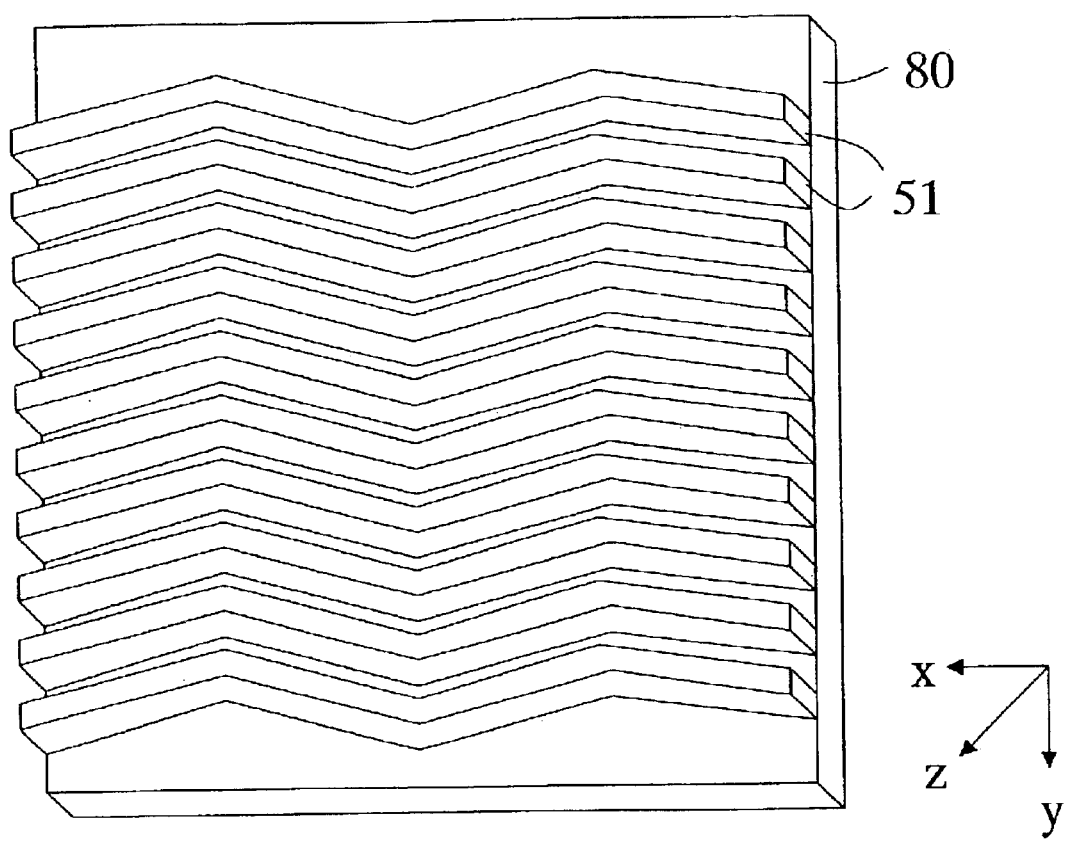
FIG. 36 is a perspective view showing another example of shape and arrangement of columnar piezoelectric elements in the unit composite sheets of the composite piezoelectric element in Embodiment 16 of the present invention.

In the above-described embodiments, the shapes of the columnar piezoelectric elements in the unit composite sheet are all linear, and the columnar piezoelectric elements are arranged in parallel. However, the shape of the piezoelectric element in a unit composite sheet is not limited to be linear. In addition, the arrangement is not limited to the parallel arrangement. For example, as shown in FIGS. 35 and 36, columnar piezoelectric elements of various shapes may be formed. FIG. 35 shows an example in which intervals of adjacent columnar piezoelectric elements 50 are different in both ends of the columnar piezoelectric elements, and the columnar piezoelectric elements 50 are not arranged in parallel. FIG. 36 shows an example in which columnar piezoelectric elements 51 do not extend linearly, but extend in a bending manner. Internal conductive elements are not shown in FIGS. 35 and 36. In actuality, a plurality of internal conductive elements across the columnar piezoelectric elements 50 and 51 extending in the Y direction are disposed.

A section perpendicular to the longitudinal direction of the columnar piezoelectric element is not required to be a polygon constituted by linear sides, but may have a shape partly constituted by a curve. After the working mask is removed, for example, sand blasting or other working is additionally performed in a short time, so that it is possible to change the exposed surface of the columnar piezoelectric element into a gently curved surface. If the side face of the piezoelectric element has a curved shape, it is preferred that interference of oscillation mode hardly occur between adjacent piezoelectric elements.

(Embodiment 17)

Hereinafter, an embodiment of an ultrasonic probe according to the present invention will be described.

In this embodiment, a composite piezoelectric element of the sixth embodiment (a side of a section of a columnar piezoelectric element is 0.020 mm and a thickness thereof is 0.100 mm) is used as the ultrasonic probe.

Hereinafter, a method for producing an ultrasonic probe of this embodiment will be described.

First, by cutting the above-mentioned composite piezoelectric element, a composite piezoelectric element having a height of 12 mm, a width of 12 mm, and a thickness of 0.1 mm is prepared. Next, after electrodes of nickel/gold are formed on an upper face and a lower face of the composite piezoelectric element by means of electroless plating, the electrodes applied on an end face are peeled by sand paper, thereby mutually and electrically isolating the electrodes on the upper and lower faces.

Next, polarization process is performed. Specifically, the electrode on the upper face is grounded, and a voltage of +200 V is applied to the electrode on the lower face. This condition is held at a temperature of 180° C. for 1 hour. For the thus obtained composite piezoelectric element, results of electromechanical coupling coefficient of 68%, and mechanical Q=10 are obtained.

Figure 37:
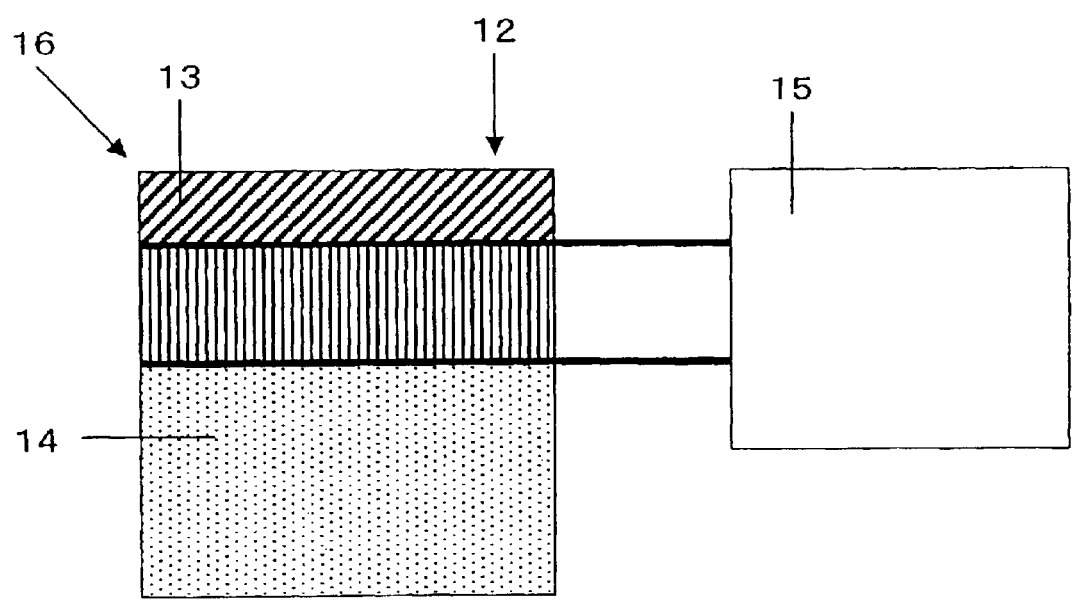
FIG. 37 is a sectional view of an embodiment of an ultrasonic probe according to the present invention.

As shown in FIG. 37, an acoustic matching layer 13 is disposed on the side of an ultrasonic emitting face 12 of the composite piezoelectric element, and a backing 14 is disposed on the back side. The acoustic matching layer 13 is obtained by mixing ceramic filler in a resin and integrating them. The backing 14 is a rubber in which iron powder is dispersed. An electrode on the ultrasonic emitting face of the composite piezoelectric element is grounded, and the electrode on the back side is used as a driving electrode and connected to a transmission and receiving circuit 15.

Figure 38A:
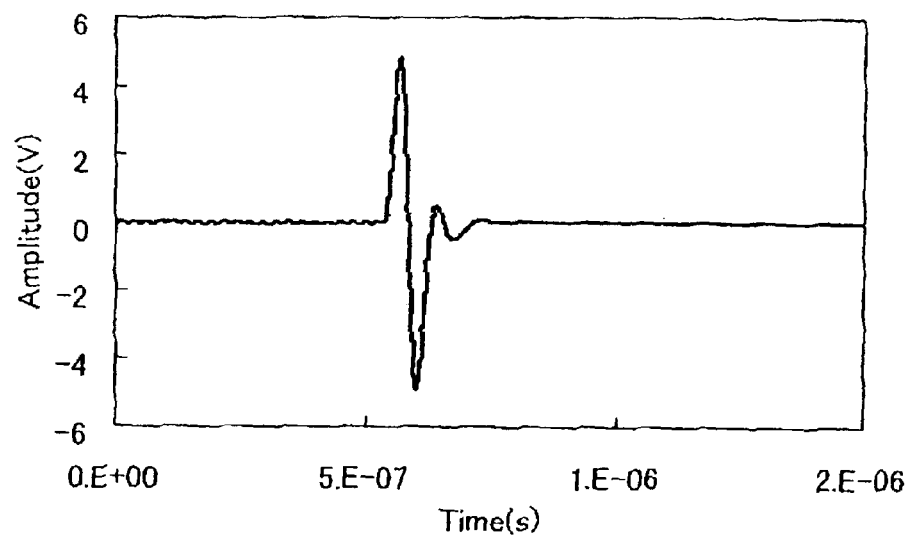
FIG. 38A is a graph showing the transmission and receiving waveform characteristic of the ultrasonic probe in the embodiment of the present invention.
Figure 38B:
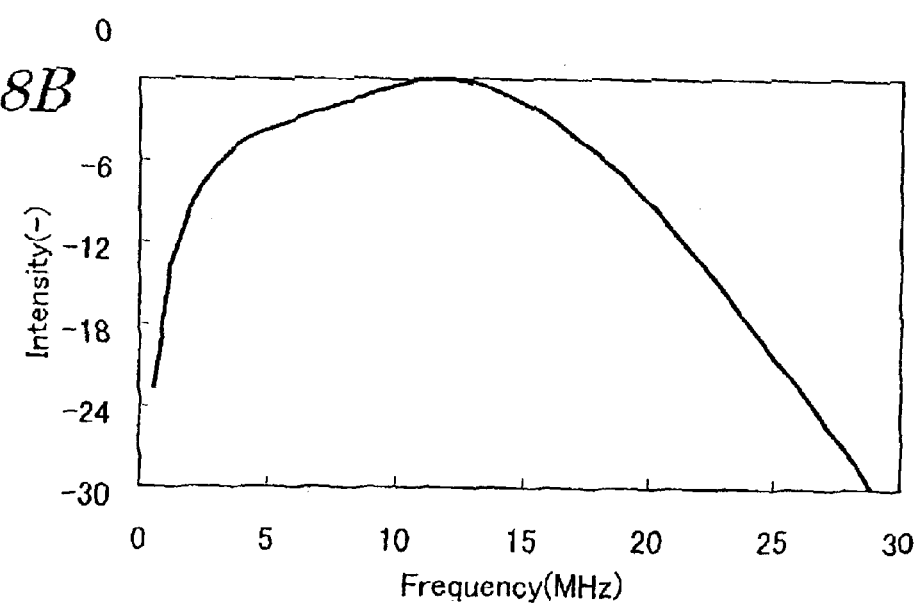
FIG. 38B is a graph showing the frequency band characteristic of the ultrasonic probe in the embodiment of the present invention.
Figure 39A:
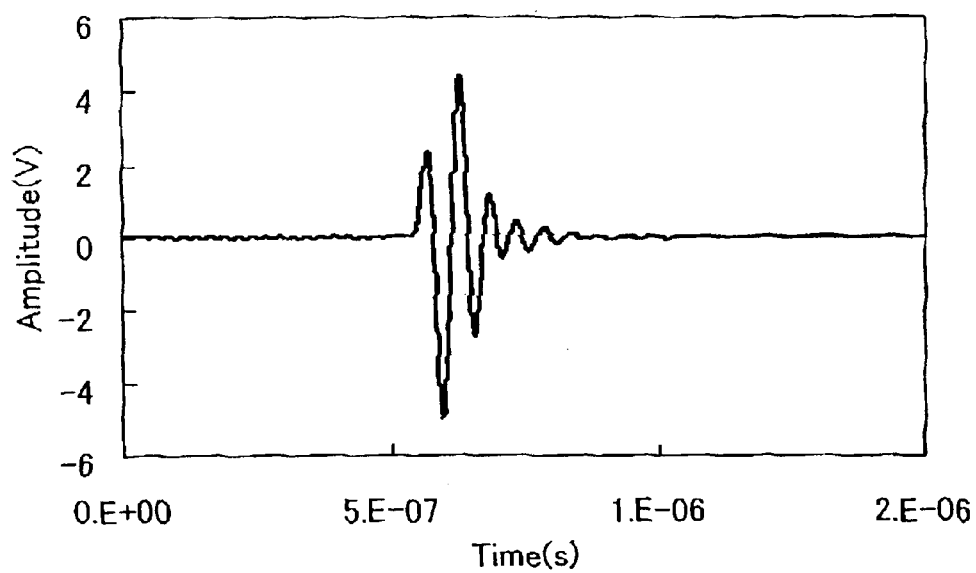
FIG. 39A is a graph showing the transmission and receiving waveform characteristic of a comparative example of an ultrasonic probe.
Figure 39B:
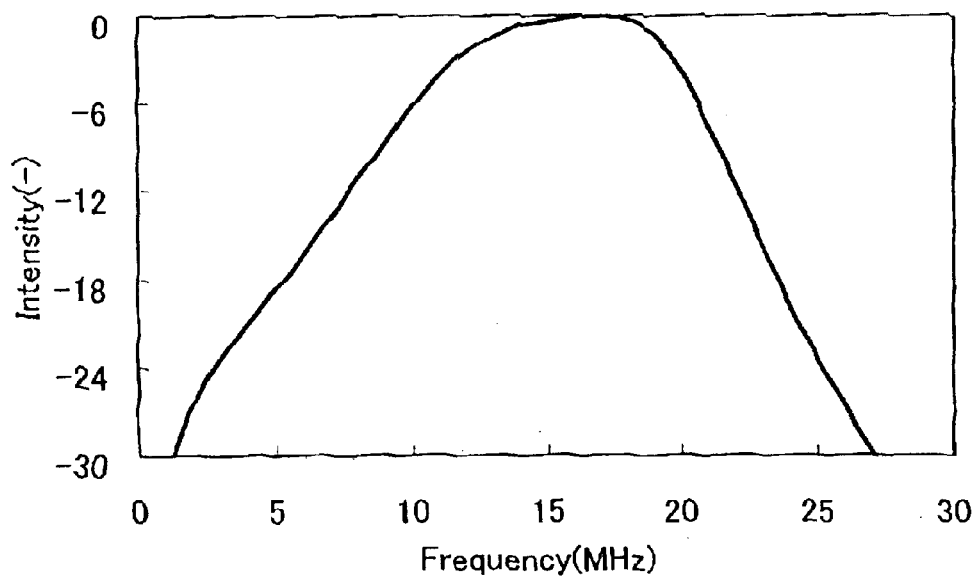
FIG. 39B is a graph showing the frequency band characteristic of the comparative example.

FIGS. 38A and 38B are graphs showing characteristics of an ultrasonic probe 16 having the above-described configuration. FIGS. 39A and 39B are graphs showing characteristics of an ultrasonic probe using a piezoelectric ceramic in the above-described configuration, instead of the composite piezoelectric element. FIGS. 38A and 39A show transmission and receiving waveforms of the respective ultrasonic probes. FIGS. 38B and 39B show the frequency band characteristics thereof.

As is seen from FIGS. 38A through 39B, the ultrasonic probe using the composite piezoelectric element can attain substantially the same transmission and receiving sensitivity as that of the ultrasonic probe using the conventional piezoelectric ceramic, and can realize a wide band of about 50% or more in the specific band width of −6 dB.

(Embodiment 18)

Figure 40:
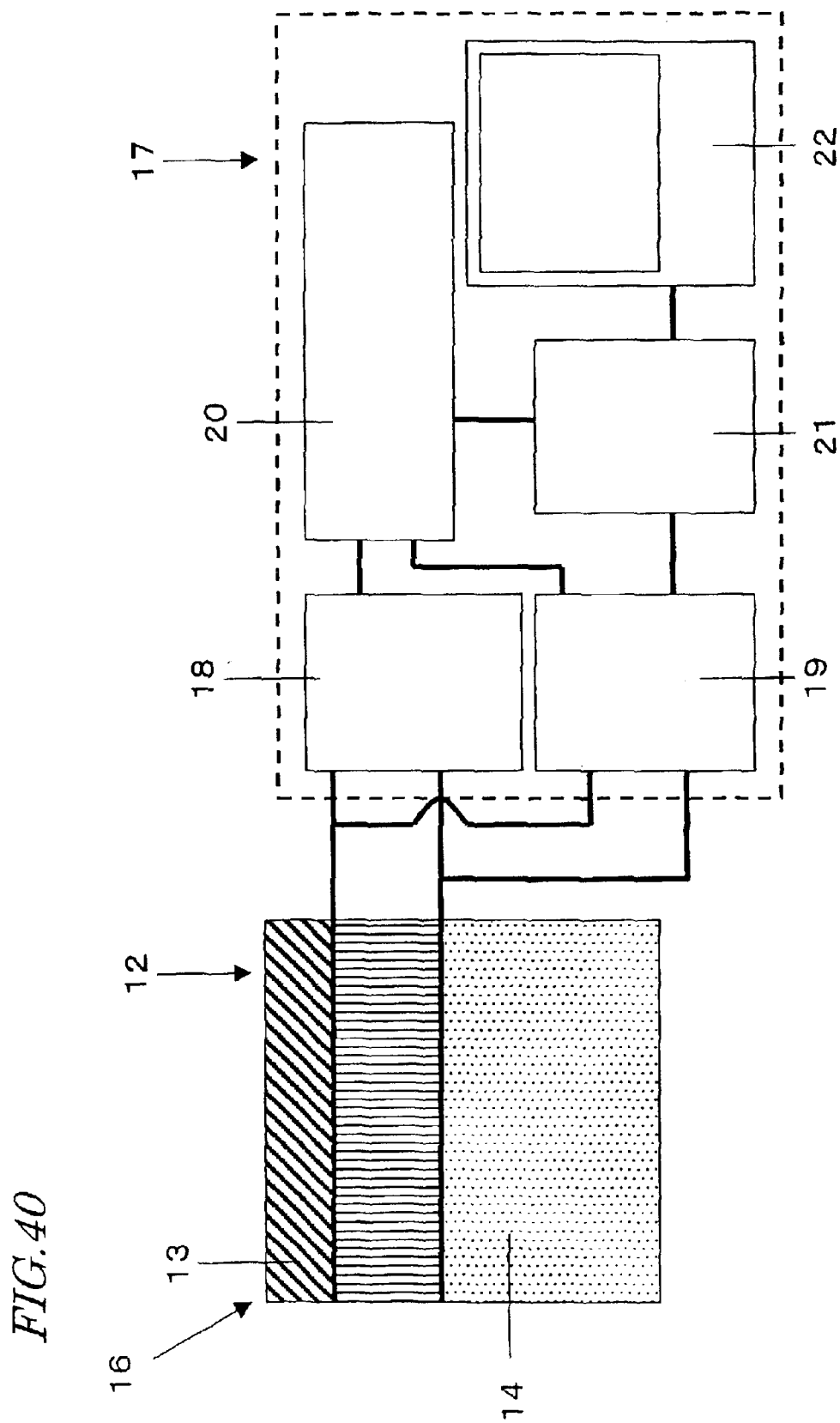
FIG. 40 is a sectional view of an ultrasonic diagnostic apparatus in an embodiment according to the present invention.

In this embodiment, the ultrasonic probe of Embodiment 17 is connected to an ultrasonic diagnostic apparatus 17 as shown in FIG. 40. As shown in FIG. 40, the ultrasonic diagnostic apparatus 17 includes a transmission unit 18, a receiving unit 19, a system control unit 20, an image forming unit 21, and an image display unit 22. The transmission unit 18 transmits a voltage signal for causing the ultrasonic probe to emit an ultrasonic signal. The receiving unit 19 receives the voltage signal output from the ultrasonic probe. The system control unit 20 performs various controls related to the transmission and receiving of ultrasonic signals. The image forming unit 21 for forming an image based on the obtained ultrasonic signal. The image display unit 22 displays an image based on the image signal output from the image forming unit 21. In the respective units of the ultrasonic diagnostic apparatus 17, known configurations can be adopted.

If imaging of a human body is performed by using the ultrasonic diagnostic apparatus in FIG. 40, an image up to a deep portion can be clearly observed with high resolution due to advantageous effects of the ultrasonic probe with wider band. Thus, diagnosis with high accuracy can be performed.

(Embodiment 19)

Hereinafter, an embodiment of the ultrasonic probe according to the present invention will be described.

Figure 41:
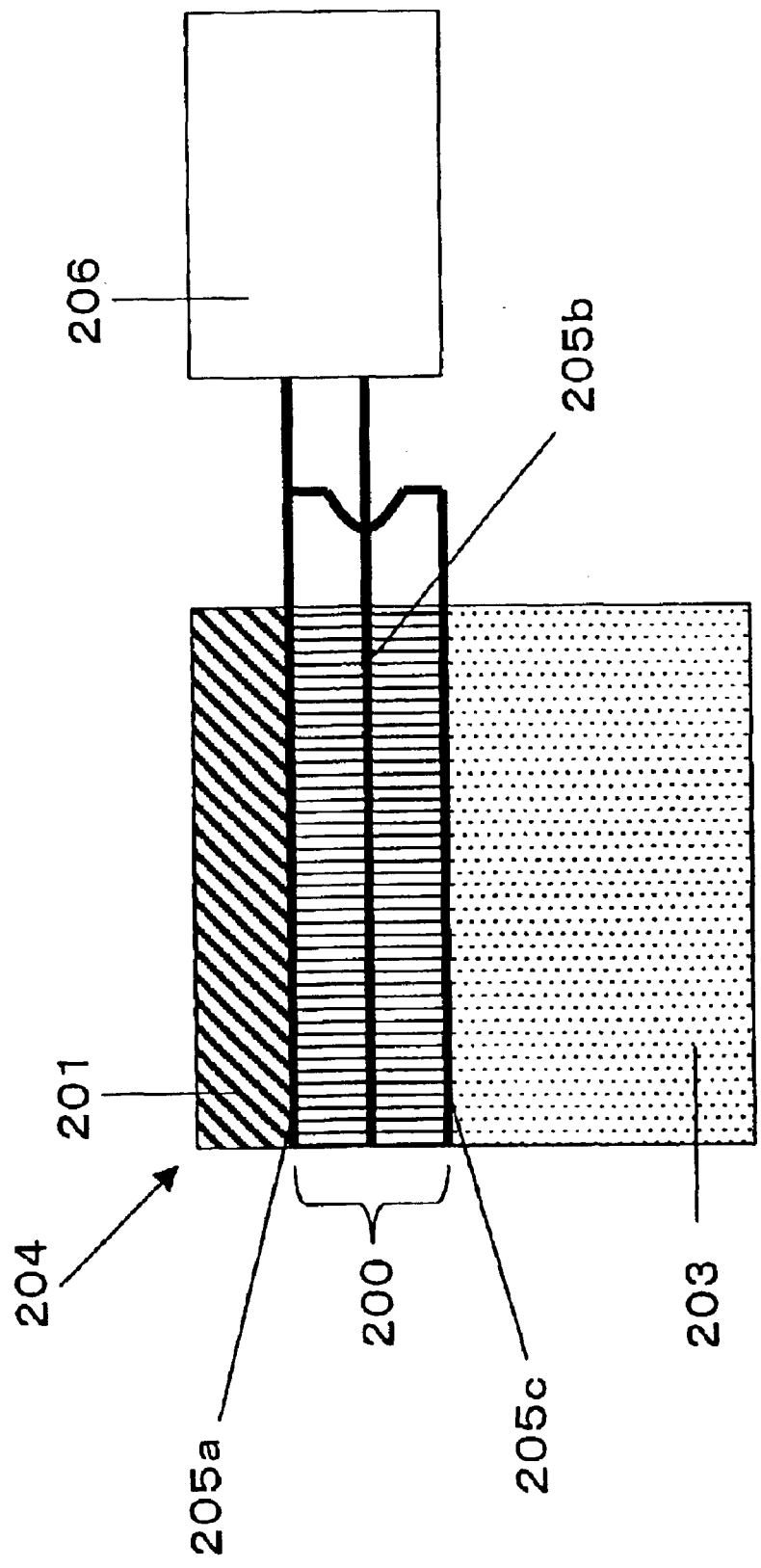
FIG. 41 is a schematic sectional view showing an Ultrasonic probe of the present invention and a driving circuit for the ultrasonic probe.

In this embodiment, first, the composite piezoelectric element of Embodiment 14 is cut so as to include a layer of internal conductive element as described in Embodiment 13, thereby obtaining a composite piezoelectric element 200 as shown in FIG. 41. The piezoelectric element 200 has a height of 20 mm, a width of 20 mm, and a thickness of 0.4 mm, and includes an internal conductive element in a middle position of 0.2 mm in the thickness direction. On an upper face and a lower face in the thickness direction, electrodes 205a and 205c of nickel and gold are formed by electroless plating. In addition, an electrode 205b for connecting end faces of respective internal conductive elements is formed. Then, undesired conductive elements attached to end faces of the composite piezoelectric element 200 are peeled off by means of sand paper, thereby electrically isolating the electrodes 205a, 205b, and 205c.

Next, polarization process is performed. Specifically, the electrode 205a on the upper face and the electrode 205c on the lower face are grounded, and a voltage of +400 V is applied to the electrode 205b connected to the internal conductive elements. The condition is held at a temperature of 180° C. for 1 hour. The thus-obtained composite piezoelectric element has an electromechanical coupling coefficient of about 68%.

As shown in FIG. 41, an acoustic matching layer 201 is disposed on the electrode 205a of the upper face, and a backing 203 is disposed on the electrode 205c of the lower face. The acoustic matching layer 201 is obtained by mixing a ceramic filler into a resin and by integrating them. The backing 203 is a rubber in which iron powder is dispersed. The electrode 205a of the upper face and the electrode 205c of the lower face are grounded, and the electrode 205b connected to the internal conductive elements is connected to a transmission and receiving circuit 206 as a driving electrode. For the connection with the transmission and receiving circuit 206, a cable for flat panel in which a wiring pattern of gold is disposed on a polyimide resin is used. Along the gold wiring pattern, the acoustic matching layer 201 and the composite piezoelectric element 200 are completely cut by dicing. The backing 203 is left without cutting. The cutting groove is filled with a silicon rubber.

At this time, a width of the cutting groove is 0.03 mm, and a width of each device is 0.2 mm.

When an electric impedance of each device was measured, a value of about ¼ was obtained as compared with a composite piezoelectric element in an ultrasonic probe without internal conductive elements. This is because the provision of internal conductive elements near the center position in the thickness direction of the composite piezoelectric element results in the parallel connection of composite piezoelectric elements having a half thickness, as compared with the initial composite piezoelectric element, so that the capacity of the composite piezoelectric element is increased by four times.

The ultrasonic probe 204 shown in FIG. 41 was driven by the transmission and receiving circuit 206, and the transmission and receiving efficiency was monitored. It was confirmed that the sensitivity was increased by about 6 dB as compared with an ultrasonic probe including a composite piezoelectric element without having internal conductive elements.

(Embodiment 20)

Figure 42:
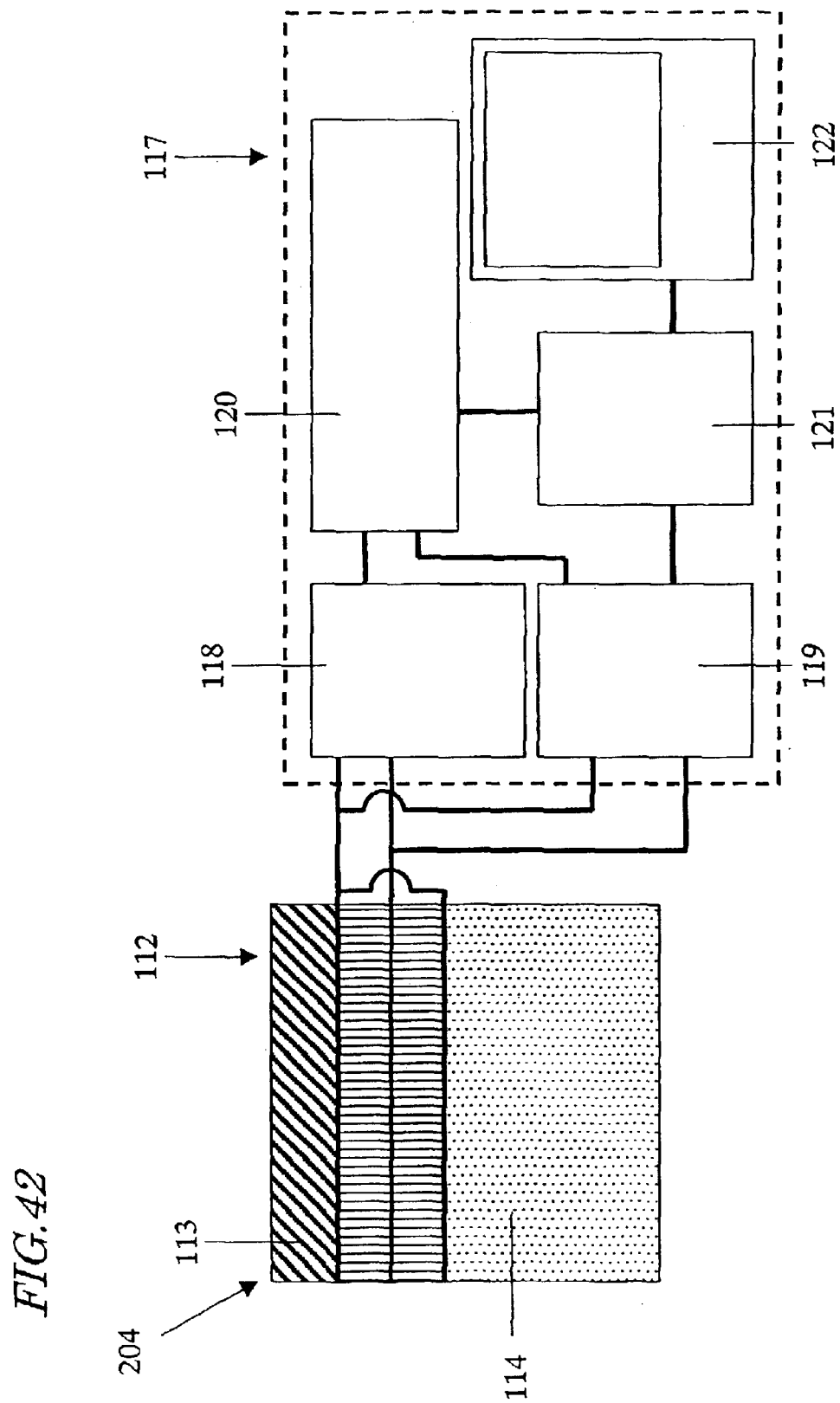
FIG. 42 is a schematic diagram showing a configuration of an ultrasonic diagnostic apparatus of the present invention.

In this embodiment, the ultrasonic probe 204 of Embodiment 19 is connected to an ultrasonic diagnostic apparatus 117, as shown in FIG. 42. The ultrasonic diagnostic apparatus 117 includes, as shown in FIG. 42, a transmission unit 118, a receiving unit 119, a system control unit 120, an image forming unit 121, and an image display unit 122. The transmission unit 118 transmits a voltage signal for causing an ultrasonic probe to emit an ultrasonic signal. The receiving unit 119 receives the voltage signal output from the ultrasonic probe. The system control unit 120 performs various controls related to the transmission and receiving of an ultrasonic signal. The image forming unit 121 forms an image based on the obtained ultrasonic signal. The image display unit 122 displays an image based on an image signal output from the image forming unit 121. In respective units of the ultrasonic diagnosing apparatus 117, known configurations can be adopted.

If the imaging of a human body is performed by using the ultrasonic diagnostic apparatus of FIG. 42, an image up to a deeper portion can be clearly observed with high resolution, due to advantageous effects of the ultrasonic probe with wider band and higher sensitivity. Thus, diagnosis with high accuracy can be realized.

In a composite piezoelectric element according to a first aspect of the present invention, a composite piezoelectric element is obtained by layering and integrating unit composite sheets in which columnar piezoelectric elements are disposed on a resin layer. The columnar piezoelectric elements are fixed and held in arbitrary positions by the resin layer, and the positions of the columnar piezoelectric elements are not changed in the layering and integration process. Therefore, it is unnecessary to directly handle the fragile columnar piezoelectric elements, and a process of arranging a large number of columnar piezoelectric elements is not required. In addition, a composite piezoelectric element can be fabricated in a short time at a low cost without using expensive equipment, by selecting an appropriate cutting method depending on the size and the number of the columnar piezoelectric elements.

In a composite piezoelectric element according to a second aspect of the present invention, an internal conductive element across a plurality of columnar piezoelectric elements is disposed. Thus, each of the columnar piezoelectric elements has a layered configuration of two columnar piezoelectric elements with the internal conductive element interposed therebetween. When the internal conductive element and an external circuit are connected, an electric impedance can be reduced, and the transmission and receiving sensitivity of ultrasonic waves can be improved.

Alternatively, the composite piezoelectric element is fabricated by layering and integrating unit composite sheets in which columnar piezoelectric elements and internal conductive elements are disposed on a resin layer. The dispositional relationship between the columnar piezoelectric elements and the internal conductive elements is fixed, so that there is no possibility that the arrangement is changed. In other words, it is unnecessary to handle the columnar piezoelectric and internal conductive elements which are fragile, and it is unnecessary to arrange a large number of columnar piezoelectric elements and internal conductive elements. In addition, the unit composite sheet in which such columnar piezoelectric elements and internal conductive elements are disposed on a resin layer can be produced in a short time at a low cost by sand blasting. According, the composite piezoelectric element can be fabricated by a simple and easy method at a low cost.

Moreover, the composite piezoelectric element including internal conductive elements are not fabricated individually, but can be fabricated as a block of composite piezoelectric element including plural layers of internal conductive elements. Accordingly, the block-like composite piezoelectric element is cut in predetermined positions, thereby producing a plurality of composite piezoelectric elements in a short time at a low cost.

While the present invention has been described in a preferred embodiment, it will be apparent to those skilled in the art that the disclosed invention may be modified in numerous ways and may assume many embodiments other than that specifically set out and described above. Accordingly, it is intended by the appended claims to cover all modifications of the invention which fall within the true spirit and scope of the invention.

What is claimed is:

1. A composite piezoelectric element comprising a layered configuration of a plurality of unit composite sheets each including a resin layer having a major plane and a plurality of columnar piezoelectric elements each having a longitudinal direction and being arranged on the resin layer, wherein the longitudinal directions of respective columnar piezoelectric elements are parallel to the resin layer major plane, and a cross-section of each columnar piezoelectric element perpendicular to the longitudinal direction is substantially trapezoidal.

2. The composite piezoelectric element of claim 1, wherein the plurality of unit composite sheets are layered so that the longitudinal directions of respective columnar piezoelectric elements substantially align.

3. The composite piezoelectric element of claim 2, further comprising at least one internal conductive element extending across the plurality of columnar piezoelectric element in a direction intersecting the longitudinal direction of the plurality of columnar piezoelectric elements.

4. The composite piezoelectric element of claim 3, wherein the internal conductive element is exposed on at least one end face of the composite piezoelectric element.

5. The composite piezoelectric element of claim 4, wherein the internal conductive element extends along columns of the columnar piezoelectric elements.

6. The composite piezoelectric element of claim 5, wherein a plurality of internal conductive elements are provided, and each of the plurality of internal conductive elements is disposed in corresponding one column of the columnar piezoelectric elements.

7. The composite piezoelectric element of claim 6, wherein a plurality of the plural internal conductive elements are disposed in corresponding one column of the columnar piezoelectric element.

8. The composite piezoelectric element of claim 1, wherein a size of a section perpendicular to a longitudinal direction of the columnar piezoelectric elements is 20 $\mu$m or less.

9. The composite piezoelectric element of claim 8, wherein a ratio L/S is 5 or more, where a length of the columnar piezoelectric elements is L, and an average size of a section perpendicular to the longitudinal direction of the columnar piezoelectric elements is S.

10. The composite piezoelectric element of claim 1, wherein another resin layer is inserted between the layered unit composite sheets.

11. The composite piezoelectric element of claim 1, wherein a gap exists between adjacent ones of the columnar piezoelectric elements in each unit composite sheet.

12. The composite piezoelectric element of claim 1, wherein a resin exists between adjacent ones of the columnar piezoelectric elements in each unit composite sheet.

13. The composite piezoelectric element of claim 1, wherein the plurality of columnar piezoelectric elements are two-dimensionally arranged along a plane perpendicular to a longitudinal direction of the columnar piezoelectric elements.

14. The composite piezoelectric element of claim 13, wherein the plurality of columnar piezoelectric elements are arranged in rows and columns along the plane perpendicular to the longitudinal direction of the columnar piezoelectric elements, and columns of the columnar piezoelectric elements are separated from columns of adjacent ones of the columnar piezoelectric elements by a resin layer.

15. A unit composite sheet comprising a resin layer having a major plane and a plurality of columnar piezoelectric elements each having a longitudinal direction and being arranged on the resin layer, wherein the longitudinal directions of respective columnar piezoelectric elements are parallel to the resin layer major plane, and a cross-section of each columnar piezoelectric element perendicular to the longitudinal direction is substantially trapezoidal.

16. A layered structure of composite sheets in which a plurality of unit composite sheets each including a resin layer having a major plane and a plurality of columnar piezoelectric elements each having a longitudinal direction and being arranged on the resin layer are layered, and the columnar piezoelectric elements are sandwiched by the resin layers, thereby fixing the dispositional relationship, wherein the longitudinal directions of respective columnar piezoelectric elements are parallel to the resin layer major planes, and a cross-section of each columnar piezoelectric element perpendicular to the longitudinal direction is substantially trapezoidal.

17. A composite piezoelectric element fabricated by cutting the layered structure of composite sheets of claim 16 across the longitudinal direction of the columnar piezoelectric elements.

18. The composite piezoelectric element of claim 17, wherein the columnar piezoelectric elements are surrounded by a resin.

19. The composite piezoelectric element of claim 18, wherein the resin is part of the resin layer of the unit composite sheet which flows and hardens.

20. The composite piezoelectric element of claim 18, wherein the resin is obtained by impregnating a liquid resin around the columnar piezoelectric elements and by hardening the resin.

21. An ultrasonic probe comprising the composite piezoelectric element of claim 1.

22. An ultrasonic examination apparatus provided with the ultrasonic probe of claim 21.

* * * * *

UNITED STATES PATENT AND TRADEMARK OFFICE
CERTIFICATE OF CORRECTION

PATENT NO. : 6,919,668 B2
DATED : July 19, 2005
INVENTOR(S) : Hidetomo Nagahara et al.

It is certified that error appears in the above-identified patent and that said Letters Patent is hereby corrected as shown below:

<u>Column 32,</u>
Line 22, "Perendicular" should read -- perpendicular --.

Signed and Sealed this

Tenth Day of January, 2006

JON W. DUDAS
*Director of the United States Patent and Trademark Office*